United States Patent
Yamazaki et al.

(10) Patent No.: US 9,640,669 B2
(45) Date of Patent: May 2, 2017

(54) SEMICONDUCTOR DEVICE, DISPLAY DEVICE INCLUDING THE SEMICONDUCTOR DEVICE, DISPLAY MODULE INCLUDING THE DISPLAY DEVICE, AND ELECTRONIC APPLIANCE INCLUDING THE SEMICONDUCTOR DEVICE, THE DISPLAY DEVICE, AND THE DISPLAY MODULE

(71) Applicant: Semiconductor Energy Laboratory Co., LTD., Atsugi-shi, Kanagawa-ken (JP)

(72) Inventors: Shunpei Yamazaki, Tokyo (JP); Junichi Koezuka, Tochigi (JP); Yukinori Shima, Gunma (JP); Masami Jintyou, Tochigi (JP); Daisuke Kurosaki, Tochigi (JP); Masataka Nakada, Tochigi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 14/640,379

(22) Filed: Mar. 6, 2015

(65) Prior Publication Data

US 2015/0263174 A1    Sep. 17, 2015

(30) Foreign Application Priority Data

Mar. 13, 2014  (JP) ................................ 2014-049676

(51) Int. Cl.
*H01L 21/469*  (2006.01)
*H01L 29/786*  (2006.01)
(Continued)

(52) U.S. Cl.
CPC ........ *H01L 29/7869* (2013.01); *H01L 29/045* (2013.01); *H01L 29/24* (2013.01); *H01L 29/66969* (2013.01); *H01L 29/78606* (2013.01)

(58) Field of Classification Search
CPC ......... H01L 29/66969; H01L 29/78606; H01L 27/1248; H01L 27/1225; H01L 29/7869
(Continued)

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Park et al., "Self-Aligned Top-Gate Amorphous Gallium Indium Zinc Oxide Think Film Transistors", Applied Physics Letters American Institute of Physics, 2008, vol. 93, 053501.*
(Continued)

*Primary Examiner* — Kimberly Rizkallah
*Assistant Examiner* — Brian Turner
(74) *Attorney, Agent, or Firm* — Nixon Peabody LLP; Jeffrey L. Costellia

(57) ABSTRACT

In a semiconductor device including a transistor, the transistor is provided over a first insulating film, and the transistor includes an oxide semiconductor film over the first insulating film, a gate insulating film over the oxide semiconductor film, a gate electrode over the gate insulating film, a second insulating film over the oxide semiconductor film and the gate electrode, and a source and a drain electrodes
(Continued)

electrically connected to the oxide semiconductor film. The first insulating film includes oxygen. The second insulating film includes hydrogen. The oxide semiconductor film includes a first region in contact with the gate insulating film and a second region in contact with the second insulating film. The first insulating film includes a third region overlapping with the first region and a fourth region overlapping with the second region. The impurity element concentration of the fourth region is higher than that of the third region.

30 Claims, 39 Drawing Sheets

(51) Int. Cl.
    *H01L 21/34*     (2006.01)
    *H01L 21/36*     (2006.01)
    *H01L 29/24*     (2006.01)
    *H01L 29/04*     (2006.01)
    *H01L 29/66*     (2006.01)

(58) Field of Classification Search
    USPC .............................. 257/43, 40, 57, E29.296
    See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 8,355,195 B2 | 1/2013 | Sato |
| 8,399,882 B2 | 3/2013 | Jeon et al. |
| 8,513,661 B2 | 8/2013 | Takahashi et al. |
| 8,624,240 B2 | 1/2014 | Sato et al. |
| 8,883,571 B2 | 11/2014 | Morosawa et al. |
| 8,946,714 B2 | 2/2015 | Nishiyama |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0240998 A1 | 10/2011 | Morosawa et al. |
| 2012/0001167 A1* | 1/2012 | Morosawa .......... H01L 29/7869 257/43 |
| 2012/0187396 A1* | 7/2012 | Yamazaki ......... H01L 29/66742 257/43 |
| 2012/0249904 A1 | 10/2012 | Morosawa |
| 2012/0313103 A1* | 12/2012 | Yamada ............ H01L 29/78633 257/66 |
| 2015/0221678 A1 | 8/2015 | Yamazaki et al. |
| 2015/0221679 A1 | 8/2015 | Yamazaki et al. |
| 2015/0221774 A1 | 8/2015 | Yamazaki et al. |
| 2015/0221775 A1 | 8/2015 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |

(56) References Cited

FOREIGN PATENT DOCUMENTS

| | | |
|---|---|---|
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2009-278115 A | 11/2009 |
| JP | 2012-009836 A | 1/2012 |
| WO | WO-2004/114391 | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09; SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-plane", SID Digest '09 ;SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IgZo Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Nakamura.M "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)m$ (m<4):A $Zn4s$ conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1,2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) ,Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GiZo ($Ga_2O_3$—$In_2O_3$—ZnO) TFT", SID Digest '08: SID International Symposium Digest of Technical Papers, May 20, 2008, vol. 39, pp. 633-636.

Takahashi.M et al., "Theoretical Analysis of IgZo Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 12A
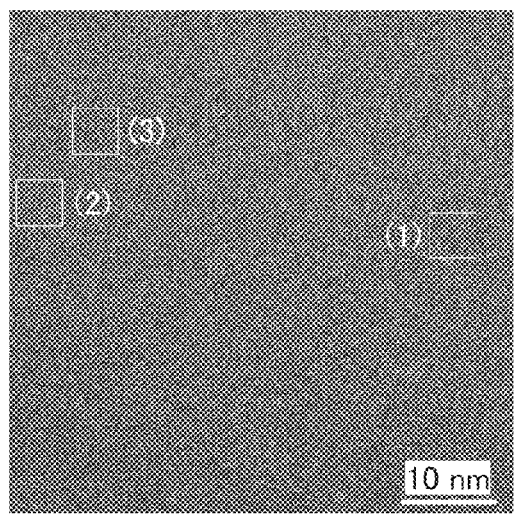
FIG. 12B  FIG. 12C  FIG. 12D
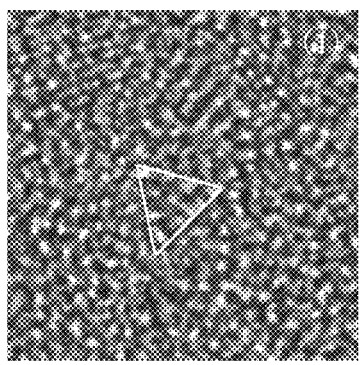 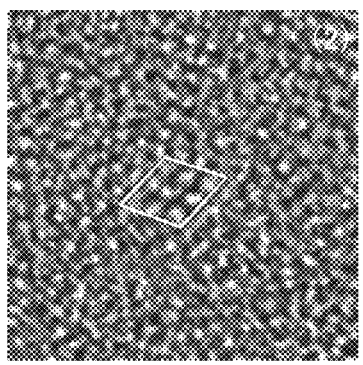 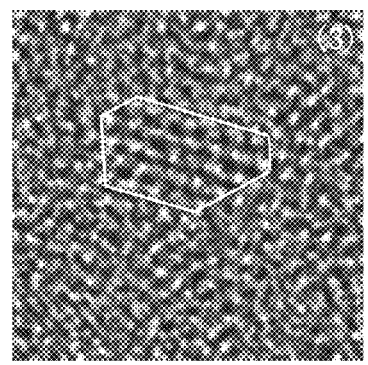

InGaZnO₄

FIG. 22A
FIG. 22B
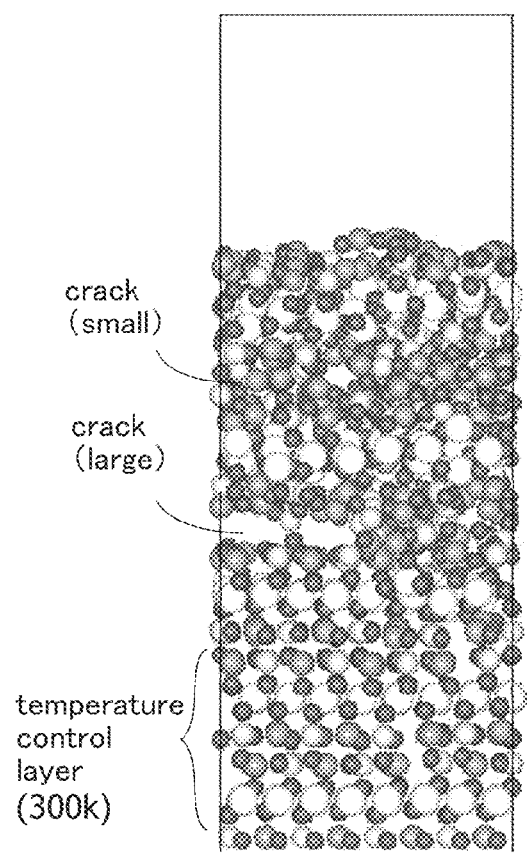
100psec after Ar collision
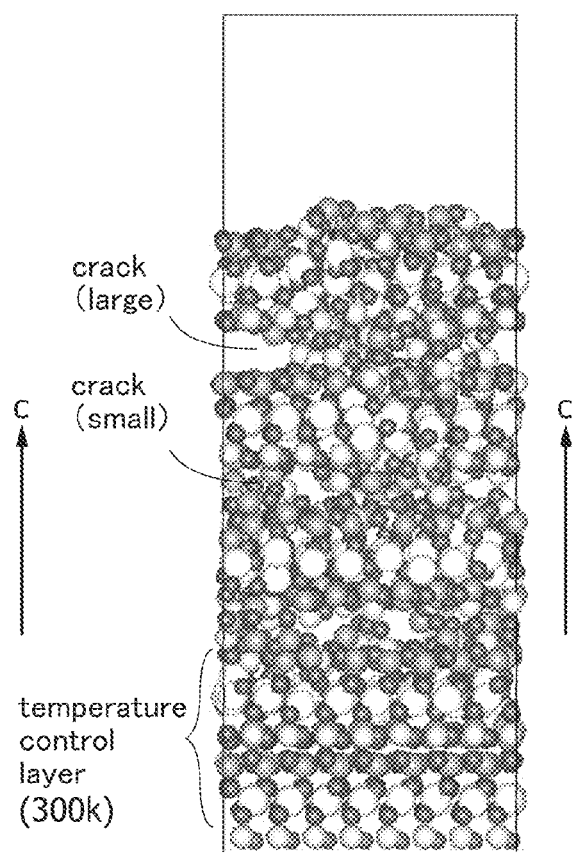
100psec after O collision
In : ○  Ga : ○  Zn : ●  O : •

Zn of 3rd layer (Ga-Zn-O layer) reaches the vicinity of 6th layer (Ga-Zn-O layer)

trajectories of atoms
0~0.3psec after Ar enters

Zn of 3rd layer(Ga-Zn-O layer) does not reach 5th layer (In-O layer)

trajectories of atoms
0~0.3psec after O enters

CAAC-OS    1 nm target    1 nm initial state ($V_oH$)

final state ($V_o$, H-O)

FIG. 29A  initial state ($V_o H$)
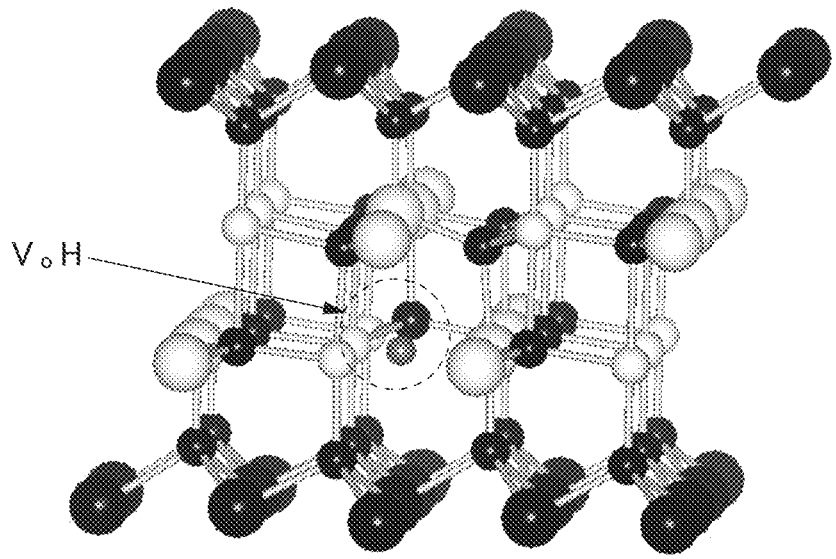
FIG. 29B  final state ($V_o$, H–O)
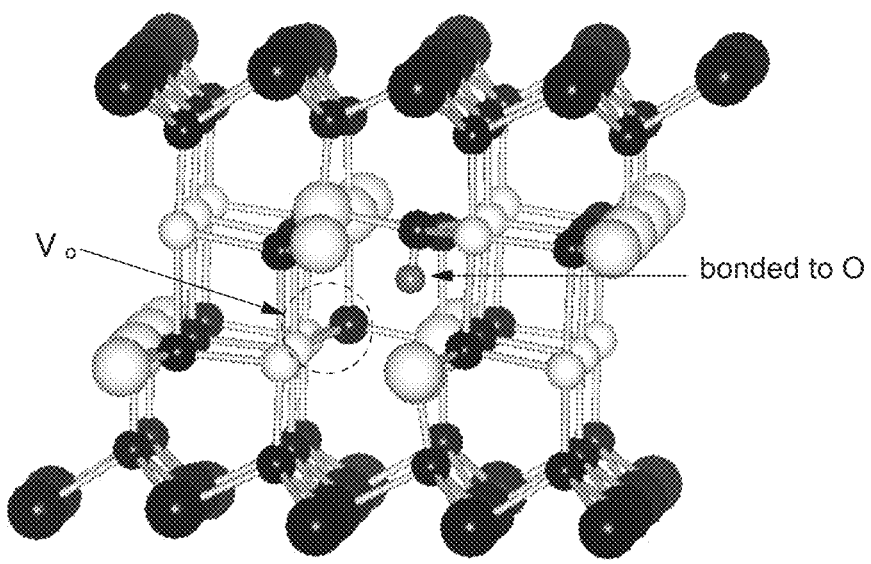

SEMICONDUCTOR DEVICE, DISPLAY DEVICE INCLUDING THE SEMICONDUCTOR DEVICE, DISPLAY MODULE INCLUDING THE DISPLAY DEVICE, AND ELECTRONIC APPLIANCE INCLUDING THE SEMICONDUCTOR DEVICE, THE DISPLAY DEVICE, AND THE DISPLAY MODULE

BACKGROUND OF THE INVENTION

1. Field of the Invention

One embodiment of the present invention relates to a semiconductor device including an oxide semiconductor film and a display device including the semiconductor device.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a storage device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic appliance may each include a semiconductor device.

2. Description of the Related Art

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic appliances such as an integrated circuit (IC) and an image display device (display device). A semiconductor material typified by silicon is widely known as a material for a semiconductor thin film that can be used for a transistor. As another material, an oxide semiconductor has been attracting attention.

For example, a technique in which a transistor is manufactured using an amorphous oxide containing In, Zn, Ga, Sn, and the like as an oxide semiconductor is disclosed (see Patent Document 1). Furthermore, a technique in which a transistor using an oxide thin film and a self-aligned top-gate structure is manufactured is disclosed (see Patent Document 2).

Furthermore, a semiconductor device including, as a base insulating layer of an oxide semiconductor layer where a channel is formed, an insulating layer that releases oxygen by heating to reduce oxygen vacancies in the oxide semiconductor layer is disclosed (see Patent Document 3).

REFERENCES

Patent Documents

[Patent Document 1] Japanese Published Patent Application No. 2006-165529

[Patent Document 2] Japanese Published Patent Application No. 2009-278115

[Patent Document 3] Japanese Published Patent Application No. 2012-009836

SUMMARY OF THE INVENTION

As a transistor including an oxide semiconductor film, an inverted staggered transistor (also referred to as a transistor having a bottom-gate structure), a planar transistor (also referred to as a transistor having a top-gate structure), and the like are given. In the case where a transistor including an oxide semiconductor film is used for a display device, an inverted staggered transistor is used more often than a planar transistor because a manufacturing process thereof is relatively simple and manufacturing cost thereof can be kept low. However, signal delay or the like is increased by parasitic capacitance that exists between a gate electrode and source and drain electrodes of an inverted staggered transistor and accordingly image quality of a display device degrades, which has posed a problem, as an increase in screen size of a display device proceeds, or a display device is provided with a higher resolution image (for example, a high-resolution display device typified by 4 k×2 k pixels (3840 pixels in the horizontal direction and 2048 pixels in the perpendicular direction) or 8 k×4 k pixels (7680 pixels in the horizontal direction and 4320 pixels in the perpendicular direction)). Furthermore, as another problem, the occupation area of an inverted staggered transistor is larger than that of a planar transistor. Thus, with regard to a planar transistor including an oxide semiconductor film, development of a transistor which has a structure with stable semiconductor characteristics and high reliability and which is formed by a simple manufacturing process is desired.

Furthermore, in the case where a transistor is manufactured using an oxide semiconductor film for a channel region, an oxygen vacancy which is formed in the channel region of the oxide semiconductor film adversely affects the transistor characteristics. For example, formation of oxygen vacancies in a channel region of an oxide semiconductor film causes carrier generation due to the oxygen vacancies. The carrier generation in the channel region of the oxide semiconductor film causes a change in the electrical characteristics, typically, a shift in the threshold voltage, of the transistor including the oxide semiconductor film in the channel region. Further, there is a problem in that electrical characteristics vary among the transistors. Therefore, it is preferable that the amount of oxygen vacancy in the channel region of the oxide semiconductor film be as small as possible. Meanwhile, in the transistor including the oxide semiconductor film for the channel region, it is preferable that the amount of oxygen vacancy in regions of the oxide semiconductor film that are in contact with a source electrode and a drain electrode be as large as possible and the resistance of the regions be as low as possible to reduce a contact resistance between the regions and the source and the drain electrodes.

In view of the foregoing problems, an object of one embodiment of the present invention is to suppress a change in electrical characteristics and to improve reliability in a semiconductor device including a transistor including an oxide semiconductor. Another object of one embodiment of the present invention is to provide a semiconductor device including a planar transistor having an oxide semiconductor. Another object of one embodiment of the present invention is to provide a semiconductor device including a transistor having an oxide semiconductor and having high on-state current. Another object of one embodiment of the present invention is to provide a semiconductor device including a transistor having an oxide semiconductor and having low off-state current. Another object of one embodiment of the present invention is to provide a semiconductor device with low power consumption. Another object of one embodiment of the present invention is to provide a semiconductor device including a transistor having an oxide semiconductor and occupying a small area. Another object of one embodiment of the present invention is to provide a novel semiconductor device.

Note that the description of the above object does not disturb the existence of other objects. In one embodiment of the present invention, there is no need to achieve all the objects. Other objects are apparent from and can be derived from the description of the specification and the like.

One embodiment of the present invention is a semiconductor device including a transistor, and the transistor includes an oxide semiconductor film over a first insulating film, a gate insulating film over the oxide semiconductor film, a gate electrode over the gate insulating film, a second insulating film over the oxide semiconductor film and the gate electrode, and a source and a drain electrodes electrically connected to the oxide semiconductor film. The first insulating film includes oxygen. The second insulating film includes hydrogen. The oxide semiconductor film includes a first region in contact with the gate insulating film and a second region in contact with the second insulating film. The first insulating film includes a third region overlapping with the first region and a fourth region overlapping with the second region. The concentration of an impurity element in the fourth region is higher than the concentration of the impurity element in the third region. Details of the semiconductor device are described below.

One embodiment of the present invention is a semiconductor device including a transistor, and the transistor includes an oxide semiconductor film over a first insulating film, a gate insulating film over the oxide semiconductor film, a gate electrode over the gate insulating film, a second insulating film over the oxide semiconductor film and the gate electrode, a third insulating film over the second insulating film, a first opening included in the second insulating film and the third insulating film, a second opening included in the second insulating film and the third insulating film, a source electrode electrically connected to the oxide semiconductor film through the first opening, and a drain electrode electrically connected to the oxide semiconductor film through the second opening. The first insulating film includes oxygen. The second insulating film includes hydrogen. The oxide semiconductor film includes a first region in contact with the gate insulating film and a second region in contact with the second insulating film. The first insulating film includes a third region overlapping with the first region and a fourth region overlapping with the second region. The concentration of an impurity element in the fourth region is higher than the concentration of the impurity element in the third region.

Another embodiment of the present invention is a semiconductor device including a transistor, and the transistor includes a first gate electrode, a first insulating film over the first gate electrode, an oxide semiconductor film over the first insulating film, a gate insulating film over the oxide semiconductor film, a second gate electrode over the gate insulating film, a second insulating film over the oxide semiconductor film and the second gate electrode, a third insulating film over the second insulating film, a first opening included in the second insulating film and the third insulating film, a second opening included in the second insulating film and the third insulating film, a source electrode electrically connected to the oxide semiconductor film through the first opening, and a drain electrode electrically connected to the oxide semiconductor film through the second opening. The first insulating film includes oxygen. The second insulating film includes hydrogen. The oxide semiconductor film includes a first region in contact with the gate insulating film and a second region in contact with the second insulating film. The first insulating film includes a third region overlapping with the first region and a fourth region overlapping with the second region. The concentration of an impurity element in the fourth region is higher than the concentration of the impurity element in the third region.

Another embodiment of the present invention is a semiconductor device including a transistor, and the transistor includes a first gate electrode, a first insulating film over the first gate electrode, an oxide semiconductor film over the first insulating film, a gate insulating film over the oxide semiconductor film, a second gate electrode over the gate insulating film, a second insulating film over the oxide semiconductor film and the second gate electrode, a third insulating film over the second insulating film, a first opening included in the second insulating film and the third insulating film, a second opening included in the second insulating film and the third insulating film, a third opening included in the first insulating film and the gate insulating film, a source electrode electrically connected to the oxide semiconductor film through the first opening, and a drain electrode electrically connected to the oxide semiconductor film through the second opening. The first gate electrode and the second gate electrode are electrically connected to each other through the third opening. The first insulating film includes oxygen. The second insulating film includes hydrogen. The oxide semiconductor film includes a first region in contact with the gate insulating film and a second region in contact with the second insulating film. The first insulating film includes a third region overlapping with the first region and a fourth region overlapping with the second region. The concentration of an impurity element in the fourth region is higher than the concentration of the impurity element in the third region.

In any of the above structures, it is preferable that the impurity element include one or more of hydrogen, boron, carbon, nitrogen, fluorine, phosphorus, sulfur, and a rare gas element. In any of the above structures, it is preferable that the impurity element include hydrogen or argon.

In any of the above structures, it is preferable that the first region have a portion with lower concentration of hydrogen than the second region. In any of the above structures, it is preferable that the first region have a region with higher crystallinity than the second region.

In any of the above structures, the oxide semiconductor film preferably includes O, In, Zn, and M (M is Ti, Ga, Y, Zr, La, Ce, Nd, or Hf). In any of the above structures, it is preferable that the oxide semiconductor film include a crystal part, and a portion in which a c-axis of the crystal part be aligned parallel to a normal vector of a surface where the oxide semiconductor film is formed be included.

Another embodiment of the present invention is a display device including the semiconductor device according to any one of the above structures and a display element. Another embodiment of the present invention is a display module including the display device and a touch sensor. Another embodiment of the present invention is an electronic appliance including the semiconductor device according to any one of the above structures, the display device, or the display module, and an operation key or a battery.

With one embodiment of the present invention, a change in the electrical characteristics can be suppressed and reliability can be improved in a semiconductor device including a transistor having an oxide semiconductor. Furthermore, with one embodiment of the present invention, a semiconductor device including a planar type transistor having an oxide semiconductor can be provided. Furthermore, with one embodiment of the present invention, a semiconductor device including a transistor having an oxide semiconductor and having high on-state current can be provided. Furthermore, with one embodiment of the present invention, a semiconductor device including a transistor having an oxide semiconductor and having low off-state current can be provided. Alternatively, with one embodiment of the present invention, a semiconductor device with low power consumption can be provided. Alternatively, with one embodiment of the present invention, a semiconductor device including a transistor having an oxide semiconductor and occupying a small area can be provided. Alternatively, with one embodiment of the present invention, a novel semiconductor device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 12A to 12D are Cs-corrected high-resolution TEM images of a plane of a CAAC-OS.

FIGS. 21A and 21B show a structure of InGaZnO$_4$ before collision of an atom, and the like.

FIGS. 22A and 22B show a structure of InGaZnO$_4$ after collision of an atom, and the like.

FIGS. 29A and 29B show an initial state and a final state, respectively.

DETAILED DESCRIPTION OF THE INVENTION

Figure 1A:
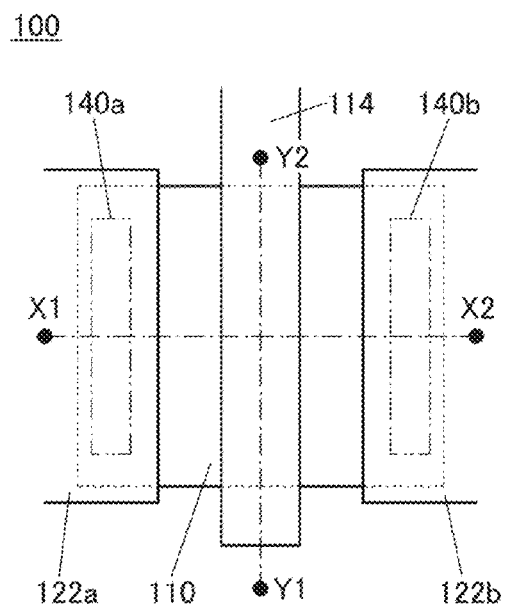
FIGS. 1A to 1C are a top view and cross-sectional views illustrating one embodiment of a semiconductor device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. Further, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

Embodiment 1

Figure 1B:
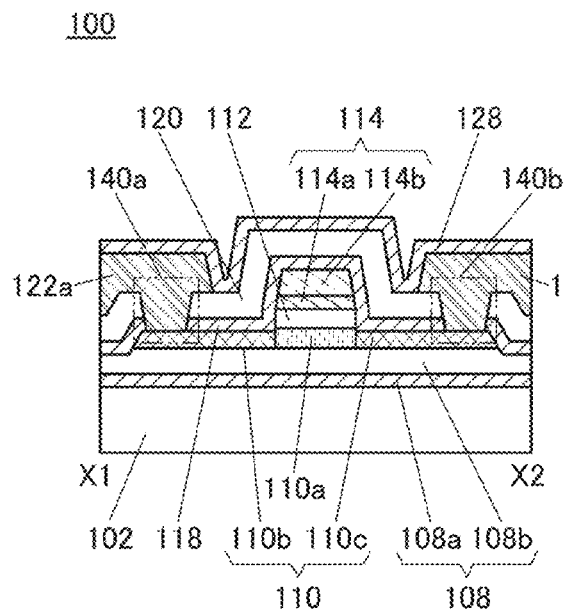
Figure 1C:
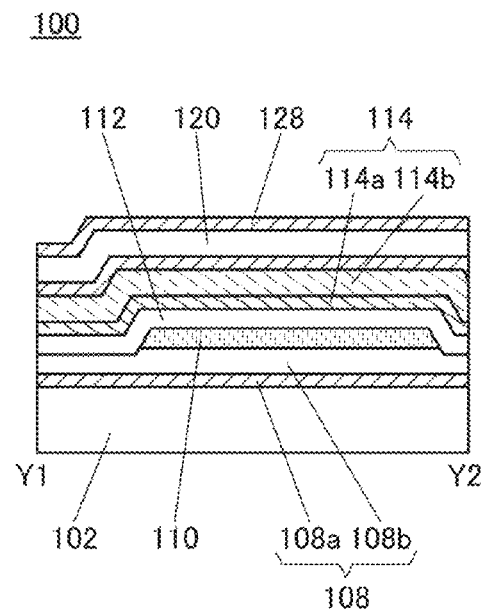

In this embodiment, examples of a semiconductor device including a transistor and a method for manufacturing the semiconductor device are described with reference to FIGS. 1A to 1C, FIGS. 2A and 2B, FIG. 3, FIGS. 4A and 4B, FIGS. 5A to 5C, FIGS. 6A to 6C, FIGS. 7A to 7D, FIGS. 8A to 8D, FIGS. 9A to 9D, and FIGS. 10A and 10B.
<Structure 1 of Semiconductor Device>
FIGS. 1A to 1C illustrate an example of a semiconductor device including a transistor. Note that the transistor illustrated in FIGS. 1A to 1C has a top-gate structure.

FIG. 1A is a top view of a transistor 100 included in the semiconductor device. FIG. 1B is a cross-sectional view along the dashed-dotted line X1-X2 in FIG. 1A. FIG. 1C is a cross-sectional view along the dashed-dotted line Y1-Y2 in FIG. 1A. Note that in FIG. 1A, a substrate 102, an insulating film 108, an insulating film 112, and the like are omitted for simplicity. In a manner similar to that of FIG. 1A, some components are not illustrated in some cases in top views of transistors described below. Furthermore, the direction of the dashed dotted line X1-X2 may be called a channel length direction, and the direction of the dashed dotted line Y1-Y2 may be called a channel width direction.

The transistor 100 illustrated in FIGS. 1A to 1C includes the insulating film 108 (also referred to as a first insulating film) formed over the substrate 102, an oxide semiconductor film 110 over the insulating film 108, the insulating film 112 over the oxide semiconductor film 110, a conductive film 114 overlapping with the oxide semiconductor film 110 with the insulating film 112 provided therebetween, the insulating film 118 (also referred to as a second insulating film) covering the oxide semiconductor film 110, the insulating film 112, and the conductive film 114, the insulating film 120 (also referred to as a third insulating film) over the insulating film 118, a conductive film 122a electrically connected to the oxide semiconductor film 110 through an opening portion 140a (also referred to as a first opening portion) provided in the insulating film 118 and the insulating film 120, and a conductive film 122b electrically connected to the oxide semiconductor film 110 through an opening portion 140b (also referred to as a second opening portion) provided in the insulating film 118 and the insulating film 120. Note that an insulating film 128 covering the insulating film 120 and the conductive films 122a and 122b may be provided over the transistor 100.

Furthermore, in the transistor 100, the insulating film 108 includes an insulating film 108a and an insulating film 108b over the insulating film 108a. Furthermore, the oxide semiconductor film 110 includes a channel region 110a (also referred to as a first region) and a pair of low-resistance regions 110b and 110c (also referred to as second regions) between which the channel region 110a is provided. Note that the channel region 110a is in contact with the insulating film 112, and the low-resistance regions 110b and 110c are in contact with the insulating film 118. Furthermore, the conductive film 114 includes a conductive film 114a and a conductive film 114b over the conductive film 114a.

Furthermore, the insulating film 112 functions as a gate insulating film, and the conductive film 114 functions as a gate electrode. Furthermore, the conductive film 122a functions as one of a source electrode and a drain electrode, and the conductive film 122b functions as the other of the source electrode and the drain electrode.

Furthermore, in the transistor 100, the insulating film 108 contains oxygen and has a function of supplying oxygen to the oxide semiconductor film 110. Oxygen vacancies which can be formed in the oxide semiconductor film 110 can be filled with oxygen supplied from the insulating film 108. Furthermore, the insulating film 118 contains hydrogen and has a function of supplying hydrogen to the oxide semiconductor film 110.

In the oxide semiconductor film 110, the low-resistance regions 110b and 110c contain an element which forms an oxygen vacancy. Hereinafter, the elements which form oxygen vacancies are described as impurity elements. Typical examples of impurity elements are hydrogen, boron, carbon, nitrogen, fluorine, phosphorus, sulfur, chlorine, and rare gas elements. Typical examples of rare gas elements are helium, neon, argon, krypton, and xenon.

When the impurity element is added to the oxide semiconductor film, a bond between a metal element and oxygen in the oxide semiconductor film is cut, whereby an oxygen vacancy is formed. Alternatively, when the impurity element is added to the oxide semiconductor film, oxygen bonded to a metal element in the oxide semiconductor film is bonded to the impurity element, and the oxygen is released from the metal element, whereby an oxygen vacancy is formed. As a result, carrier density is increased in the oxide semiconductor film, and the oxide semiconductor film has higher conductivity.

Figure 2A:
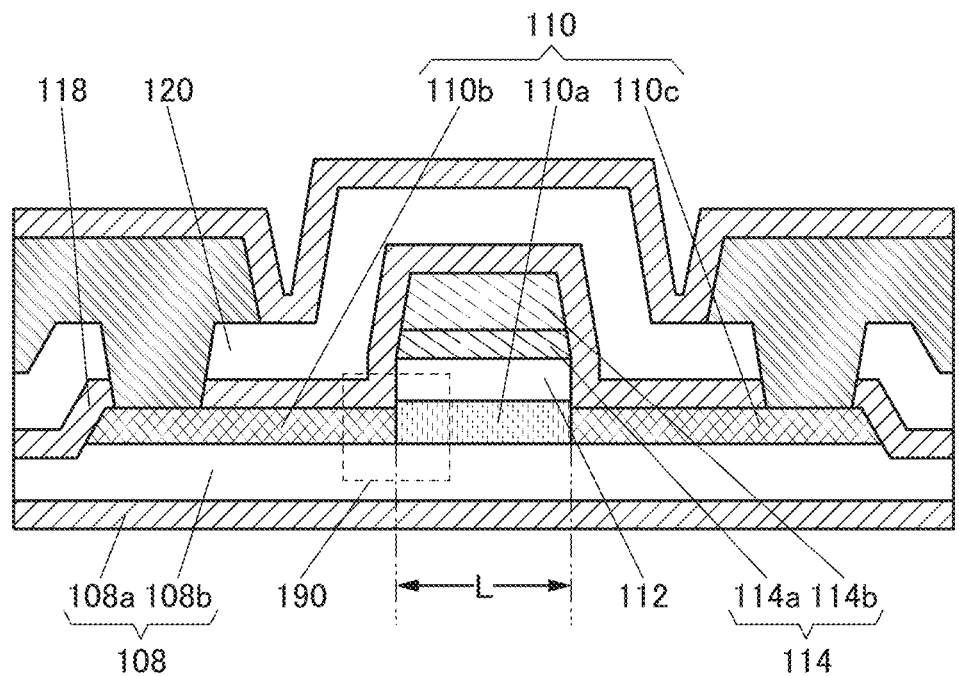
FIGS. 2A and 2B are cross-sectional views each illustrating one embodiment of a semiconductor device.
Figure 2B:
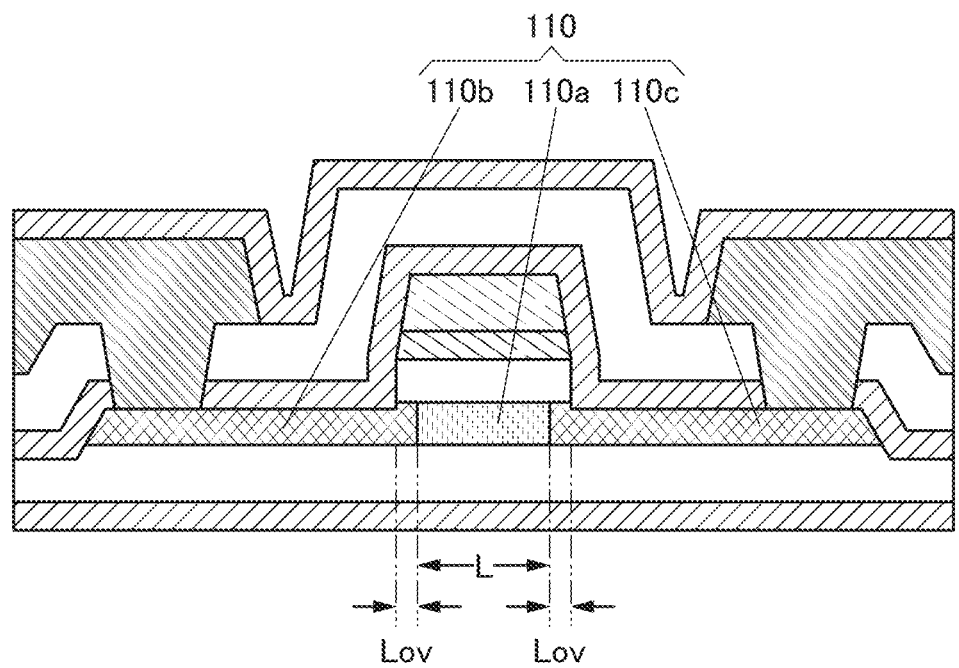
Figure 3:
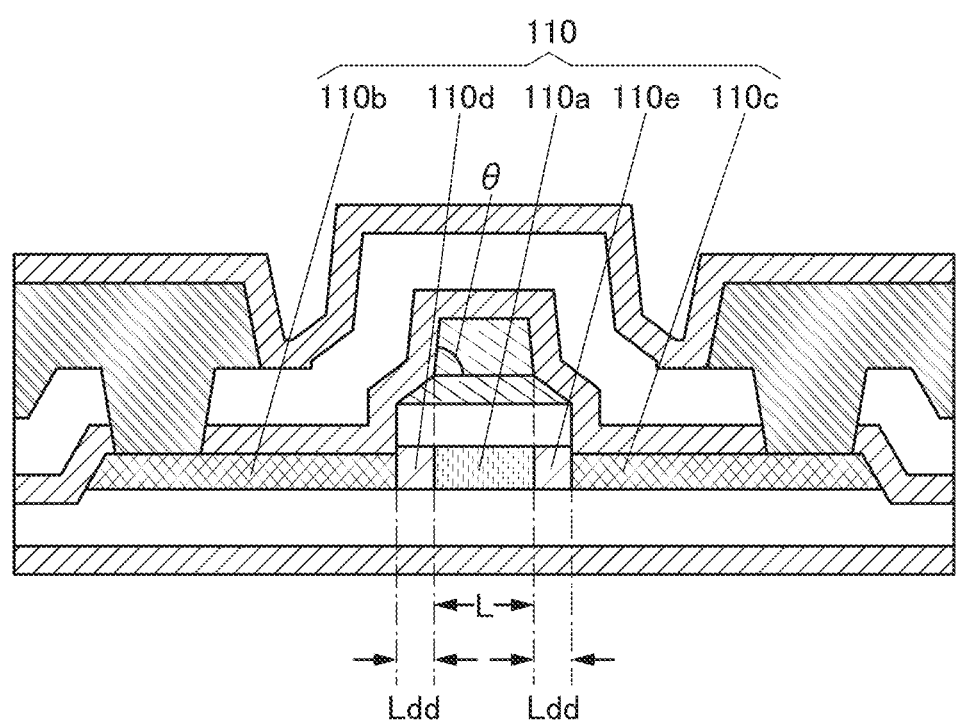
FIG. 3 is a cross-sectional view illustrating one embodiment of a semiconductor device.

FIGS. 2A and 2B and FIG. 3 are enlarged views of the vicinity of the oxide semiconductor film 110. Note that, in the case where a portion illustrated in any of FIGS. 2A and 2B and FIG. 3 has a function similar to that described above, the same hatch pattern is applied to the portion, and the portion is not especially denoted by a reference numeral in some cases.

A region in which the carrier density of the oxide semiconductor film is increased and the conductivity thereof is increased (hereinafter such a region is referred to as a low-resistance region) is formed in a cross section of the oxide semiconductor film 110 in the channel length direction. Furthermore, the low-resistance regions formed in the oxide semiconductor film 110 have a plurality of structures as illustrated in FIGS. 2A and 2B and FIG. 3. Note that in FIGS. 2A and 2B and FIG. 3, a channel length L refers to a region between a pair of low-resistance regions.

As illustrated in FIG. 2A, the oxide semiconductor film 110 includes the channel region 110a formed in a region overlapping with the conductive film 114 and the low-resistance regions 110b and 110c between which the channel region 110a is provided and which contain the impurity elements. Note that as illustrated in FIG. 2A, in the cross-sectional shape in the channel length direction, the boundaries between the channel region 110a and the low-resistance regions 110b and 110c coincide with or substantially coincide with bottom end portions of the conductive film 114a, with the insulating film 112 provided between the conductive film 114a and the boundaries. That is, in a top surface shape, the boundaries between the channel region 110a and the low-resistance regions 110b and 110c coincide with or substantially coincide with the bottom end portions of the conductive film 114a.

Alternatively, as illustrated in FIG. 2B, in a cross-sectional shape in the channel length direction, the low-resistance regions 110b and 110c each have a region overlapping with the conductive film 114 with the insulating film 112 provided therebetween. The regions function as an overlap region. The length of the overlap region in the channel length direction is referred to as $L_{ov}$. $L_{ov}$ is smaller than 20%, smaller than 10%, smaller than 5%, or smaller than 2% of the channel length L.

Alternatively, as illustrated in FIG. 3, in a cross-sectional shape in the channel length direction, the oxide semiconductor film 110 includes a low-resistance region 110d between the channel region 110a and the low-resistance region 110b, and a low-resistance region 110e between the channel region 110a and the low-resistance region 110c. The low-resistance regions 110d and 110e have lower impurity element concentrations and higher resistivity than the low-resistance regions 110b and 110c. Here, the low-resistance regions 110d and 110e overlap with the insulating film 112, but they may overlap with the insulating film 112 and the conductive film 114. Note that in FIG. 3, the low-resistance regions 110d and 110e are denoted by $L_{dd}$.

As illustrated in FIG. 3, the oxide semiconductor film 110 includes the low-resistance regions 110d and 110e having lower impurity element concentrations and higher resistivity than the low-resistance regions 110b and 110c, whereby the electric field of the drain region can be relaxed. Thus, change in the threshold voltage of the transistor due to the electric field of the drain region can be reduced.

Note that in the structure illustrated in FIG. 3, the shapes of the conductive films 114a and 114b are different from the shapes of the conductive films 114a and 114b included in the transistor 100 illustrated in FIGS. 1A to 1C. In the structure illustrated in FIG. 3, a bottom end portion of the conductive film 114a is positioned on the outer side than a bottom end portion of the conductive film 114b. The conductive film 114b may have a tapered shape. That is, an angle θ formed between a surface where the conductive film 114a and the conductive film 114b are in contact with each other and a side surface of the conductive film 114b may be less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°. When the angle θ is less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°, the coverage of the side surfaces of the insulating film 114b with the insulating film 118 can be increased.

The structure of the conductive film 114 shown in FIG. 3 enables low-resistance regions with different impurity element concentrations to be formed in the oxide semiconductor film 110. Specifically, in the case where an impurity element is introduced into the oxide semiconductor film 110 using the conductive film 114 as a mask, the impurity element is introduced into the oxide semiconductor film 110 through a region of the conductive film 114a that is projected from the conductive film 114b and the insulating film 112 below the region of the conductive film 114a that is projected from the conductive film 114b, whereby the low-resistance regions 110d and 110e can be formed.

The oxide semiconductor film 110 includes a region that does not overlap with the insulating film 112 and the conductive film 114 and is thinner than a region of the oxide semiconductor film 110 overlapping with the insulating film 112 and the conductive film 114. The thin region is thinner than the region of the oxide semiconductor film overlapping with the insulating film 112 and the conductive film 114; the thickness of the thin region is greater than or equal to 0.1 nm and less than or equal to 5 nm.

Note that the low-resistance regions 110b and 110c in the oxide semiconductor film 110 function as a source region and a drain region. Furthermore, the impurity element is contained in the low-resistance regions 110b and 110c and the low-resistance regions 110d and 110e.

In the case where the impurity element is a rare gas element and the oxide semiconductor film 110 is formed by a sputtering method, the channel region 110a and the low-resistance regions 110b, 110c, 110d, and 110e each contain a rare gas element. Note that the concentrations of the rare gas elements in the low-resistance regions 110b and 110c are higher than the concentration of the rare gas element in the channel region 110a. Furthermore, the concentrations of the rare gas elements in the low-resistance regions 110b and 110c are higher than the concentrations of the rare gas elements in the low-resistance regions 110d and 110e.

The reasons for this are as follows: in the case where the oxide semiconductor film 110 is formed by a sputtering method, a rare gas is used as a sputtering gas in some cases, so that the oxide semiconductor film 110 contains the rare gas; and a rare gas is intentionally added to the low-resistance regions 110b and 110c in order to form oxygen vacancies in the low-resistance regions 110b and 110c. Note that a rare gas element different from the rare gas element contained in the channel region 110a may be added to the low-resistance regions 110b, 110c, 110d, and 110e.

Here, an impurity element concentration in the oxide semiconductor film to which argon is added as the rare gas element is evaluated. The impurity element concentration in the oxide semiconductor film is described with reference to FIG. 38.

Figure 38:
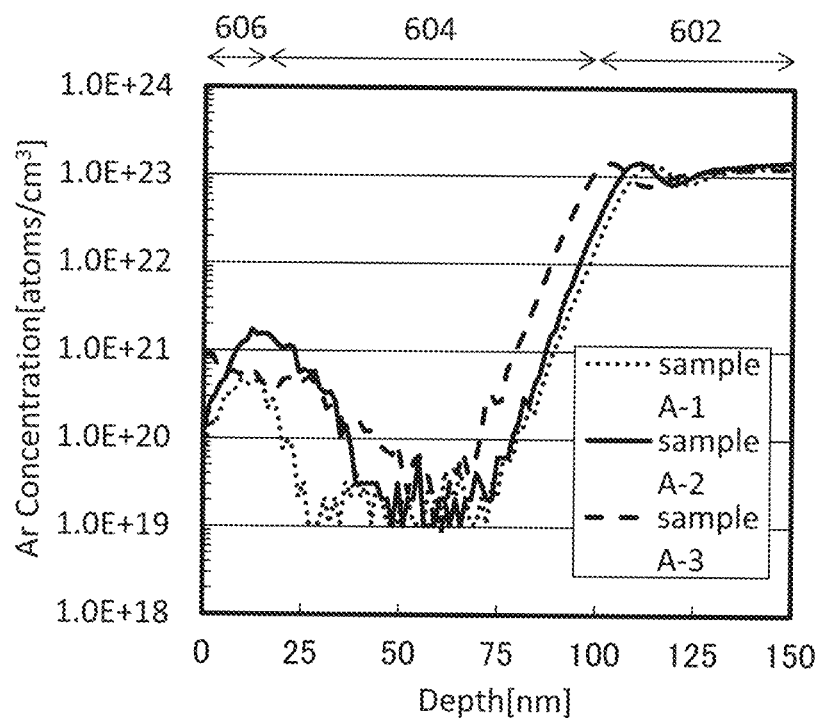
FIG. 38 is a graph showing the concentration of argon in an oxide semiconductor film.

FIG. 38 is a graph showing an argon concentration in the oxide semiconductor film which is obtained by secondary ion mass spectrometry (SIMS). In a sample used for SIMS analysis, an oxide semiconductor film 604 is formed over a glass substrate 602.

Note that the oxide semiconductor film 604 is formed with a sputtering apparatus. An oxygen gas at a flow rate of 200 sccm is introduced into a chamber of the sputtering apparatus, and an electric power of 2.5 kW is supplied to a metal oxide sputtering target of In:Ga:Zn=1:1:1.2 [atomic %] placed in the chamber of the sputtering apparatus; thus, the oxide semiconductor film 604 is formed. Note that an AC power source is used as a power source that supplies power to the metal oxide sputtering target. Furthermore, the oxide semiconductor film 604 is formed to a thickness of 100 nm. Note that in a formation method of the oxide semiconductor film 604, only an oxygen gas is used as a deposition gas as described above, which is a formation method without using an argon gas as a deposition gas.

Next, heat treatment is performed on the substrate over which the oxide semiconductor film 604 is formed. As the heat treatment, heat treatment under a nitrogen atmosphere at a temperature of 450° C. for one hour and heat treatment under a mixed gas of nitrogen and oxygen at a temperature of 450° C. for one hour are sequentially performed.

In Sample A-1, an impurity element is not added to the oxide semiconductor film 604 after the heat treatment. In each of Sample A-2 and Sample A-3, an impurity element is added to the oxide semiconductor film 604 after the heat treatment. Regarding Sample A-2 to which the impurity element is added, argon is delivered from above the oxide semiconductor film 604 and added to the oxide semiconductor film 604 with an ion doping apparatus at an acceleration voltage of 10 kV so that the dose is $1.0 \times 10^{15}$ ions/cm$^2$. Regarding Sample A-3 to which the impurity element is added, argon is delivered from above the oxide semiconductor film 604 and added to the oxide semiconductor film 604 with an ion doping apparatus at an acceleration voltage of 30 kV so that the dose is $1.0 \times 10^{15}$ ions/cm$^2$.

In the graph shown in FIG. 38, a protective film 606 is formed over the oxide semiconductor film 604. The protective film 606 is formed over the oxide semiconductor film 604 when the oxide semiconductor film 604 is analyzed by SIMS. For the SIMS analysis, substrate side depth profile secondary ion mass spectrometry (what is called SSDP-SIMS) in which analysis is performed from the glass substrate side is used. Furthermore, the detection limit of argon in a SIMS analysis apparatus is approximately $2.0 \times 10^{19}$ atoms/cm$^3$. In FIG. 38, the horizontal axis indicates the depth (nm) and the vertical axis indicates the argon concentration (atoms/cm$^3$). Note that a cesium primary ion (Cs$^+$) is used as a primary ion species of SIMS analysis.

The results in FIG. 38 show that, in Sample A-1 to which the impurity element is not added, the argon concentration in the oxide semiconductor film 604 is at approximately the detection limit level. On the other hand, in each of Samples A-2 and A-3 to which the impurity element is added, the argon concentration in the oxide semiconductor film 604 is from $2.0 \times 10^{19}$ atoms/cm$^3$ to $2.0 \times 10^{21}$ atoms/cm$^3$ at a depth from 25 nm to 50 nm. When Sample A-2 and Sample A-3 are compared, the position of added argon in the oxide semiconductor film 604 of Sample A-3 obtained at a high acceleration voltage is deeper than the position of added argon in the oxide semiconductor film 604 of Sample A-2. The results suggest that argon can be added to a base of the oxide semiconductor film. For example, in the case where the thickness of the oxide semiconductor film 604 is less than or equal to 50 nm, argon is added to the base of the oxide semiconductor film 604.

Thus, it is shown that the oxide semiconductor film 604 has a region in which an impurity concentration (here, an argon concentration) is high, as a result of adding the impurity element to the oxide semiconductor film 604.

In the case where the impurity element is hydrogen, boron, carbon, nitrogen, fluorine, phosphorus, sulfur, or chlorine, the low-resistance regions 110b, 110c, 110d, and 110e contain the above-described impurity element. Therefore, the concentrations of the impurity elements in the low-resistance regions 110b, 110c, 110d, and 110e are higher than the concentration of the impurity element in the channel region 110a. Note that the concentrations of the impurity elements in the low-resistance regions 110b, 110c, 110d, and 110e which are measured by secondary ion mass spectrometry can be greater than or equal to $5 \times 10^{18}$ atoms/cm$^3$ and less than or equal to $1 \times 10^{22}$ atoms/cm$^3$, greater than or equal to $1 \times 10^{19}$ atoms/cm$^3$ and less than or equal to $1 \times 10^{21}$ atoms/cm$^3$, or greater than or equal to $5 \times 10^{19}$ atoms/cm$^3$ and less than or equal to $5 \times 10^{20}$ atoms/cm$^3$.

In the case where the impurity element is hydrogen, the hydrogen concentrations in the low-resistance regions 110b, 110c, 110d, and 110e are higher than the hydrogen concentration in the channel region 110a. Note that the hydrogen concentrations in the low-resistance regions 110b, 110c, 110d, and 110e which are measured by secondary ion mass spectrometry can be higher than or equal to $8 \times 10^{19}$ atoms/cm$^3$, higher than or equal to $1 \times 10^{20}$ atoms/cm$^3$, or higher than or equal to $5 \times 10^{20}$ atoms/cm$^3$.

Since the low-resistance regions 110b, 110c, 110d, and 110e contain the impurity elements, oxygen vacancies and carrier densities are increased. As a result, the low-resistance regions 110b, 110c, 110d, and 110e have higher conductivity.

Note that the impurity elements may be one or more of hydrogen, boron, carbon, nitrogen, fluorine, phosphorus, sulfur, and chlorine, and one or more of rare gases. In that case, in the low-resistance regions 110b, 110c, 110d, and 110e, by interaction between oxygen vacancies formed by the rare gas and one or more of hydrogen, boron, carbon, nitrogen, fluorine, phosphorus, sulfur, and chlorine which is added, the conductivity of the low-resistance regions 110b, 110c, 110d, and 110e is further increased in some cases.

When hydrogen is added to an oxide semiconductor in which an oxygen vacancy is generated by addition of an impurity element, hydrogen enters an oxygen vacant site and forms a donor level in the vicinity of the conduction band. As a result, the conductivity of the oxide semiconductor is increased, so that the oxide semiconductor becomes a conductor. An oxide semiconductor having become a conductor can be referred to as an oxide conductor. Oxide semiconductors generally have a visible light transmitting property because of their large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor.

Here, the temperature dependence of resistivity of a film formed with an oxide conductor (hereinafter referred to as an oxide conductor film) is described with reference to FIG. 25.

Samples each including an oxide conductor film are fabricated. As the oxide conductor film, the following oxide conductor films are formed: an oxide conductor film (OC_SiN$_x$) formed in such a manner that an oxide semiconductor film is made in contact with a silicon nitride film; an oxide conductor film (OC_Ar dope+SiN$_x$) formed in such a manner that argon is added to an oxide semiconductor film with a doping apparatus and the oxide semiconductor film is made in contact with a silicon nitride film; and an oxide conductor film (OC_Ar plasma+SiN$_x$) formed in such a manner that an oxide semiconductor film is exposed to argon plasma in a plasma treatment apparatus and the oxide semiconductor film is made in contact with a silicon nitride film. The silicon nitride film contains hydrogen.

A method for fabricating the sample including the oxide conductor film (OC_SiN$_x$) is described below. A 400-nm-thick silicon oxynitride film is formed over a glass substrate by a plasma CVD method and then exposed to oxygen plasma so that an oxygen ion is added to the silicon oxynitride film, whereby an oxynitride silicon film from which oxygen is released by heating is formed. Then, over the silicon oxynitride film from which oxygen is released by heating, a 100-nm-thick In—Ga—Zn oxide film is formed by a sputtering method using a sputtering target with an atomic ratio of In to Ga and Zn of 1:1:1.2, subjected to heat treatment at 450° C. in a nitrogen atmosphere, and then subjected to heat treatment at 450° C. in a mixed gas atmosphere of nitrogen and oxygen. Next, a 100-nm-thick silicon nitride film is formed by a PECVD method. Then, heat treatment is performed at 350° C. in a mixed gas atmosphere of nitrogen and oxygen.

A method for fabricating the sample including the oxide conductor film (OC_Ar dope+SiN$_x$) is described below. A 400-nm-thick silicon oxynitride film is formed over a glass substrate by a PECVD method and then exposed to oxygen plasma so that an oxygen ion is added to the silicon oxynitride film, whereby an oxynitride silicon film from which oxygen is released by heating is formed. Then, over the silicon oxynitride film from which oxygen is released by heating, a 100-nm-thick In—Ga—Zn oxide film is formed by a sputtering method using a sputtering target with an atomic ratio of In to Ga and Zn of 1:1:1.2, subjected to heat treatment at 450° C. in a nitrogen atmosphere, and then subjected to heat treatment at 450° C. in a mixed gas atmosphere of nitrogen and oxygen. Next, with a doping apparatus, argon with a dose of $5 \times 10^{14}$ ions/cm$^2$ is added to the In—Ga—Zn oxide film at an accelerating voltage of 10 kV, and oxygen vacancies are formed in the In—Ga—Zn oxide film. Next, a 100-nm-thick silicon nitride film is formed by a PECVD method. Then, heat treatment is performed at 350° C. in a mixed gas atmosphere of nitrogen and oxygen.

A method for fabricating the sample including the oxide conductor film (OC_Ar plasma+SiN$_x$) is described below. A 400-nm-thick silicon oxynitride film is formed over a glass substrate by a PECVD method and then exposed to oxygen plasma, whereby a silicon oxynitride film from which oxygen is released by heating is formed. Then, over the silicon oxynitride film from which oxygen is released by heating, a 100-nm-thick In—Ga—Zn oxide film is formed by a sputtering method using a sputtering target with an atomic ratio of In to Ga and Zn of 1:1:1.2, subjected to heat treatment at 450° C. in a nitrogen atmosphere, and then subjected to heat treatment at 450° C. in a mixed gas atmosphere of nitrogen and oxygen. Next, argon plasma is generated with a plasma treatment apparatus, and an accelerated argon ion is made to collide against the In—Ga—Zn oxide film, whereby an oxygen vacancy is generated. Next, a 100-nm-thick silicon nitride film is formed by a PECVD method. Then, heat treatment is performed at 350° C. in a mixed gas atmosphere of nitrogen and oxygen.

Figure 25:
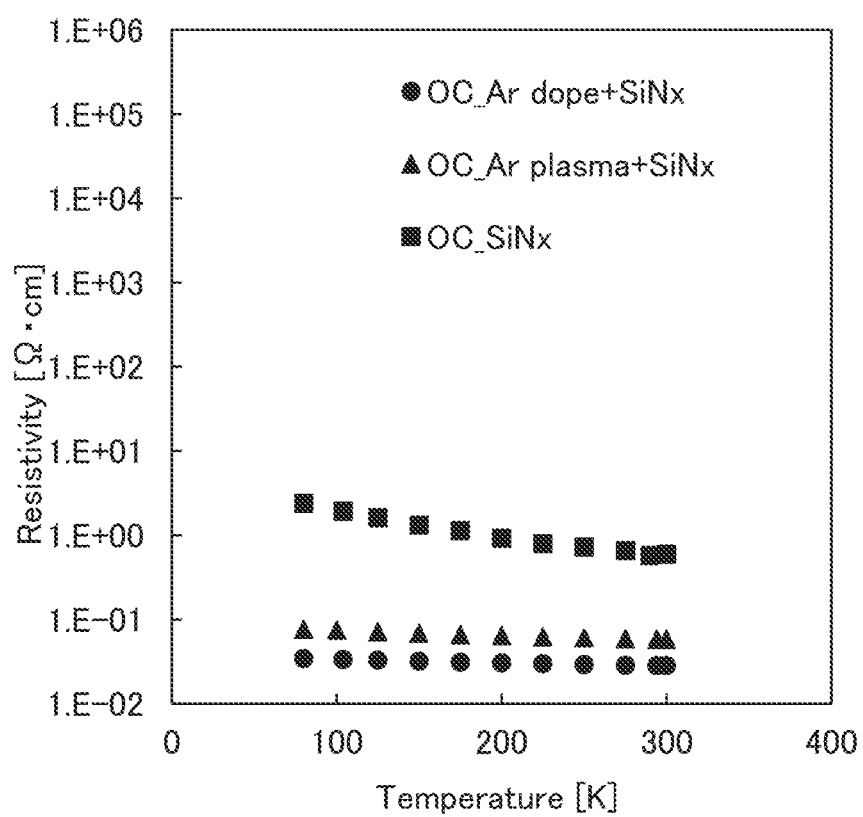
FIG. 25 shows the temperature dependence of resistivity.

FIG. 25 shows measured resistivity of each sample. The measurement of resistivity is performed by the four probe Van der Pauw method. In FIG. 25, the horizontal axis represents measurement temperature, and the vertical axis represents resistivity. Squares represent the measurement results of the oxide conductor film (OC_SiN$_x$), circles represent the measurement results of the oxide conductor film (OC_Ar dope+SiN$_x$), and triangles represent the measurement results of the oxide conductor film (OC_Ar plasma+SiN$_x$).

Note that although not shown in the graph, an oxide semiconductor film that is not in contact with a silicon nitride film has high resistivity that is difficult to measure. This indicates that the oxide conductor film has lower resistivity than the oxide semiconductor film.

According to FIG. 25, in the case where the oxide conductor film (OC_Ar dope+SiN$_x$) and the oxide conductor film (OC_Ar plasma+SiN$_x$) contain an oxygen vacancy and hydrogen, variation in resistivity is small. Typically, the variation in resistivity at temperatures from 80 K to 290 K is lower than ±20%. Alternatively, the variation in resistivity at temperatures from 150 K to 250 K is lower than ±10%. In other words, the oxide conductor is a degenerate semiconductor and it is suggested that the conduction band edge agrees with or substantially agrees with the Fermi level. Thus, when the oxide conductor film is used for a source region and a drain region of a transistor, an ohmic contact is made between the oxide conductor film and conductive films functioning as a source electrode and a drain electrode, so that the contact resistance between the oxide conductor film and the conductive films functioning as a source electrode and a drain electrode can be reduced. In addition, since the temperature dependence of the resistivity of an oxide conductor is low, the amount of change in the contact resistance between the oxide conductor film and the conductive films functioning as a source electrode and a drain electrode is small; thus, a highly reliable transistor can be manufactured.

In other words, the oxide conductor film is a degenerate semiconductor and it is suggested that the conduction band edge agrees with or substantially agrees with the Fermi level. For that reason, an ohmic contact is made between the oxide conductor film and the conductive films functioning as a source electrode and a drain electrode; thus, contact resistance between the oxide conductor film and the conductive films functioning as a source electrode and a drain electrode can be reduced.

The low-resistance region formed in the oxide semiconductor film 110 is described above. In some cases, the carrier density of the low-resistance region is reduced and the resistance of the low-resistance region is increased by oxygen filled in the oxygen vacancies in the oxide semiconductor film 110.

Specifically, the insulating film 108 is provided below the oxide semiconductor film 110. The insulating film 108 includes oxygen and has a function of supplying oxygen to the oxide semiconductor film 110. Therefore, the insulating film 108 has a function of supplying oxygen to the low-resistance regions 110b, 110c, 110d, and 110e in the oxide semiconductor film 110 and supplying oxygen to the oxygen vacancies in the channel region 110a of the oxide semiconductor film 110.

Figure 4A:
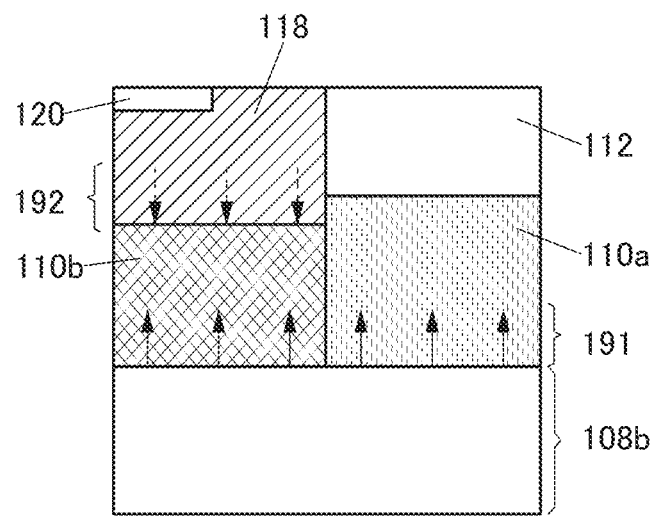
FIGS. 4A and 4B are model diagrams of movement paths of an impurity element and oxygen in the vicinity of an oxide semiconductor film.
Figure 4B:
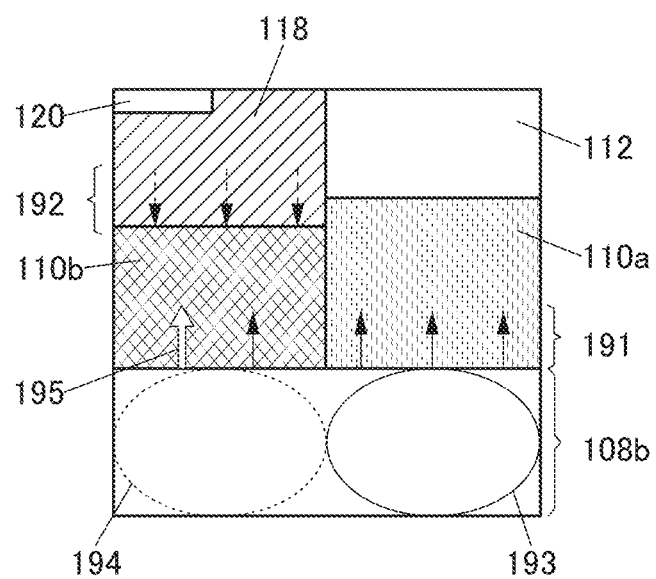

Thus, in some cases, oxygen vacancies formed in the low-resistance regions 110b, 110c, 110d, and 110e of the oxide semiconductor film 110 are filled with oxygen supplied from the insulating film 108. FIGS. 4A and 4B are model diagrams of movement paths of an impurity element and oxygen in the vicinity of the oxide semiconductor film 110. Note that FIGS. 4A and 4B correspond to model diagrams of a cross-sectional view showing the region 190 in FIG. 2A.

In FIG. 4A, solid arrows indicate oxygen 191 supplied from the insulating film 108b, and dashed arrows indicate hydrogen 192 supplied from the insulating film 118.

In the case where the insulating film 108b has a function of uniformly supplying oxygen to the oxide semiconductor film 110 as shown in FIG. 4A, the oxygen 191 is supplied to the channel region 110a and the low-resistance region 110b. Furthermore, the hydrogen 192 is supplied from the insulating film 118 to the low-resistance region 110b. Therefore, in the vicinity of a surface of the low-resistance region 110b in contact with the insulating film 118, hydrogen is bonded to an oxygen vacancy in the oxide semiconductor film 110, so that carrier density is increased. In contrast, in the vicinity of a bottom surface of the low-resistance region 110b in contact with the insulating film 108b, oxygen is bonded to an oxygen vacancy in the oxide semiconductor film 110 to fill the oxygen vacancy, so that carrier density is decreased.

The decrease in the carrier density in the low-resistance region 110b causes an increase in the resistance of the low-resistance region 110b, so that the contact resistance between the low-resistance region 110b and the conductive films functioning as a source electrode and a drain electrode is increased.

In view of this, in one embodiment of the present invention, an impurity element is introduced into the insulating film 108b to reduce the released amount of oxygen that is supplied to the low-resistance region 110b. Furthermore, in one embodiment of the present invention, an impurity element is introduced into the insulating film 108b, and oxygen supplied to the low-resistance region 110b and an impurity element introduced into the insulating film 108b are supplied to the low-resistance region 110b at a time, whereby filling an oxygen vacancy in the low-resistance region 110b with oxygen is suppressed.

Specifically, as shown in FIG. 4B, a region 193 (also referred to as a third region) and a region 194 (also referred to as a fourth region) are provided in the insulating film 108b. The impurity concentration of the region 194 is higher than that of the region 193. The region 194 included in the insulating film 108b reduces the amount of the oxygen 191 released from the region 194. Furthermore, the region 194 in the insulating film 108b supplies the oxygen 191 and an impurity element 195 to the low-resistance region 110b at a time. Note that in FIG. 4B, the impurity element 195 is indicated by an outline solid arrow.

The region 194 can be formed by introducing the impurity element to the insulating film 108b through the low-resistance region 110b after the conductive film 114 is formed, for example. Examples of a method for introducing the impurity element to the insulating film 108b include an ion doping method, an ion implantation method, and plasma treatment. Furthermore, the impurity element introduced to the insulating film 108b includes one or more of hydrogen, boron, carbon, nitrogen, fluorine, phosphorus, sulfur, and a rare gas. Note that it is particularly preferable that the impurity element introduced into the insulating film 108b be hydrogen and/or argon.

In the transistor 100 described in this embodiment, the channel region 110a is sandwiched between the low-resistance regions 110b and 110c functioning as a source region and a drain region. Therefore, the on-state current and field-effect mobility of the transistor 100 are high. In addition, in the transistor 100, the impurity element is added to the oxide semiconductor film 110 using the conductive film 114 as a mask. That is, the low-resistance regions can be formed in a self-aligned manner.

Furthermore, in the transistor 100, the conductive film 114 functioning as a gate electrode does not overlap with the conductive films 122a and 122b functioning as a source electrode and a drain electrode. Therefore, parasitic capacitance between the conductive film 114 and the conductive films 122a and 122b can be reduced. As a result, in the case where a large-area substrate is used as the substrate 102, signal delay in the conductive film 114 and the conductive films 122a and 122b can be reduced.

Furthermore, by providing the two regions with different concentrations of impurity elements in the insulating film 108 of the transistor 100, the released amount of oxygen supplied to the channel region 110a and the released amount of oxygen supplied to the low-resistance regions 110b and 110c can be made different from each other. Furthermore, by providing the two regions with different concentrations of impurity elements in the insulating film 108, the released amount of impurity elements supplied to the channel region 110a and the released amount of impurity elements supplied to the low-resistance regions 110b and 110c can be made different from each other. As a result, an increase in the resistance of the low-resistance regions 110b and 110c can be suppressed. Accordingly, a highly reliable semiconductor device can be provided.

Next, details of other elements included in the semiconductor device illustrated in FIGS. 1A to 1C are described.

As the substrate 102, any of a variety of substrates can be used without particular limitation. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. As an example of a glass substrate, a barium borosilicate glass substrate, an aluminoborosilicate glass substrate, a soda lime glass substrate, or the like can be given. Examples of the flexible substrate, the attachment film, and the base material film are plastics typified by polyethylene terephthalate (PET), polyethylene naphthalate (PEN), and polyether sulfone (PES), a synthetic resin of acrylic or the like, polypropylene, polyester, polyvinyl fluoride, polyvinyl chloride, polyamide, polyimide, aramid, epoxy, an inorganic vapor deposition film, paper, and the like. In particular, by forming the transistor with the use of a semiconductor substrate, a single crystal substrate, an SOI substrate, or the like, transistors with fewer variations in characteristics, sizes, shapes, or the like, with high current supply capability, and with small sizes can be formed. By forming a circuit using such a transistor, power consumption of the circuit can be reduced or the circuit can be highly integrated.

A flexible substrate may be used as the substrate 102, and the transistor may be provided directly on the flexible substrate. Alternatively, a separation layer may be provided between the substrate 102 and the transistor. The separation layer can be used when part or the whole of a semiconductor device formed over the separation layer is separated from the substrate 102 and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of a substrate to which the transistor is transferred include, in addition to the above-described substrates over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, a transistor with excellent properties or a transistor with low power consumption can be formed, a device with high durability can be formed, heat resistance can be provided, or reduction in weight or thickness can be achieved.

The insulating film 108 can be formed by a sputtering method, a CVD method, an evaporation method, a pulsed laser deposition (PLD) method, a printing method, a coating method, or the like as appropriate. The insulating film 108 can be formed with a single layer or a stack including, for example, an oxide insulating film or a nitride insulating film. Note that an oxide insulating film is preferably used for at least a region of the insulating film 108 which is in contact with the oxide semiconductor film 110, in order to improve characteristics of the interface with the oxide semiconductor film 110. An oxide insulating film that releases oxygen by heating is preferably used as the insulating film 108, in which case oxygen contained in the insulating film 108 can be moved to the oxide semiconductor film 110 by heat treatment.

The thickness of the insulating film 108 can be greater than or equal to 50 nm, greater than or equal to 100 nm and less than or equal to 3000 nm, or greater than or equal to 200 nm and less than or equal to 1000 nm. With use of the thick insulating film 108, the amount of oxygen released from the insulating film 108 can be increased, and the interface state density at the interface between the insulating film 108 and the oxide semiconductor film 110 and oxygen vacancy included in the channel region 110a of the oxide semiconductor film 110 can be reduced.

The insulating film 108 may be formed with a single layer or a stack including, for example, silicon oxide, silicon oxynitride, silicon nitride oxide, silicon nitride, aluminum oxide, hafnium oxide, gallium oxide, or Ga—Zn oxide. In this embodiment, a silicon nitride film is used as the insulating film 108a, and a silicon oxynitride film is used as the insulating film 108b. When the insulating film 108 has a stack of the insulating film 108a formed using a silicon nitride film and the insulating film 108b formed using a silicon oxynitride film, oxygen can be efficiently introduced into the oxide semiconductor film 110.

The oxide semiconductor film 110 is typically formed using a metal oxide such as an In—Ga oxide, an In—Zn oxide, or an In-M-Zn oxide (M is Mg, Al, Ti, Ga, Y, Zr, La, Ce, Nd, or Hf). Note that the oxide semiconductor film 110 has a light-transmitting property.

Note that in the case where the oxide semiconductor film 110 is an In-M-Zn oxide, when the summation of In and M is assumed to be 100 atomic %, the proportions of In and M are as follows: the proportions of In and M are preferably set to be greater than or equal to 25 atomic % and less than 75 atomic %, respectively, or greater than or equal to 34 atomic % and less than 66 atomic %, respectively.

The energy gap of the oxide semiconductor film 110 is 2 eV or more, 2.5 eV or more, or 3 eV or more.

The thickness of the oxide semiconductor film 110 can be greater than or equal to 3 nm and less than or equal to 200 nm, greater than or equal to 3 nm and less than or equal to 100 nm, or greater than or equal to 3 nm and less than or equal to 60 nm.

In the case where the oxide semiconductor film 110 is an In-M-Zn oxide, it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, or the like is preferable. Note that the atomic ratios of metal elements in the formed oxide semiconductor film 110 vary from the above atomic ratio of metal elements of the sputtering target within a range of ±40% as an error.

When silicon or carbon that is one of elements belonging to Group 14 is contained in the oxide semiconductor film 110, oxygen vacancies are increased in the oxide semiconductor film 110, and the oxide semiconductor film 110 becomes an n-type film. Thus, the concentration of silicon or carbon (the concentration is measured by secondary ion mass spectrometry) of the oxide semiconductor film 110, in particular, the channel region 110a, can be lower than or equal to $2 \times 10^{18}$ atoms/cm$^3$, or lower than or equal to $2 \times 10^{17}$ atoms/cm$^3$. As a result, the transistor has positive threshold voltage (normally-off characteristics).

Further, the concentration of alkali metal or alkaline earth metal of the oxide semiconductor film 110, in particular, the channel region 110a, which is measured by secondary ion mass spectrometry, can be lower than or equal to $1 \times 10^{18}$ atoms/cm$^3$, or lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the channel region 110a. As a result, the transistor has positive threshold voltage (normally-off characteristics).

Furthermore, when nitrogen is contained in the oxide semiconductor film 110, in particular, the channel region 110a, electrons serving as carriers are generated, carrier density is increased, and the region becomes an n-type in some cases. Thus, a transistor including an oxide semiconductor film which contains nitrogen is likely to have normally-on characteristics. For this reason, nitrogen in the oxide semiconductor film, in particular, the channel region 110a, is preferably reduced as much as possible. The nitrogen concentration, which is measured by secondary ion mass spectrometry, can be set to, for example, lower than or equal to $5 \times 10^{18}$ atoms/cm$^3$.

When the impurity element in the oxide semiconductor film 110, in particular, the channel region 110a, is reduced, the carrier density of the oxide semiconductor film can be lowered. Therefore, in the oxide semiconductor film 110, in particular, the channel regions 110a, carrier density can be set to less than $8\times10^{11}/cm^3$, preferably less than $1\times10^{11}/cm^3$, further preferably less than $1\times10^{10}/cm^3$ or less, and greater than or equal to $1\times10^{-9}/cm^3$.

Note that an oxide semiconductor film with a low impurity concentration and a low density of defect states can be used for the oxide semiconductor film 110, in which case the transistor can have more excellent electrical characteristics. Here, the state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has few carrier traps in some cases. Further, a highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases.

The oxide semiconductor film 110 may have a non-single-crystal structure, for example. The non-single-crystal structure includes a c-axis aligned crystalline oxide semiconductor (CAAC-OS) which is described later, a polycrystalline structure, a microcrystalline structure described later, or an amorphous structure, for example. Among the non-single-crystal structure, the amorphous structure has the highest density of defect levels, whereas CAAC-OS has the lowest density of defect levels.

Note that the oxide semiconductor film 110 may be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, the mixed film has a stacked-layer structure of two or more of a region having an amorphous structure, a region having a microcrystalline structure, a region having a polycrystalline structure, a CAAC-OS region, and a region having a single-crystal structure in some cases.

Note that in the oxide semiconductor film 110, the crystallinity of the channel region 110a is different from the crystallinity of each of the low-resistance regions 110b, 110c, 110d, and 110e in some cases. Specifically, in the oxide semiconductor film 110, the crystallinity of the channel region 110a is higher than the crystallinity of each of the low-resistance regions 110b, 110c, 110d, and 110e. This is because, when the impurity element is added to the low-resistance regions 110b, 110c, 110d, and 110e, the low-resistance regions 110b, 110c, 110d, and 110e are damaged and thus have lower crystallinity.

The insulating film 112 can be formed with a single layer or a stack using an oxide insulating film or a nitride insulating film. Note that an oxide insulating film is preferably used for at least a region of the insulating film 112 which is in contact with the oxide semiconductor film 110, in order to improve characteristics of the interface with the oxide semiconductor film 110. The insulating film 112 can be formed with a single layer or a stack using, for example, silicon oxide, silicon oxynitride, silicon nitride oxide, silicon nitride, aluminum oxide, hafnium oxide, gallium oxide, or a Ga—Zn oxide.

Furthermore, it is possible to prevent outward diffusion of oxygen from the oxide semiconductor film 110 and entry of hydrogen, water, or the like into the oxide semiconductor film 110 from the outside by providing an insulating film having a blocking effect against oxygen, hydrogen, water, and the like as the insulating film 112. As the insulating film which has an effect of blocking oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, or the like can be used.

The insulating film 112 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

An oxide insulating film that releases oxygen by heating is preferably used as the insulating film 112, in which case oxygen contained in the insulating film 112 can be moved to the oxide semiconductor film 110 by heat treatment.

The thickness of the insulating film 112 can be greater than or equal to 5 nm and less than or equal to 400 nm, greater than or equal to 5 nm and less than or equal to 300 nm, or greater than or equal to 10 nm and less than or equal to 250 nm.

The conductive film 114 and the conductive films 122a and 122b can be formed by a sputtering method, a vacuum evaporation method, a pulsed laser deposition (PLD) method, a thermal CVD method, or the like. The conductive film 114 and the conductive films 122a and 122b can be formed using, for example, a metal element selected from aluminum, chromium, copper, tantalum, titanium, molybdenum, nickel, iron, cobalt, and tungsten; an alloy containing any of these metal elements as a component; an alloy containing these metal elements in combination; or the like. Further, one or more metal elements selected from manganese and zirconium may be used. The conductive film 114 and the conductive films 122a and 122b may each have a single-layer structure or a stacked-layer structure of two or more layers. For example, any of the following can be used: a single-layer structure of an aluminum film containing silicon; a single-layer structure of a copper film containing manganese; two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film in which aluminum and one or more elements selected from titanium, tantalum, tungsten, molybdenum, chromium, neodymium, and scandium are combined may be used.

The conductive film 114 and the conductive films 122a and 122b can also be formed using a light-transmitting conductive material such as indium tin oxide (also referred to as ITO), indium oxide containing tungsten oxide, indium zinc oxide containing tungsten oxide, indium oxide containing titanium oxide, indium tin oxide containing titanium oxide, indium zinc oxide, or indium tin oxide containing silicon oxide. It is also possible to have a layered structure of the above light-transmitting conductive material and the above metal element.

The thicknesses of the conductive film 114 and the conductive films 122a and 122b each can be greater than or equal to 30 nm and less than or equal to 500 nm, or greater than or equal to 100 nm and less than or equal to 400 nm.

The insulating film 118 contains hydrogen. The insulating film 118 containing hydrogen is a nitride insulating film, for example. The nitride insulating film can be formed using silicon nitride, silicon nitride oxide, aluminum nitride, aluminum nitride oxide, or the like. The hydrogen concentration of the insulating film 118 is preferably higher than or equal to $1 \times 10^{22}$ atoms/cm$^3$. Furthermore, the insulating film 118 is in contact with the low-resistance region of the oxide semiconductor film 110. Thus, hydrogen contained in the insulating film 118 is diffused to the low-resistance region of the oxide semiconductor film 110, whereby the hydrogen concentration of the low-resistance region is higher than that of the channel region in the oxide semiconductor film 110.

The insulating film 120 can be formed with a single layer or a stack using an oxide insulating film or a nitride insulating film. The insulating film 120 can be formed with a single layer or a stack using, for example, silicon oxide, silicon oxynitride, silicon nitride oxide, silicon nitride, aluminum oxide, hafnium oxide, gallium oxide, and a Ga—Zn oxide.

The insulating film 128 is preferably a film functioning as a barrier film against hydrogen, water, and the like from the outside. The insulating film 128 can be formed with a single layer or a stack using, for example, silicon nitride, silicon nitride oxide, aluminum oxide, or the like.

The thicknesses of the insulating film 118, the insulating film 120, and the insulating film 128 each can be greater than or equal to 30 nm and less than or equal to 500 nm, or greater than or equal to 100 nm and less than or equal to 400 nm.

<Structure 2 of Semiconductor Device>

Another structure of the semiconductor device illustrated in FIGS. 1A to 1C is described with reference to FIGS. 5A to 5C and FIGS. 6A to 6C.

Figure 5A:
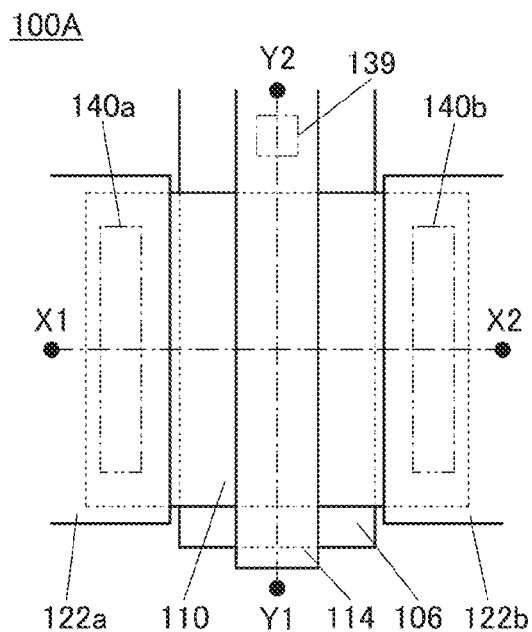
FIGS. 5A to 5C are a top view and cross-sectional views illustrating one embodiment of a semiconductor device.
Figure 5B:
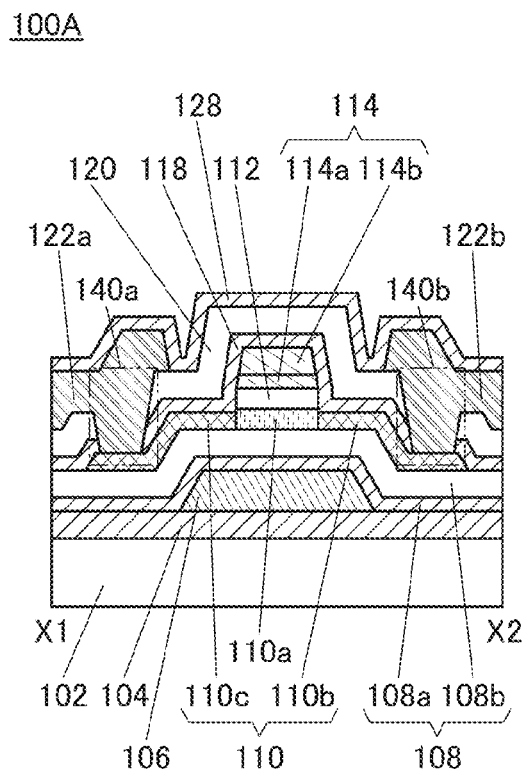
Figure 5C:
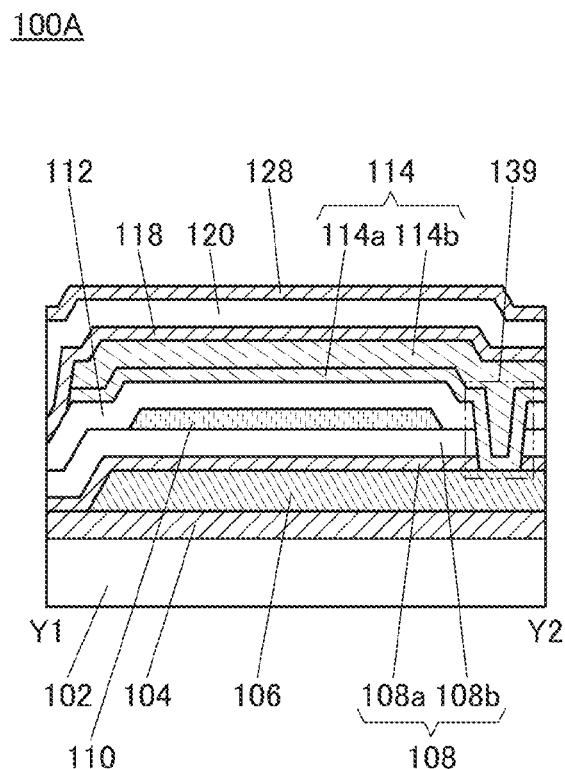

FIG. 5A is a top view of a transistor 100A included in a semiconductor device. FIG. 5B is a cross-sectional view along the dashed-dotted line X1-X2 in FIG. 5A. FIG. 5C is a cross-sectional view along the dashed-dotted line Y1-Y2 in FIG. 5A.

The transistor 100A illustrated in FIGS. 5A to 5C includes a conductive film 106 over the insulating film 104 formed over the substrate 102, the insulating film 108 (also referred to as a first insulating film) over the insulating film 104 and the conductive film 106, the oxide semiconductor film 110 overlapping with the conductive film 106 with the insulating film 108 provided therebetween, the insulating film 112 over the oxide semiconductor film 110, the conductive film 114 overlapping with the oxide semiconductor film 110 with the insulating film 112 provided therebetween, the insulating film 118 (also referred to as a second insulating film) covering the oxide semiconductor film 110, the insulating film 112, and the conductive film 114, the insulating film 120 (also referred to as a third insulating film) over the insulating film 118, the conductive film 122a electrically connected to the oxide semiconductor film 110 through the opening portion 140a (also referred to as a first opening portion) provided in the insulating film 118 and the insulating film 120, and the conductive film 122b electrically connected to the oxide semiconductor film 110 through the opening portion 140b (also referred to as a second opening portion) provided in the insulating film 118 and the insulating film 120. Note that the insulating film 128 covering the insulating film 120 and the conductive films 122a and 122b may be provided over the transistor 100A.

Furthermore, in the transistor 100A, the insulating film 108 includes the insulating film 108a and the insulating film 108b over the insulating film 108a. Furthermore, the oxide semiconductor film 110 includes the channel region 110a (also referred to as a first region) and the pair of low-resistance regions 110b and 110c (also referred to as second regions) between which the channel region 110a is provided. Note that the channel region 110a is in contact with the insulating film 112, and the low-resistance regions 110b and 110c are in contact with the insulating film 118. Furthermore, the conductive film 114 includes the conductive film 114a and the conductive film 114b over the conductive film 114a.

Furthermore, the conductive film 106 functions as a first gate electrode (also referred to as a bottom-gate electrode), the insulating film 108 functions as a first gate insulating film, the conductive film 114 functions as a second gate electrode (also referred to as a top-gate electrode), the insulating film 112 functions as a second gate insulating film, the conductive film 122a functions as one of a source electrode and a drain electrode, and the conductive film 122b functions as the other of the source electrode and the drain electrode.

Furthermore, in the transistor 100A, the insulating film 108 contains oxygen and has a function of supplying oxygen to the oxide semiconductor film 110. Oxygen supplied from the insulating film 108 can fill oxygen vacancies which can be formed in the oxide semiconductor film 110. Furthermore, the insulating film 118 contains hydrogen and has a function of supplying hydrogen to the oxide semiconductor film 110.

Note that the transistor 100A shown in FIGS. 5A to 5C is different from the transistor 100 described above and has a structure in which the conductive film functioning as a gate electrode is provided over and below the oxide semiconductor film 110. As in the transistor 100A, two or more gate electrodes may be provided in the semiconductor device of one embodiment of the present invention.

Furthermore, as illustrated in FIG. 5C, the conductive film 114 functioning as a second gate electrode is electrically connected to the conductive film 106 functioning as a first gate electrode in an opening portion 139 (also referred to as a third opening portion) provided in the insulating film 108 and the insulating film 112. Therefore, the same potential is applied to the conductive film 114 and the conductive film 106. Note that the opening portion 139 is not necessarily provided, so that different potentials are supplied to the conductive film 114 and the conductive film 106.

Furthermore, as illustrated in FIG. 5C, the oxide semiconductor film 110 is positioned to face each of the conductive film 106 functioning as a first gate electrode and the conductive film 114 functioning as a second gate electrode, and is sandwiched between the two conductive films functioning as gate electrodes. The length in the channel width direction of the conductive film 114 functioning as a second gate electrode is longer than the length in the channel width direction of the oxide semiconductor film 110. In the channel width direction, the whole oxide semiconductor film 110 is covered with the conductive film 114 with the insulating film 112 provided therebetween. Since the conductive film 114 functioning as a second gate electrode is connected to the conductive film 106 functioning as a first gate electrode in the opening portion 139 provided in the insulating film 108 and the insulating film 112, a side surface of the oxide semiconductor film 110 in the channel width direction faces the conductive film 114 functioning as a second gate electrode with the insulating film 112 provided therebetween.

In other words, in the channel width direction of the transistor 100A, the conductive film 106 functioning as a first gate electrode and the conductive film 114 functioning as a second gate electrode are connected to each other in the opening portion provided in the insulating film 108 functioning as a first gate insulating film and the insulating film 112 functioning as a second gate insulating film; and the conductive film 106 and the conductive film 114 surround the oxide semiconductor film 110 with the insulating film 108 functioning as a first gate insulating film and the insulating film 112 functioning as a second gate insulating film provided therebetween.

Such a structure enables electric fields of the conductive film 106 functioning as a first gate electrode and the conductive film 114 functioning as a second gate electrode to electrically surround the oxide semiconductor film 110 included in the transistor 100A. A device structure of a transistor, like that of the transistor 100A, in which electric fields of a first gate electrode and a second gate electrode electrically surround an oxide semiconductor film where a channel region is formed can be referred to as a surrounded channel (s-channel) structure.

Since the transistor 100A has the s-channel structure, an electric field for inducing a channel can be effectively applied to the oxide semiconductor film 110 by the conductive film 106 functioning as a first gate electrode or the conductive film 114 functioning as a second gate electrode; therefore, the current drive capability of the transistor 100A can be improved and high on-state current characteristics can be obtained. Since the on-state current can be increased, it is possible to reduce the size of the transistor 100A. In addition, since the transistor 100A has a structure in which the oxide semiconductor film 110 is surrounded by the conductive film 106 functioning as a first gate electrode and the conductive film 114 functioning as a second gate electrode, the mechanical strength of the transistor 100A can be increased.

Note that in the channel width direction of the transistor 100A, an opening portion which is different from the opening portion 139 may be formed on the side of the oxide semiconductor film 110 where the opening portion 139 is not formed.

The insulating film 104 can be formed using a material similar to that of the above-described insulating film 108. The conductive film 106 can be formed using a material similar to that of the above-described conductive film 114. Although a structure including the insulating film 104 is described as the transistor 100A, the structure is not limited thereto. For example, the insulating film 104 is not necessarily provided.

Note that the other components of the transistor 100A are similar to those of the transistor 100 described above, and an effect similar to that of the transistor 100 can be obtained.

<Structure 3 of Semiconductor Device>

Figure 6A:
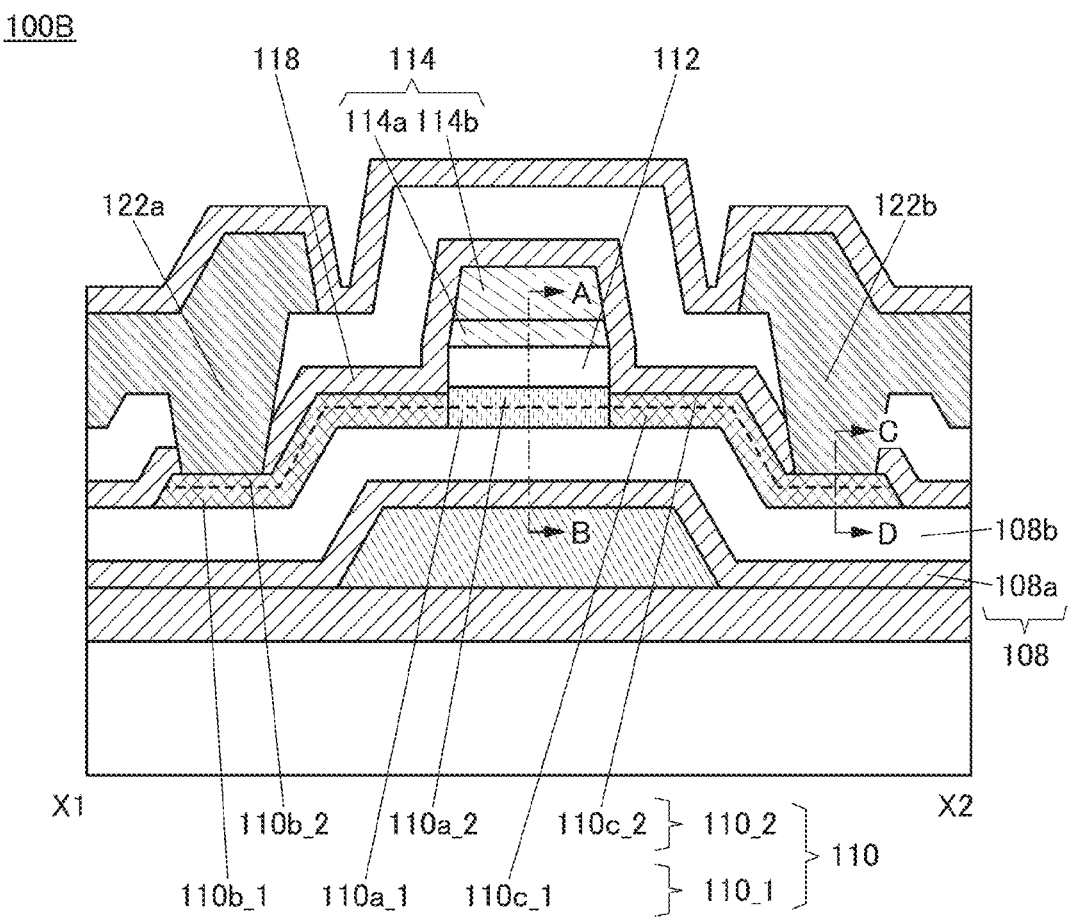
FIG. 6A is a cross-sectional view illustrating one embodiment of a semiconductor device and FIGS. 6B and 6C illustrate one embodiment of a band structure.

A transistor 100B illustrated in FIG. 6A differs from the transistor 100A illustrated in FIG. 5B in the structure of the oxide semiconductor film 110. Specifically, the oxide semiconductor film 110 included in the transistor 100B includes an oxide semiconductor film 110_1 and an oxide semiconductor film 110_2 provided in contact with the oxide semiconductor film 110_1. That is, the oxide semiconductor film 110 has a multilayer structure.

Furthermore, the oxide semiconductor film 110 of the transistor 100B illustrated in FIG. 6A includes the low-resistance regions described above. Specifically, the oxide semiconductor film 110 of the transistor 100B includes a channel region 110a_1, a channel region 110a_2, a low-resistance region 110b_1, a low-resistance region 110b_2, a low-resistance region 110c_1, and a low-resistance region 110c_2.

<Band Structure>

Figure 6B:
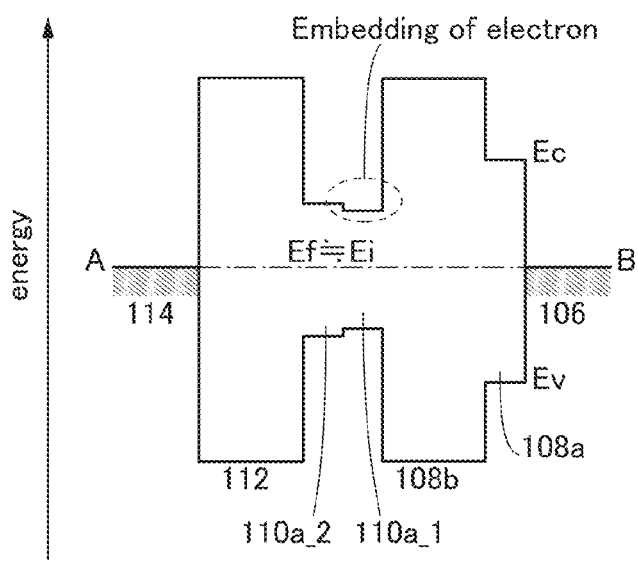

Here, a band structure in the A-B cross section including the channel regions of the transistor 100B is illustrated in FIG. 6B. Note that the oxide semiconductor film 110_2 is assumed to have a wider energy gap than the oxide semiconductor film 110_1. Furthermore, the insulating film 108a, the insulating film 108b, and the insulating film 112 are assumed to have wider energy gaps than the oxide semiconductor film 110_1 and the oxide semiconductor film 110_2. Furthermore, the Fermi levels (denoted by Ef) of the oxide semiconductor film 110_1, the oxide semiconductor film 110_2, the insulating film 108a, the insulating film 108b, and the insulating film 112 are assumed to be equal to the intrinsic Fermi levels thereof (denoted by Ei). Furthermore, work functions of the conductive film 106 and the conductive film 114 are assumed to be equal to the Fermi levels.

When a gate voltage is set to be higher than or equal to the threshold voltage of the transistor, an electron flows preferentially in the oxide semiconductor film 110_1 owing to the difference between the energies of the conduction band minimums of the oxide semiconductor film 110_1 and the oxide semiconductor film 110_2. That is, it is probable that an electron is embedded in the oxide semiconductor film 110_1. Note that the energy at the conduction band minimum is denoted by Ec, and the energy at the valence band maximum is denoted by Ev.

Accordingly, in the transistor according to one embodiment of the present invention, the embedment of an electron reduces the influence of interface scattering. Therefore, the channel resistance of the transistor according to one embodiment of the present invention is low.

Figure 6C:
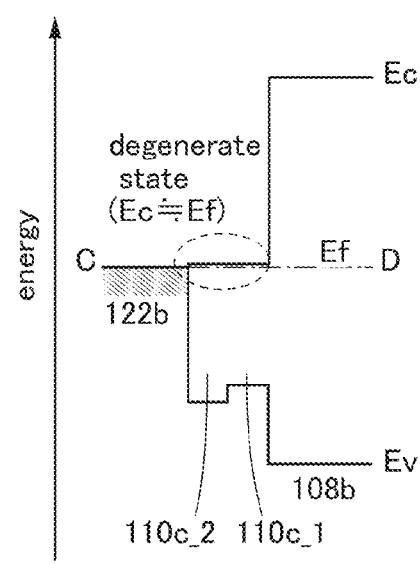

Next, FIG. 6C shows a band structure in the C-D cross section including the source region or the drain region of the transistor. Note that the low-resistance region 110c_1 and the low-resistance region 110c_2 are assumed to be in a degenerate state. Furthermore, the Fermi level of the oxide semiconductor film 110_1 is assumed to be approximately the same as the energy of the conduction band minimum in the low-resistance region 110c_1. Furthermore, the Fermi level of the oxide semiconductor film 110_2 is assumed to be approximately the same as the energy of the conduction band minimum in the low-resistance region 110c_2.

At this time, an ohmic contact is made between the conductive film 122b functioning as a source electrode or a drain electrode and the low-resistance region 110c_2 because an energy barrier therebetween is sufficiently low. Furthermore, an ohmic contact is made between the low-resistance region 110c_2 and the low-resistance region 110c_1. Therefore, electron transfer is conducted smoothly between the conductive film 122*b* and the oxide semiconductor films 110_1 and 110_2.

Note that description similar to that of FIG. 6C can be made on a region where the conductive film 122*a* functioning as one of a source electrode and a drain electrode of the transistor is in contact with the low-resistance region 110*b*_1 and the low-resistance region 110*b*_2 of the oxide semiconductor film 110.

As described above, the transistor according to one embodiment of the present invention is a transistor in which the channel resistance is low and electron transfer between the channel region and the source and the drain electrodes is conducted smoothly. That is, the transistor has excellent switching characteristics.

<Method 1 for Manufacturing Semiconductor Device>

Next, an example of a method for manufacturing the transistor 100 illustrated in FIGS. 1A to 1C is described with reference to FIGS. 7A to 7D, FIGS. 8A to 8D, FIGS. 9A to 9D, and FIGS. 10A and 10B. Note that FIGS. 7A to 7D, FIGS. 8A to 8D, FIGS. 9A to 9D, and FIGS. 10A and 10B are cross-sectional views showing a method for manufacturing the transistor 100.

Note that the films included in the transistor 100 (i.e., the insulating film, the oxide semiconductor film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute transistor.

Figure 7A:
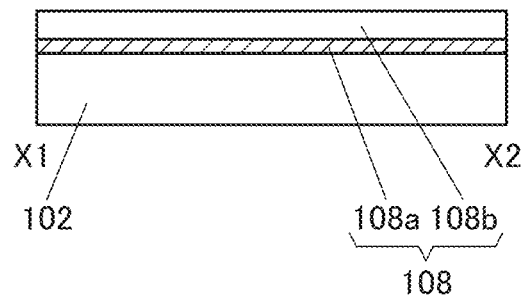
FIGS. 7A to 7D are cross-sectional views illustrating an example of a manufacturing process of a semiconductor device.

First, the insulating film 108 (the insulating film 108*a* and the insulating film 108*b*) is formed over the substrate 102 (see FIG. 7A).

The insulating film 108 can be formed by a sputtering method, a CVD method, an evaporation method, a pulsed laser deposition (PLD) method, a printing method, a coating method, or the like as appropriate. In this embodiment, a 100-nm-thick silicon nitride film is formed using a PECVD apparatus as the insulating film 108*a*. Furthermore, a 400-nm-thick silicon oxynitride film is formed using a PECVD apparatus as the insulating film 108*b*.

After the insulating film 108*b* is formed, oxygen may be added to the insulating film 108*b*. Examples of oxygen added to the insulating film 108*b* include an oxygen radical, an oxygen atom, an oxygen atomic ion, and an oxygen molecular ion. As a method for adding the oxygen, an ion doping method, an ion implantation method, plasma treatment, or the like can be given. Alternatively, after a film that suppresses release of oxygen is formed over the insulating film, oxygen may be added to the insulating film 108*b* through the film.

Alternatively, as the insulating film 108*b*, a silicon oxide film or a silicon oxynitride film that can release oxygen by heat treatment can be formed under the following conditions: the substrate placed in a treatment chamber of the PECVD apparatus that is vacuum-evacuated is held at a temperature higher than or equal to 180° C. and lower than or equal to 280° C., or higher than or equal to 200° C. and lower than or equal to 240° C., the pressure is greater than or equal to 100 Pa and less than or equal to 250 Pa, or greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, or greater than or equal to 0.25 W/cm$^2$ and less than or equal to 0.35 W/cm$^2$ is supplied to an electrode provided in the treatment chamber.

Here, a method in which a film that suppresses release of oxygen is formed over the insulating film 108*b* and then oxygen is added to the insulating film 108*b* through the film is described.

Figure 7B:
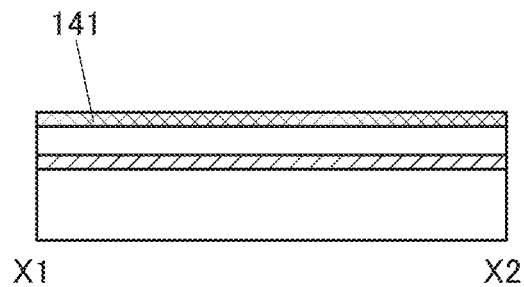

A film 141 that suppresses release of oxygen is formed over the insulating film 108*b* (see FIG. 7B).

Figure 7C:
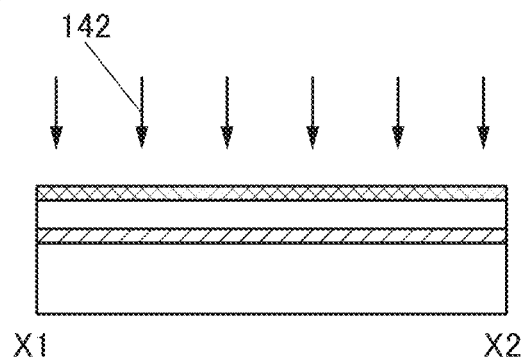

Next, oxygen 142 is added to the insulating film 108*b* through the film 141 (see FIG. 7C).

The film 141 that suppresses release of oxygen is formed using any of the following conductive materials: a metal element selected from indium, zinc, gallium, tin, aluminum, chromium, tantalum, titanium, molybdenum, nickel, iron, cobalt, and tungsten; an alloy containing the above-described metal element as a component; an alloy containing any of the above-described metal elements in combination; a metal nitride containing the above-described metal element; a metal oxide containing the above-described metal element; a metal nitride oxide containing the above-described metal element; and the like.

The thickness of the film 141 that suppresses release of oxygen can be greater than or equal to 1 nm and less than or equal to 20 nm, or greater than or equal to 2 nm and less than or equal to 10 nm.

As a method for adding the oxygen 142 to the insulating film 108b through the film 141, an ion doping method, an ion implantation method, plasma treatment, or the like is given. By adding oxygen to the insulating film 108b with the film 141 provided over the insulating film 108b, the film 141 functions as a protective film that suppresses release of oxygen from the insulating film 108b. Thus, more oxygen can be added to the insulating film 108b.

In the case where oxygen is added by plasma treatment, by making oxygen excited by a microwave to generate high density oxygen plasma, the amount of oxygen added to the oxide insulating film 108b can be increased.

Figure 7D:
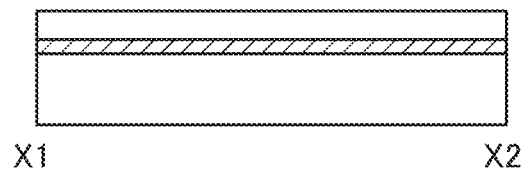

Then, the film 141 is removed (see FIG. 7D).

Note that the film 141 is removed by a wet etching method and/or a dry etching method, for example. Note that the treatment for adding oxygen which is illustrated in FIGS. 7B and 7C is not necessarily performed in the case where the insulating film 108b to which a sufficient amount of oxygen is added can be formed after its deposition.

Next, an oxide semiconductor film is formed over the insulating film 108b, and the oxide semiconductor film is processed into a desired shape, whereby the oxide semiconductor film 110 is formed. After that, the insulating film 112 is formed over the insulating film 108b and the oxide semiconductor film 110 (see FIG. 8A).

Figure 8A:
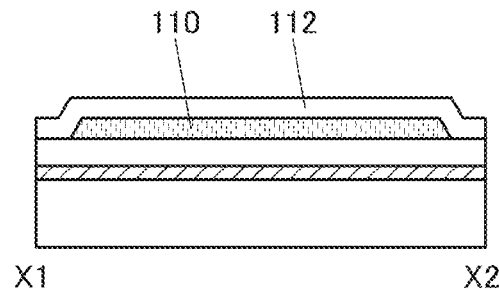
FIGS. 8A to 8D are cross-sectional views illustrating an example of the manufacturing process of a semiconductor device.

A formation method of the oxide semiconductor film 110 is described below. An oxide semiconductor film is formed over the insulating film 108b by a sputtering method, a coating method, a pulsed laser deposition method, a laser ablation method, a thermal CVD method, or the like. Then, after a mask is formed over the oxide semiconductor film by a lithography step, the oxide semiconductor film is partly etched using the mask. Accordingly, the oxide semiconductor film 110 can be formed as illustrated in FIG. 8A. After that, the mask is removed. Note that heat treatment may be performed after the oxide semiconductor film 110 is formed.

Alternatively, by using a printing method for forming the oxide semiconductor film 110, the oxide semiconductor film 110 subjected to element isolation can be formed directly.

As a power supply device for generating plasma in the case of forming the oxide semiconductor film by a sputtering method, an RF power supply device, an AC power supply device, a DC power supply device, or the like can be used as appropriate. Note that a CAAC-OS film can be formed using an AC power supply device or a DC power supply device. In forming the oxide semiconductor film, a sputtering method using an AC power supply device or a DC power supply device is preferable to a sputtering method using an RF power supply device because the oxide semiconductor film can be uniform in film thickness, film composition, or crystallinity.

In the case where the oxide semiconductor film is formed by a sputtering method, as a sputtering gas, a rare gas (typically argon), an oxygen gas, or a mixed gas of a rare gas and an oxygen gas is used as appropriate. In the case of using the mixed gas of a rare gas and oxygen, the proportion of oxygen to a rare gas is preferably increased.

Furthermore, in the case where the oxide semiconductor film is formed by a sputtering method, a sputtering target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., higher than or equal to 150° C. and lower than or equal to 450° C., or higher than or equal to 200° C. and lower than or equal to 350° C., a CAAC-OS film can be formed. In the case where the substrate temperature is higher than or equal to 25° C. and lower than 150° C., a microcrystalline oxide semiconductor film can be formed.

For the deposition of the CAAC-OS film to be described later, the following conditions are preferably used.

By suppressing entry of impurities during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, or −100° C. or lower is used.

Furthermore, it is preferable that the proportion of oxygen in the deposition gas be increased and the power be optimized in order to reduce plasma damage at the deposition. The proportion of oxygen in the deposition gas is 30 vol. % or higher, or 100 vol. %.

After the oxide semiconductor film is formed, dehydrogenation or dehydration may be performed by heat treatment. The heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C.

The heat treatment is performed under an inert gas atmosphere containing nitrogen or a rare gas such as helium, neon, argon, xenon, or krypton. Further, the heat treatment may be performed under an inert gas atmosphere first, and then under an oxygen atmosphere. It is preferable that the above inert gas atmosphere and the above oxygen atmosphere do not contain hydrogen, water, and the like. The treatment time is from 3 minutes to 24 hours.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

By forming the oxide semiconductor film while it is heated or performing heat treatment after the formation of the oxide semiconductor film, the hydrogen concentration in the oxide semiconductor film, which is measured by secondary ion mass spectrometry, can be $5 \times 10^{19}$ atoms/cm$^3$ or lower, $1 \times 10^{19}$ atoms/cm$^3$ or lower, $5 \times 10^{18}$ atoms/cm$^3$ or lower, $1 \times 10^{18}$ atoms/cm$^3$ or lower, $5 \times 10^{17}$ atoms/cm$^3$ or lower, or $1 \times 10^{16}$ atoms/cm$^3$ or lower.

For example, in the case where an oxide semiconductor film, e.g., an InGaZnO$_x$ (X>0) film is formed using a deposition apparatus employing ALD, an In(CH$_3$)$_3$ gas and an O$_3$ gas are sequentially introduced plural times to form an InO$_2$ layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ may be used.

Instead of a Ga(CH$_3$)$_3$ gas, a Ga(C$_2$H$_5$)$_3$ gas may be used. Furthermore, a Zn(CH$_3$)$_2$ gas may be used.

Note that in this embodiment, the oxide semiconductor film 110 is formed as follows. A 50-nm-thick oxide semiconductor film is deposited using a sputtering apparatus and using an In—Ga—Zn metal oxide (In:Ga:Zn=1:1:1.2 [atomic ratio]) as a sputtering target, and then, heat treatment is performed, whereby oxygen contained in the insulating film 108b is moved to the oxide semiconductor film. Next, a mask is formed over the oxide semiconductor film, and part of the oxide semiconductor film is selectively etched. Thus, the oxide semiconductor film 110 is formed.

When the heat treatment is performed at a temperature higher than 350° C. and lower than or equal to 650° C., or higher than or equal to 450° C. and lower than or equal to 600° C., it is possible to obtain an oxide semiconductor film whose proportion of CAAC, which is described later, is greater than or equal to 60% and less than 100%, greater than or equal to 80% and less than 100%, greater than or equal to 90% and less than 100%, or greater than or equal to 95% and less than or equal to 98%. Furthermore, it is possible to obtain an oxide semiconductor film having a low content of hydrogen, water, and the like. That is, an oxide semiconductor film with a low impurity concentration and a low density of defect states can be formed.

The insulating film 112 can be formed by the formation method of the insulating film 108b as appropriate. As the insulating film 112, a silicon oxide film or a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

The silicon oxynitride film having a small amount of defects can be formed as the insulating film 112 by a PECVD method under the conditions where the ratio of an oxidizing gas to a deposition gas is higher than 20 times and lower than 100 times or higher than or equal to 40 times and lower than or equal to 80 times and the pressure in a treatment chamber is lower than 100 Pa or lower than or equal to 50 Pa.

As the insulating film 112, a silicon oxide film or a silicon oxynitride film which is dense can be formed under the following conditions: the substrate placed in a treatment chamber of a PECVD apparatus that is vacuum-evacuated is held at a temperature higher than or equal to 280° C. and lower than or equal to 400° C., the pressure is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

The insulating film 112 can be formed by a plasma CVD method using a microwave. The microwave refers to a wave in the frequency range of 300 MHz to 300 GHz. In a microwave, electron temperature is low and electron energy is low. Further, in supplied power, the proportion of power used for acceleration of electrons is low, and therefore, much more power can be used for dissociation and ionization of molecules. Thus, plasma with high density (high-density plasma) can be excited. Therefore, a deposition surface and a deposit are less damaged by plasma, and the insulating film 112 with few defects can be formed.

Alternatively, the insulating film 112 can be formed by a CVD method using an organosilane gas. As the organosilane gas, any of the following silicon-containing compound can be used: tetraethyl orthosilicate (TEOS) (chemical formula: Si(OC$_2$H$_5$)$_4$); tetramethylsilane (TMS) (chemical formula: Si(CH$_3$)$_4$); tetramethylcyclotetrasiloxane (TMCTS); octamethylcyclotetrasiloxane (OMCTS); hexamethyldisilazane (HMDS); triethoxysilane (SiH(OC$_2$H$_5$)$_3$); trisdimethylaminosilane (SiH(N(CH$_3$)$_2$)$_3$); or the like. By a CVD method using the organosilane gas, the insulating film 112 having high coverage can be formed.

In the case where a gallium oxide film is formed as the insulating film 112, metal organic chemical vapor deposition (MOCVD) can be used.

In the case where a hafnium oxide film is formed as the insulating film 112 by a thermal CVD method such as an MOCVD method or an ALD method, two kinds of gases, i.e., ozone (O$_3$) as an oxidizer and a source gas which is obtained by vaporizing a liquid containing a solvent and a hafnium precursor compound (a hafnium alkoxide and a hafnium amide such as hafnium tetrakis(dimethylamide) hafnium (TDMAH)), are used. Note that the chemical formula of tetrakis(dimethylamide)hafnium is Hf[N(CH$_3$)$_2$]$_4$. Examples of another material liquid include tetrakis(ethylmethylamide)hafnium.

In the case where an aluminum oxide film is formed as the insulating film 112 by a thermal CVD method such as an MOCVD method or an ALD method, two kinds of gases, i.e., H$_2$O as an oxidizer and a source gas which is obtained by vaporizing a liquid containing a solvent and an aluminum precursor compound (e.g., trimethylaluminum (TMA)) are used. Note that the chemical formula of trimethylaluminum is Al(CH$_3$)$_3$. Examples of another material liquid include tris(dimethylamide)aluminum, triisobutylaluminum, and aluminum tris(2,2,6,6-tetramethyl-3,5-heptanedionate). Note that the ALD method enables the insulating film 112 to have excellent coverage and small thickness.

In the case where a silicon oxide film is formed as the insulating film 112 by a thermal CVD method such as an MOCVD method or an ALD method, hexachlorodisilane is adsorbed on a deposition surface, chlorine contained in adsorbate is removed, and radicals of an oxidizing gas (e.g., O$_2$ or dinitrogen monoxide) are supplied to react with the adsorbate.

Here, a 100-nm-thick silicon oxynitride film is formed using a PECVD apparatus as the insulating film 112.

Figure 8B:
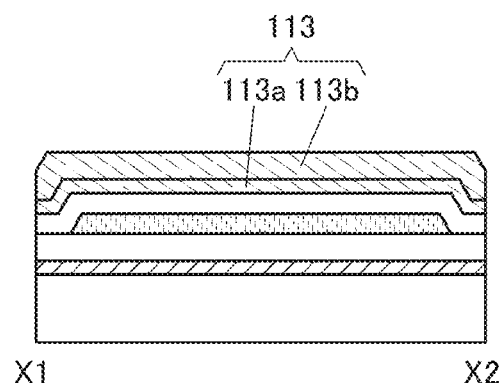

Next, a conductive film 113 (including a conductive film 113a and a conductive film 113b) is formed over the insulating film 112 (see FIG. 8B).

The conductive film 113 can be formed by a sputtering method, a vacuum evaporation method, a pulsed laser deposition (PLD) method, a thermal CVD method, or the like. In this embodiment, a 30-nm-thick tantalum nitride film is formed using a sputtering apparatus as the conductive film 113a. A 150-nm-thick tungsten film is formed using a sputtering apparatus as the conductive film 113b. Note that the successive formation of the conductive film 113a and the conductive film 113b in a vacuum is preferable because entry of impurities into an interface between the conductive film 106a and the conductive film 106b can be suppressed.

Alternatively, a tungsten film can be formed as the conductive film 113b with a deposition apparatus employing an ALD method. In that case, a WF$_6$ gas and a B$_2$H$_6$ gas are sequentially introduced more than once to form an initial tungsten film, and then a WF$_6$ gas and an H$_2$ gas are introduced at a time, so that a tungsten film is formed. Note that an SiH$_4$ gas may be used instead of a B$_2$H$_6$ gas.

Figure 8C:
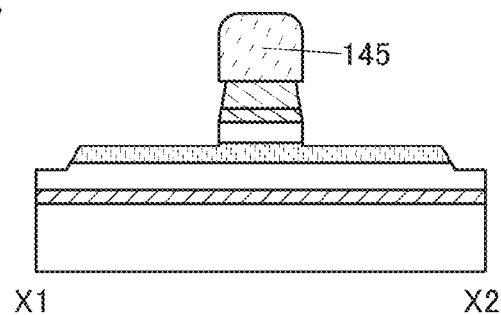

Next, a mask 145 is formed over the conductive film 113b by a lithography step, and then, the conductive film 113b, the conductive film 113a, and the insulating film 112 are partly etched (see FIG. 8C).

As a method for etching the conductive film 113 and the insulating film 112, a wet etching method or/and a dry etching method can be used as appropriate.

Note that the oxide semiconductor film 110 is at least partly exposed in a step of etching the conductive film 113 and the insulating film 112. Note that a region where part of the oxide semiconductor film 110 is exposed has a smaller thickness than the oxide semiconductor film 110 overlapping with the conductive film 114 by a step of etching the conductive film 114 and the insulating film 112, in some cases. Furthermore, a region of the insulating film 108b functioning as a base film which is exposed from the oxide semiconductor film 110 is partly removed in a step of etching the conductive film 113 and the insulating film 112, and thus, the thickness of the region is smaller than that of a region overlapping with the oxide semiconductor film 110 in some cases.

Figure 8D:
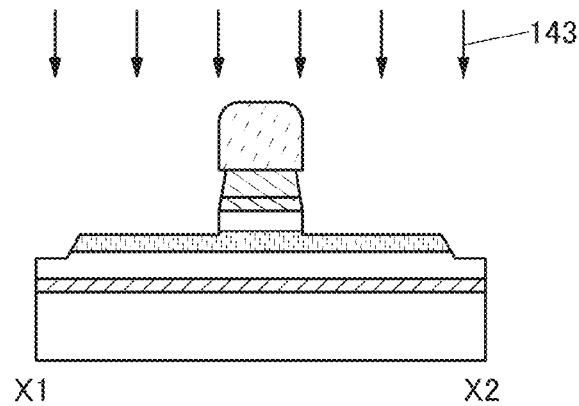

Next, an impurity element 143 is added over the insulating film 108b, the oxide semiconductor film 110, and the mask 145 (see FIG. 8D).

In a step of adding the impurity element 143, the impurity element is added to regions of the oxide semiconductor film 110 which are not covered with the conductive film 114 and the mask 145. Note that an oxygen vacancy is formed in the oxide semiconductor film 110 by the addition of the impurity element 143. Furthermore, in a step of adding the impurity element 143, the impurity element 143 is added to a region of the insulating film 108b that does not overlap with the conductive film 114 and the insulating film 112, through the oxide semiconductor film 110, so that a region containing a large amount of impurity elements is formed.

As a method for adding the impurity element 143, an ion doping method, an ion implantation method, plasma treatment, or the like can be given. In the case of plasma treatment, plasma is generated in a gas atmosphere containing an impurity element to be added and plasma treatment is performed, whereby the impurity element can be added. A dry etching apparatus, an ashing apparatus, a plasma CVD apparatus, a high-density plasma CVD apparatus, or the like can be used to generate the plasma.

Note that, as a source gas of the impurity element 143, one or more of $B_2H_6$, $PH_3$, $CH_4$, $N_2$, $NH_3$, $AlH_3$, $AlCl_3$, $SiH_4$, $Si_2H_6$, $F_2$, HF, $H_2$, and a rare gas can be used. Alternatively, one or more of $B_2H_6$, $PH_3$, $N_2$, $NH_3$, $AlH_3$, $AlCl_3$, $F_2$, HF, and $H_2$ which are diluted with a rare gas can be used. By adding the impurity element 143 to the oxide semiconductor film 110 using one or more of $B_2H_6$, $PH_3$, $N_2$, $NH_3$, $AlH_3$, $AlCl_3$, $F_2$, HF, and $H_2$ which are diluted with a rare gas, the rare gas and one or more of hydrogen, boron, carbon, nitrogen, fluorine, phosphorus, sulfur, and chlorine can be added at a time to the oxide semiconductor film 110 and the insulating film 108b.

Alternatively, after a rare gas is added to the oxide semiconductor film 110 and the insulating film 108b, one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ may be added to the oxide semiconductor film 110 and the insulating film 108b.

Alternatively, after one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ are added to the oxide semiconductor film 110 and the insulating film 108b, a rare gas may be added to the oxide semiconductor film 110 and the insulating film 108b.

The addition of the impurity element 143 is controlled by appropriately setting the implantation conditions such as the acceleration voltage and the dose. For example, in the case where argon is added by an ion implantation method, the acceleration voltage may be set to be higher than or equal to 10 kV and lower than or equal to 100 kV and the dose may be set to greater than or equal to $1 \times 10^{13}$ ions/cm² and less than or equal to $1 \times 10^{16}$ ions/cm², e.g., $1 \times 10^{14}$ ions/cm². In the case where a phosphorus ion is added by an ion implantation method, the acceleration voltage is set to 30 kV and the dose is set to greater than or equal to $1 \times 10^{13}$ ions/cm² and less than or equal to $5 \times 10^{16}$ ions/cm², e.g., $1 \times 10^{15}$ ions/cm².

In the case where argon is added as the impurity element 143 using a dry etching apparatus, the substrate may be set to a parallel plate on the cathode side and an RF power may be supplied so that a bias is applied to the substrate side. As the RF power, for example, power density can be greater than or equal to 0.1 W/cm² and less than or equal to 2 W/cm².

It is preferable that the impurity element 143 be added in a state where the mask 145 is left as in this embodiment. By the addition of the impurity element 143 in a state where the mask 145 is left, adhesion of a constituent element of the conductive film 114 to a sidewall of the insulating film 112 can be suppressed. However, a method for adding the impurity element 143 is not limited thereto; for example, the impurity element 143 may be added using the conductive film 114 as a mask after the mask 145 is removed.

After that, heat treatment may be performed to further increase the conductivity of the region of the oxide semiconductor film 110 to which the impurity element 143 is added. The heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C.

Next, the resist mask 145 is removed. Note that in the oxide semiconductor film 110, the channel region 110a overlapping with the conductive film 114 and the insulating film 112 and the pair of low-resistance regions 110b and 110c between which the channel region 110a is provided are formed by the addition of the impurity element 143 (see FIG. 9A). Furthermore, although not shown, the impurity element 143 is added to the insulating film 108b in contact with the low-resistance regions 110b and 110c through the low-resistance regions 110b and 110c.

Figure 9A:
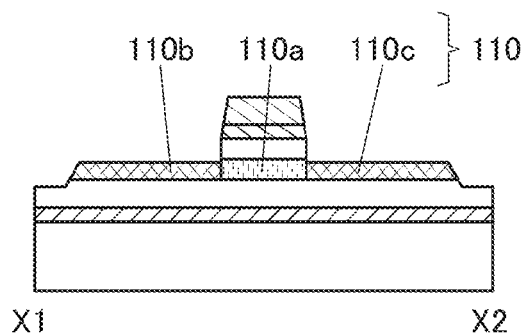
FIGS. 9A to 9D are cross-sectional views illustrating an example of the manufacturing process of a semiconductor device.
Figure 9B:
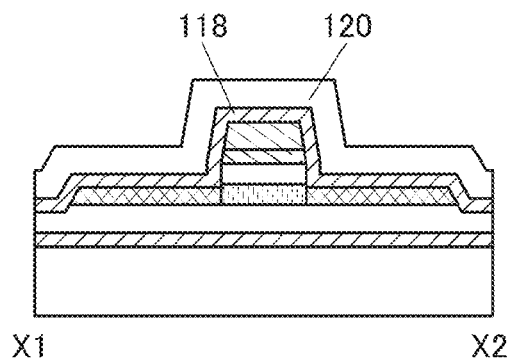

Next, the insulating film 118 is formed over the insulating film 108b, the oxide semiconductor film 110, and the conductive film 114, and the insulating film 120 is formed over the insulating film 118 (see FIG. 9B).

For formation of the insulating film 118 and the insulating film 120, the formation method of the insulating film 108a and the insulating film 108b can be referred to.

In this embodiment, a 100-nm-thick silicon nitride film is formed using a PECVD apparatus as the insulating film 118. Furthermore, a 300-nm-thick silicon oxynitride film is formed using a PECVD apparatus as the insulating film 120.

When the insulating film 118 is formed of a silicon nitride film, hydrogen in the silicon nitride film enters the oxide semiconductor film 110, so that the concentration of carriers in a region of the oxide semiconductor film 110 in contact with the insulating film 118, specifically, the low-resistance regions 110b and 110c, can be further increased.

Figure 9C:
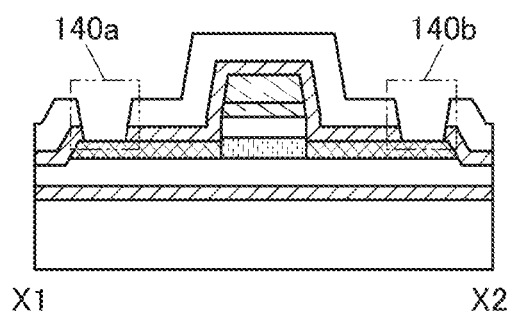

Next, a mask is formed over the insulating film 120 by a lithography step, and then, the insulating film 120 and the insulating film 118 are partly etched, whereby the opening portions 140a and 140b that reach the oxide semiconductor film 110 are formed (see FIG. 9C).

As a method for etching the insulating film 120 and the insulating film 118, a wet etching method or/and a dry etching method can be used as appropriate.

Figure 9D:
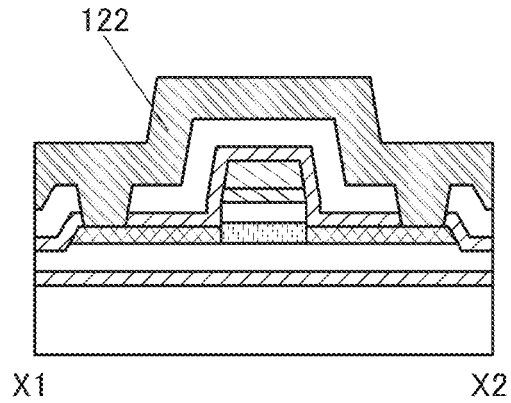

Then, a conductive film 122 is formed over the insulating film 120 to cover the opening portions 140a and 140b (see FIG. 9D).

The conductive film 122 can be formed by the formation method of the conductive film 113 as appropriate. Here, a 50-nm-thick tungsten film is formed using a sputtering apparatus as the conductive film 121a. Furthermore, a 200-nm-thick copper film is formed using a sputtering apparatus as the conductive film 121b.

Figure 10A:
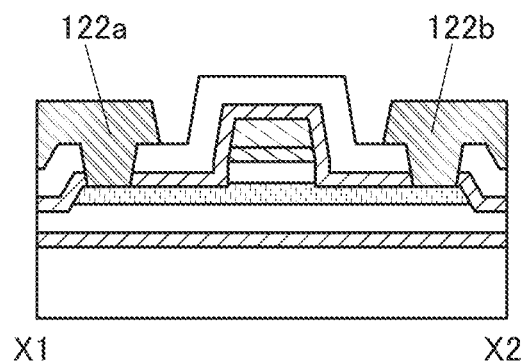
FIGS. 10A and 10B are cross-sectional views of an example of a manufacturing process of a semiconductor device.

Next, a mask is formed over the conductive film 122 by a lithography step, and then, the conductive film 122 is partly etched, whereby the conductive films 122a and 122b are formed (see FIG. 10A).

Figure 10B:
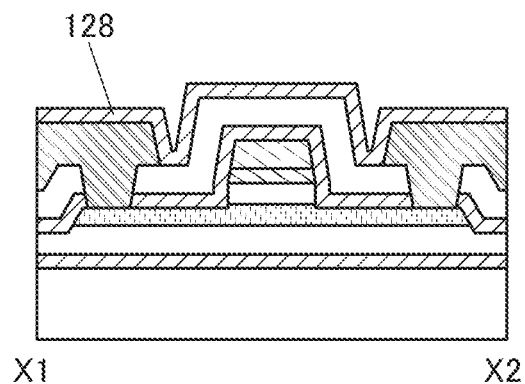

Next, the insulating film 128 is formed over the insulating film 120 and the conductive films 122a and 122b (see FIG. 10B).

For formation of the insulating film 128, the formation method of the insulating film 108a can be referred to. Here, a 200-nm-thick silicon nitride film is formed using a PECVD apparatus as the insulating film 128.

Through the above-described steps, the transistor 100 can be manufactured.

<Method 2 for Manufacturing Semiconductor Device>

Next, an example of a method for manufacturing the transistor 100A in FIGS. 5A to 5C is described below.

First, the insulating film 104 is formed over the substrate 102. Next, a conductive film is formed over the insulating film 104, and the conductive film is processed into a desired shape, whereby the conductive film 106 is formed. A 100-nm-thick silicon nitride film is formed using a PECVD apparatus as the insulating film 104. A 200-nm-thick tungsten film is formed using a sputtering apparatus as the conductive film 106. Next, steps similar to those illustrated in FIGS. 7A to 7D and FIG. 8A are performed. After that, a mask is formed over the insulating film 112 by a lithography step, and then, the insulating film 112 is partly etched, whereby the opening portion 139 that reaches the conductive film 106 is formed. Steps following this can be performed in manners similar to those of the steps illustrated in FIG. 8B and subsequent figures. Thus, the transistor 100A illustrated in FIGS. 5A to 5C can be manufactured.

The structure and method described in this embodiment can be implemented by being combined as appropriate with any of the other structures and methods described in the other embodiments.

Embodiment 2

In this embodiment, the structure of an oxide semiconductor included in a semiconductor device of one embodiment of the present invention is described below in detail.

First a structure of an oxide semiconductor film is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 11A:
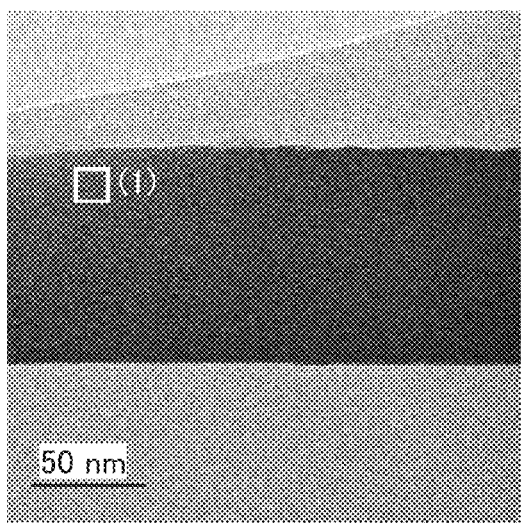
FIGS. 11A to 11D are Cs-corrected high-resolution TEM images of a cross section of a CAAC-OS and a cross-sectional schematic view of a CAAC-OS.

The CAAC-OS observed with a TEM is described below. FIG. 11A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 11B:
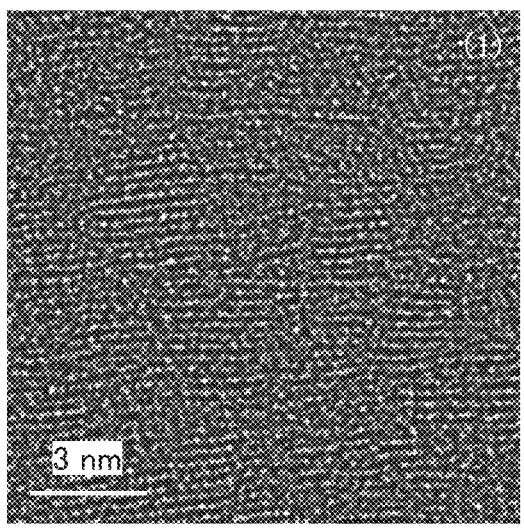

FIG. 11B is an enlarged Cs-corrected high-resolution TEM image of a region (1) in FIG. 11A. FIG. 11B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 11C:
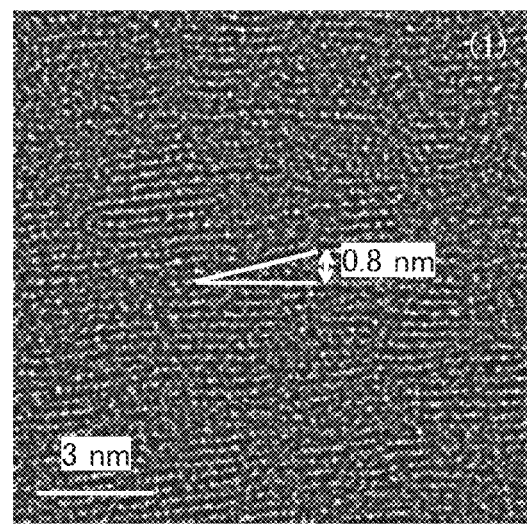

As shown in FIG. 11B, the CAAC-OS has a characteristic atomic arrangement. The characteristic atomic arrangement is denoted by an auxiliary line in FIG. 11C. FIGS. 11B and 11C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 11D:
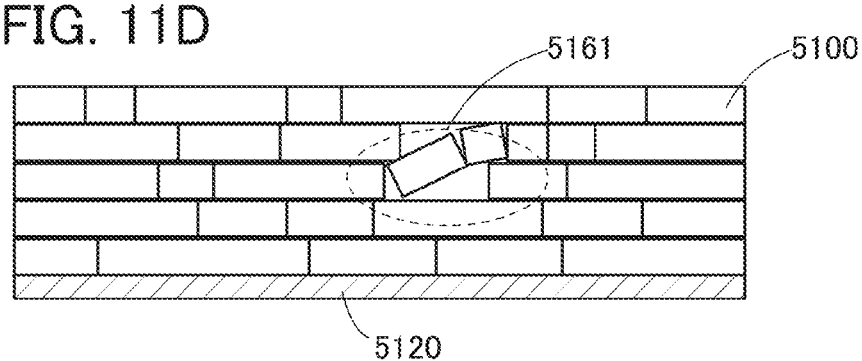

Here, according to the Cs-corrected high-resolution TEM images, the schematic arrangement of pellets 5100 of a CAAC-OS over a substrate 5120 is illustrated by such a structure in which bricks or blocks are stacked (see FIG. 11D). The part in which the pellets are tilted as observed in FIG. 11C corresponds to a region 5161 shown in FIG. 11D.

FIG. 12A shows a Cs-corrected high-resolution TEM image of a plane of the CAAC-OS observed from a direction substantially perpendicular to the sample surface. FIGS. 12B, 12C, and 12D are enlarged Cs-corrected high-resolution TEM images of regions (1), (2), and (3) in FIG. 12A, respectively. FIGS. 12B, 12C, and 12D indicate that metal atoms are arranged in a triangular, quadrangular, or hexagonal configuration in a pellet. However, there is no regularity of arrangement of metal atoms between different pellets.

Figure 13A:
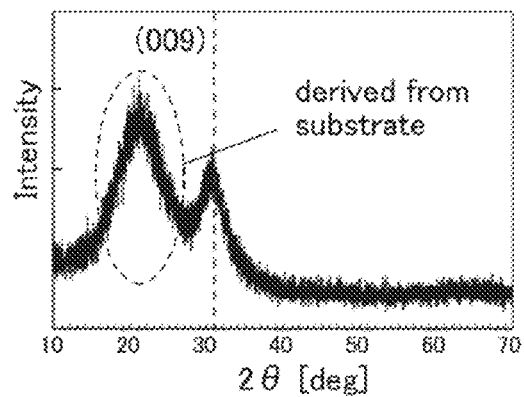
FIGS. 13A to 13C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 13A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 13B:
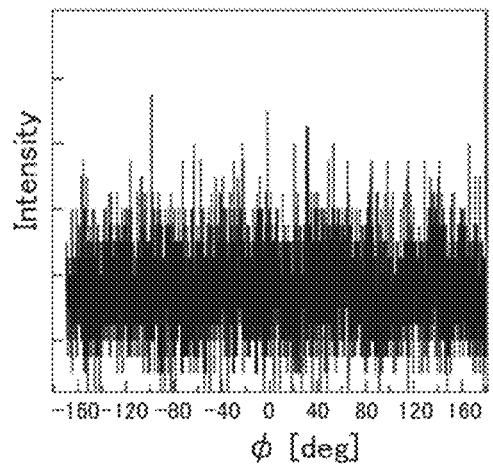
Figure 13C:
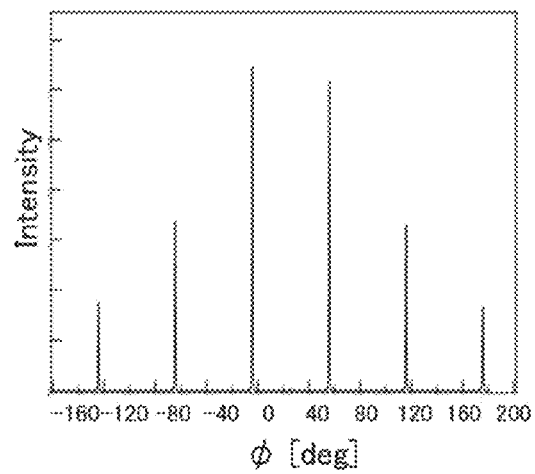

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 13B, a peak is not clearly observed. In contrast, in the case of a single crystal oxide semiconductor of $InGaZnO_4$, when φ scan is performed with 2θ fixed at around 56°, as shown in FIG. 13C, six peaks which are derived from crystal planes equivalent to the (110) plane are observed. Accordingly, the structural analysis using XRD shows that the directions of a-axes and b-axes are irregularly oriented in the CAAC-OS.

Figure 14A:
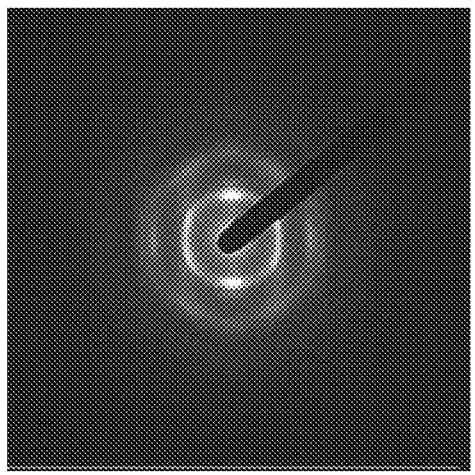
FIGS. 14A and 14B show electron diffraction patterns of a CAAC-OS.
Figure 14B:
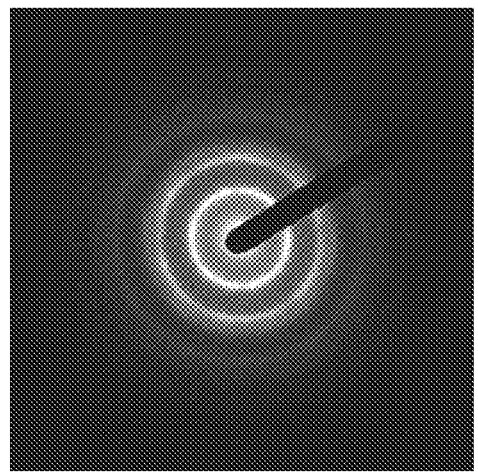

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 14A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 14B shows a diffraction pattern obtained in such a manner that an electron beam with a probe diameter of 300 nm is incident on the same sample in a direction perpendicular to the sample surface. As shown in FIG. 14B, a ring-like diffraction pattern is observed. Thus, the electron diffraction also indicates that the a-axes and b-axes of the pellets included in the CAAC-OS do not have regular alignment. The first ring in FIG. 14B is considered to be derived from the (010) plane, the (100) plane, and the like of the $InGaZnO_4$ crystal. The second ring in FIG. 14B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS film is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

Thus, the nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

In a high-resolution TEM image of the a-like OS film, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 39:
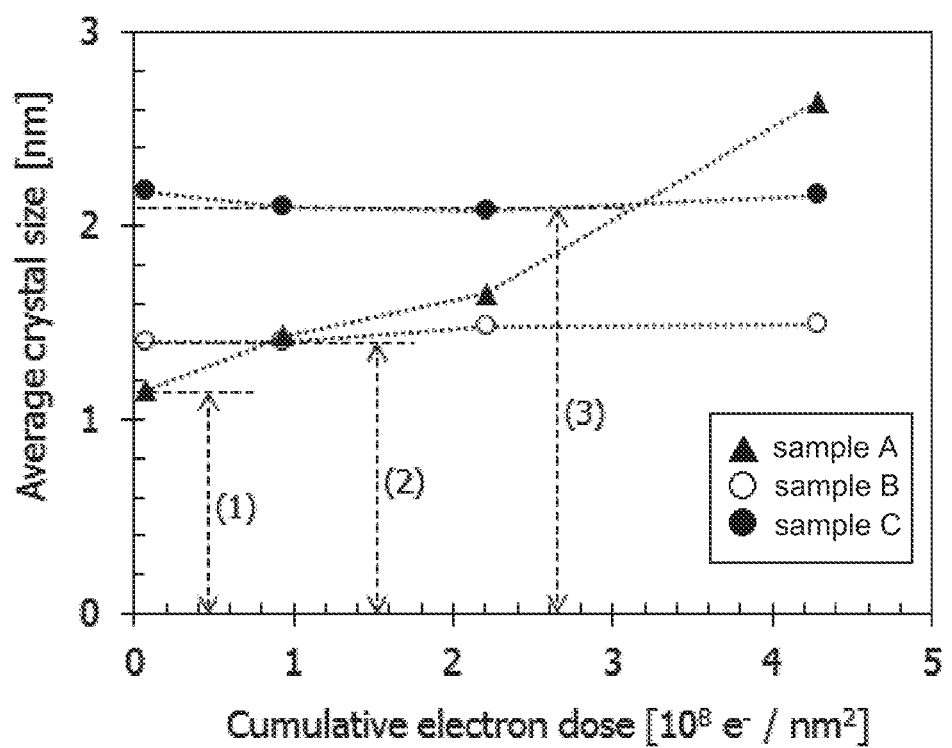
FIG. 39 shows a change in crystal part of an In—Ga—Zn oxide induced by electron irradiation.

FIG. 39 shows change in the average size of crystal parts (at 22 points to 45 points) in each sample. Note that the crystal part size corresponds to the length of a lattice fringe. FIG. 39 indicates that the crystal part size in the a-like OS increases with an increase in the cumulative electron dose. Specifically, as shown by (1) in FIG. 39, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 39, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

<Deposition Model>

Deposition models of a CAAC-OS and an nc-OS are described below.

Figure 15A:
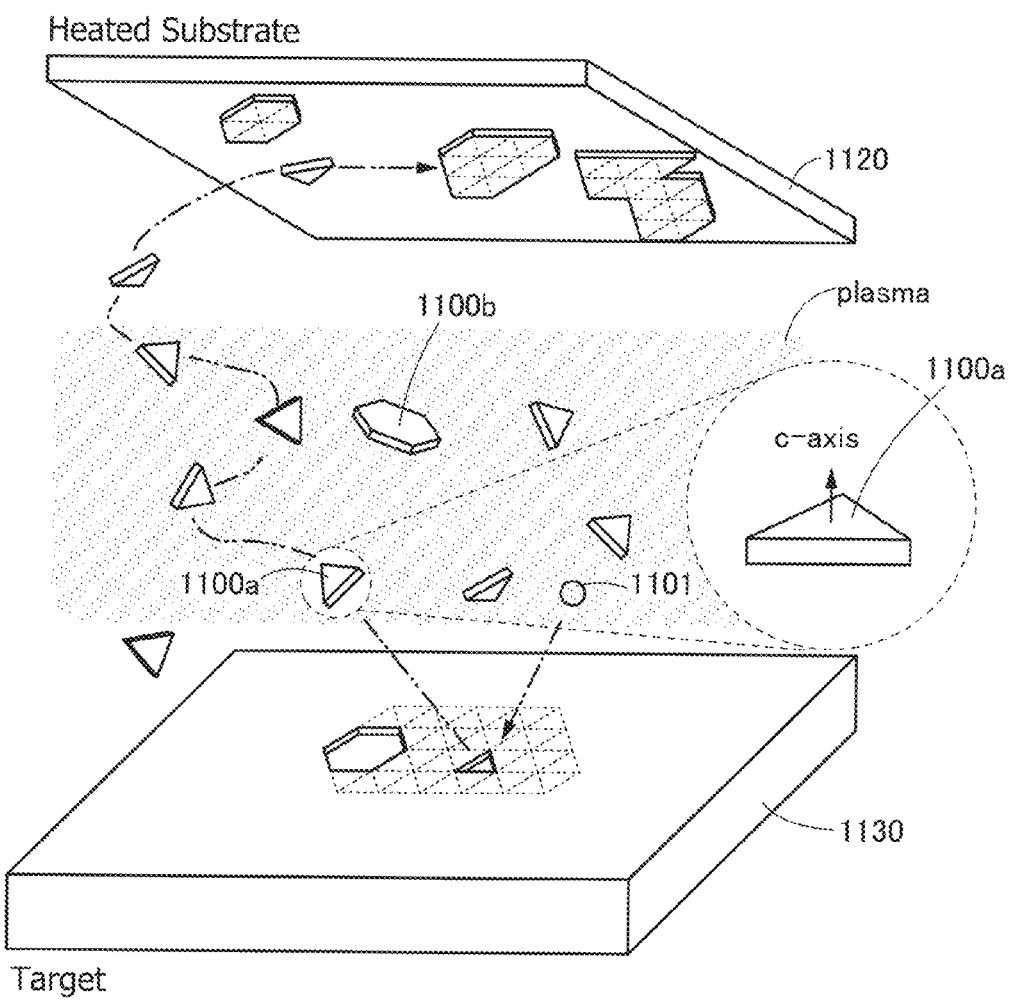
FIGS. 15A to 15C are a schematic diagram illustrating a deposition model of a CAAC-OS and a pellet, and cross-sectional views of a CAAC-OS.

FIG. 15A is a schematic view of the inside of a deposition chamber where a CAAC-OS is deposited by a sputtering method.

A target 1130 is attached to a backing plate. Under the target 1130 and the backing plate, a plurality of magnets are provided. The plurality of magnets cause a magnetic field over the target 1130. A sputtering method in which the disposition speed is increased by utilizing a magnetic field of magnets is referred to as a magnetron sputtering method.

The target 1130 has a polycrystalline structure in which a cleavage plane exists in at least one crystal grain. Note that the details of the cleavage plane are described later.

A substrate 1120 is placed to face the target 1130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol % or higher) and controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 1130, and plasma is observed. Note that the magnetic field over the target 1130 forms a high-density plasma region. In the high-density plasma region, the deposition gas is ionized, so that an ion 1101 is generated. Examples of the ion 1101 include an oxygen cation ($O^+$) and an argon cation ($Ar^+$).

The ion 1101 is accelerated to the target 1130 side by an electric field, and collides with the target 1130 eventually. At this time, a pellet 1100a and a pellet 1100b which are flat-plate-like or pellet-like sputtered particles are separated and sputtered from the cleavage plane. Note that structures of the pellet 1100a and the pellet 1100b may be distorted by an impact of collision of the ion 1101.

The pellet 1100a is a flat-plate-like (pellet-like) sputtered particle having a triangle plane, e.g., regular triangle plane. The pellet 1100b is a flat-plate-like (pellet-like) sputtered particle having a hexagon plane, e.g., regular hexagon plane. Note that flat-plate-like or pellet-like sputtered particles such as the pellet 1100a and the pellet 1100b are collectively called pellets 1100. The shape of a flat plane of the pellet 1100 is not limited to a triangle or a hexagon. For example, the flat plane may have a shape formed by combining greater than or equal to 2 and less than or equal to 6 triangles. For example, a square (rhombus) is formed by combining two triangles (regular triangles) in some cases.

The thickness of the pellet 1100 is determined depending on the kind of the deposition gas and the like. The thicknesses of the pellets 1100 are preferably uniform; the reasons thereof are described later. In addition, the sputtered particle preferably has a pellet shape with a small thickness as compared to a dice shape with a large thickness.

Figure 17:
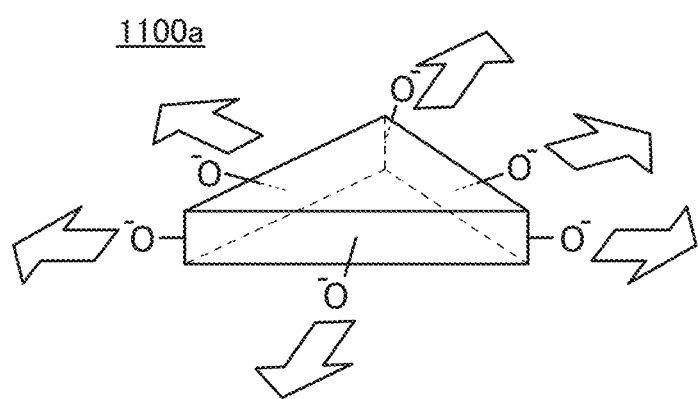
FIG. 17 illustrates a pellet.

The pellet 1100 receives charge when passing through the plasma, so that side surfaces of the pellet 1100 are negatively or positively charged in some cases. The pellet 1100 includes an oxygen atom on its side surface, and the oxygen atom may be negatively charged. For example, a case in which the pellet 1100a includes, on its side surfaces, oxygen atoms that are negatively charged is illustrated in FIG. 17. As in this view, when the side surfaces are charged in the same polarity, charges repel each other, and accordingly, the pellet 1100a can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, and a zinc atom is negatively charged.

Figure 18:
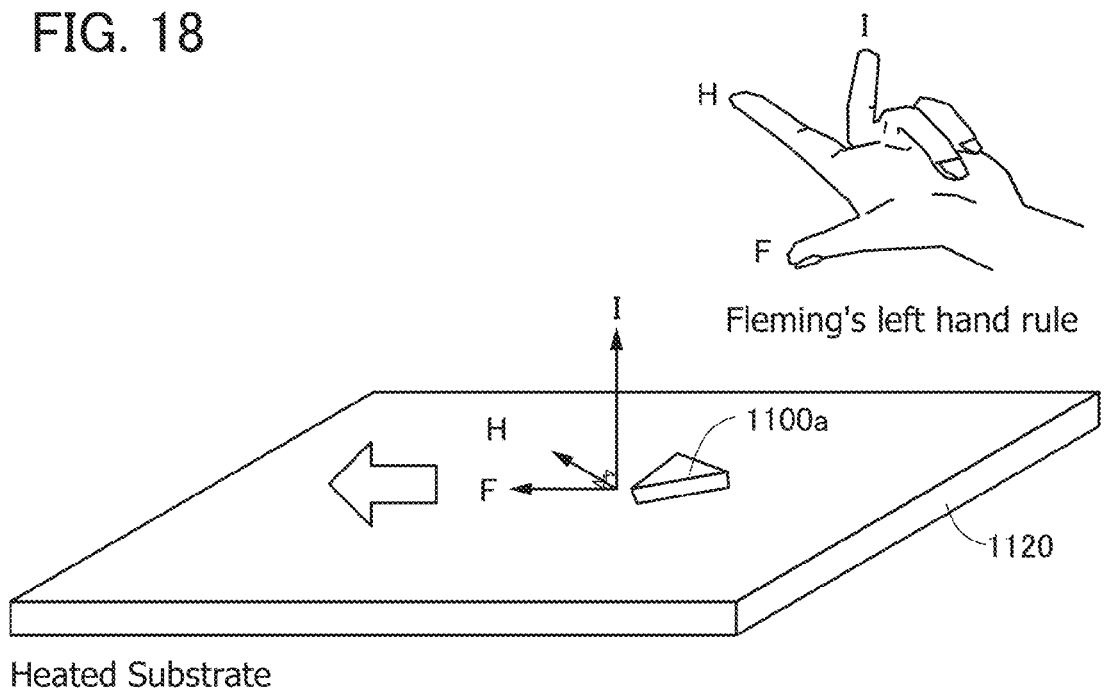
FIG. 18 illustrates a force applied to a pellet on a formation surface.

As shown in FIG. 15A, the pellet 1100 flies like a kite in plasma and flutters up to the substrate 1120. Since the pellets 1100 are charged, when the pellet 1100 gets close to a region where another pellet 1100 has already been deposited, repulsion is generated. Here, above the substrate 1120, a magnetic field is generated in a direction parallel to a top surface of the substrate 1120. A potential difference is given between the substrate 1120 and the target 1130, and accordingly, current flows from the substrate 1120 toward the target 1130. Thus, the pellet 1100 is given a force (Lorentz force) on the top surface of the substrate 1120 by an effect of the magnetic field and the current (see FIG. 18). This is explainable with Fleming's left-hand rule. In order to increase a force applied to the pellet 1100, it is preferable to provide, on the top surface, a region where the magnetic field in a direction parallel to the top surface of the substrate 1120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 1120 is 1.5 times or higher, preferably twice or higher, further preferably 3 times or higher, still further preferably 5 times or higher as high as the magnetic field in a direction perpendicular to the top surface of the substrate 1120.

Figure 19A:
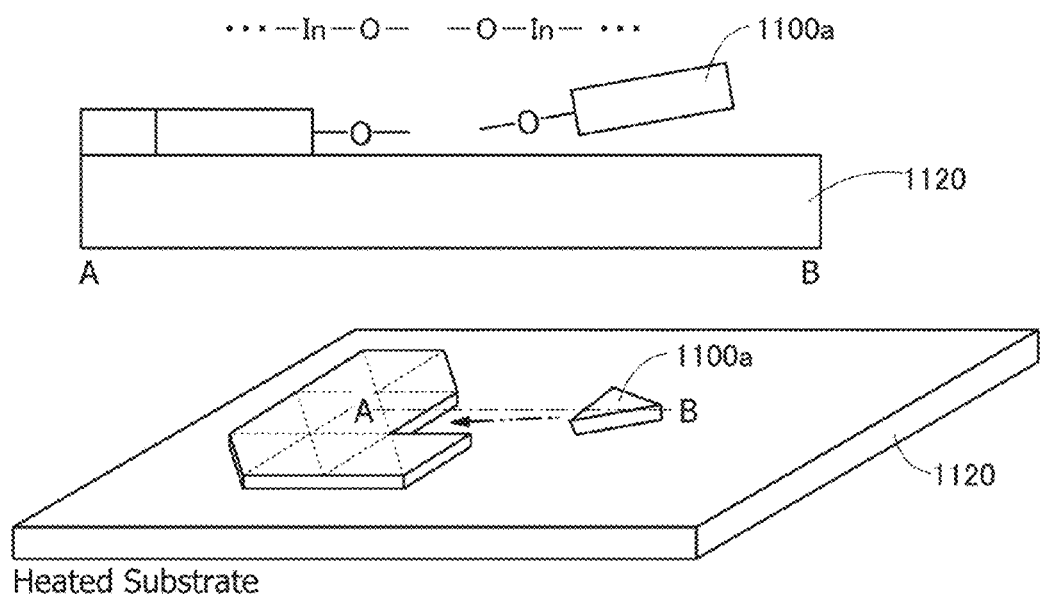
FIGS. 19A and 19B illustrate movement of a pellet on a formation surface.
Figure 19B:
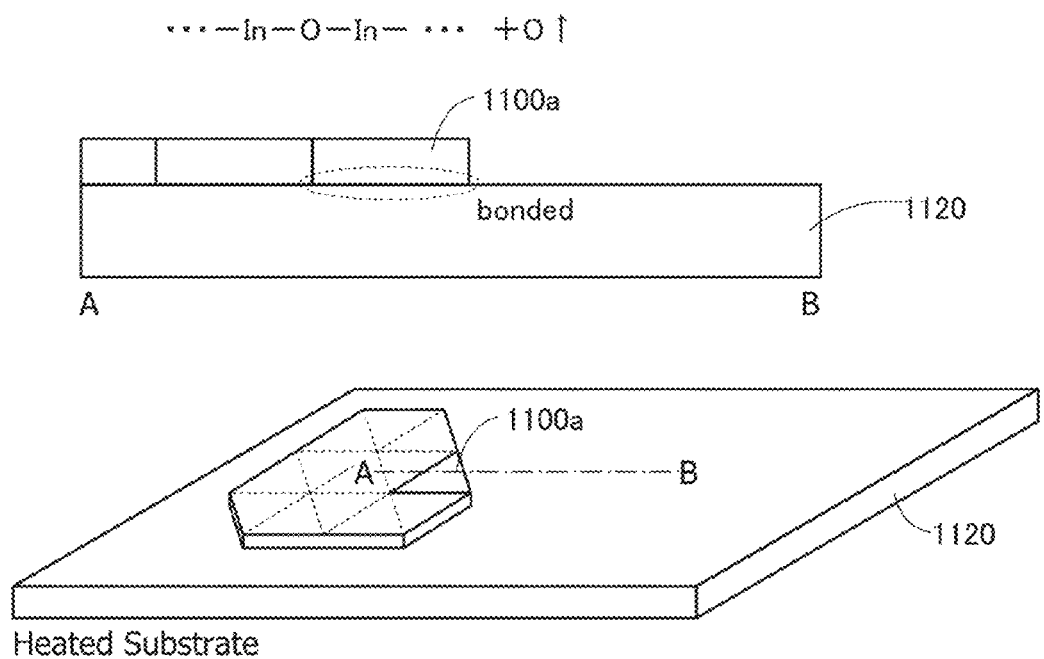

Furthermore, the substrate 1120 is heated, and resistance such as friction between the pellet 1100 and the substrate 1120 is low. As a result, as illustrated in FIG. 19A, the pellet 1100 glides above the surface of the substrate 1120. The glide of the pellet 1100 is caused in a state where the flat plane faces the substrate 1120. Then, as illustrated in FIG. 19B, when the pellet 1100 reaches the side surface of another pellet 1100 that has been already deposited, the side surfaces of the pellets 1100 are bonded. At this time, the oxygen atom on the side surface of the pellet 1100 is released. With the released oxygen atom, oxygen vacancies in a CAAC-OS is filled in some cases; thus, the CAAC-OS has a low density of defect states.

Further, the pellet 1100 is heated on the substrate 1120, whereby atoms are rearranged, and the structure distortion caused by the collision of the ion 1101 can be reduced. The pellet 1100 whose structure distortion is reduced is substantially single crystal. Even when the pellets 1100 are heated after being bonded, expansion and contraction of the pellet 1100 itself hardly occur, which is caused by turning the pellet 1100 into substantially single crystal. Thus, formation of defects such as a grain boundary due to expansion of a space between the pellets 1100 can be prevented, and accordingly, generation of crevasses can be prevented. Further, the space is filled with elastic metal atoms and the like, whereby the elastic metal atoms have a function, like a highway, of jointing side surfaces of the pellets 1100 which are not aligned with each other.

It is considered that as shown in such a model, the pellets 1100 are deposited over the substrate 1120. Thus, a CAAC-OS film can be deposited even when a surface over which a film is formed (film formation surface) does not have a crystal structure, which is different from film deposition by epitaxial growth. For example, even when a surface (film formation surface) of the substrate 1120 has an amorphous structure, a CAAC-OS film can be formed.

Figure 15B:
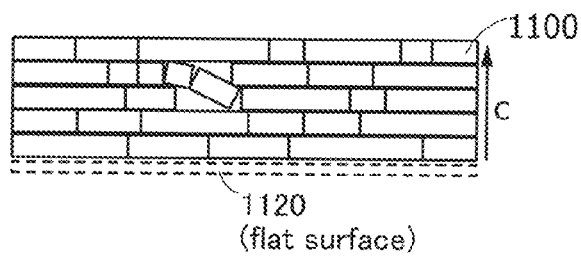

Further, it is found that in formation of the CAAC-OS, the pellets 1100 are arranged in accordance with a surface shape of the substrate 1120 that is the film formation surface even when the film formation surface has unevenness besides a flat surface. For example, in the case where the surface of the substrate 1120 is flat at the atomic level, the pellets 1100 are arranged so that flat planes parallel to the a-b plane face downwards; thus, a layer with a uniform thickness, flatness, and high crystallinity is formed. By stacking n layers (n is a natural number), the CAAC-OS can be obtained (see FIG. 15B).

Figure 15C:
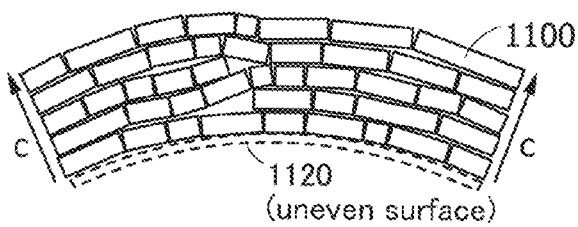

In the case where the top surface of the substrate 1120 has unevenness, a CAAC-OS where n layers (n is a natural number) in each of which the pellets 1100 are arranged along a convex surface are stacked is formed. Since the substrate 1120 has unevenness, a gap is easily generated between in the pellets 1100 in the CAAC-OS in some cases. Note that owing to intermolecular force, the pellets 1100 are arranged so that a gap between the pellets is as small as possible even on the unevenness surface. Therefore, even when the formation surface has unevenness, a CAAC-OS with high crystallinity can be formed (see FIG. 15C).

As a result, laser crystallization is not needed for formation of a CAAC-OS, and a uniform film can be formed even over a large-sized glass substrate.

Since the CAAC-OS film is deposited in accordance with such a model, the sputtered particle preferably has a pellet shape with a small thickness. Note that in the case where the sputtered particle has a dice shape with a large thickness, planes facing the substrate 1120 are not uniform and thus, the thickness and the orientation of the crystals cannot be uniform in some cases.

According to the deposition model described above, a CAAC-OS with high crystallinity can be formed even on a film formation surface with an amorphous structure.

Further, formation of a CAAC-OS can be described with a deposition model including a zinc oxide particle besides the pellet 1100.

The zinc oxide particle reaches the substrate 1120 before the pellet 1100 does because the zinc oxide particle is smaller than the pellet 1100 in mass. On the surface of the substrate 1120, crystal growth of the zinc oxide particle preferentially occurs in the horizontal direction, so that a thin zinc oxide layer is formed. The zinc oxide layer has c-axis alignment. Note that c-axes of crystals in the zinc oxide layer are aligned in the direction parallel to a normal vector of the substrate 1120. The zinc oxide layer serves as a seed layer that makes a CAAC-OS grow and thus has a function of increasing crystallinity of the CAAC-OS. The thickness of the zinc oxide layer is greater than or equal to 0.1 nm and less than or equal to 5 nm, mostly greater than or equal to 1 nm and less than or equal to 3 nm. Since the zinc oxide layer is sufficiently thin, a grain boundary is hardly observed.

Thus, in order to deposit a CAAC-OS with high crystallinity, a target containing zinc at a proportion higher than that of the stoichiometric composition is preferably used.

Figure 16:
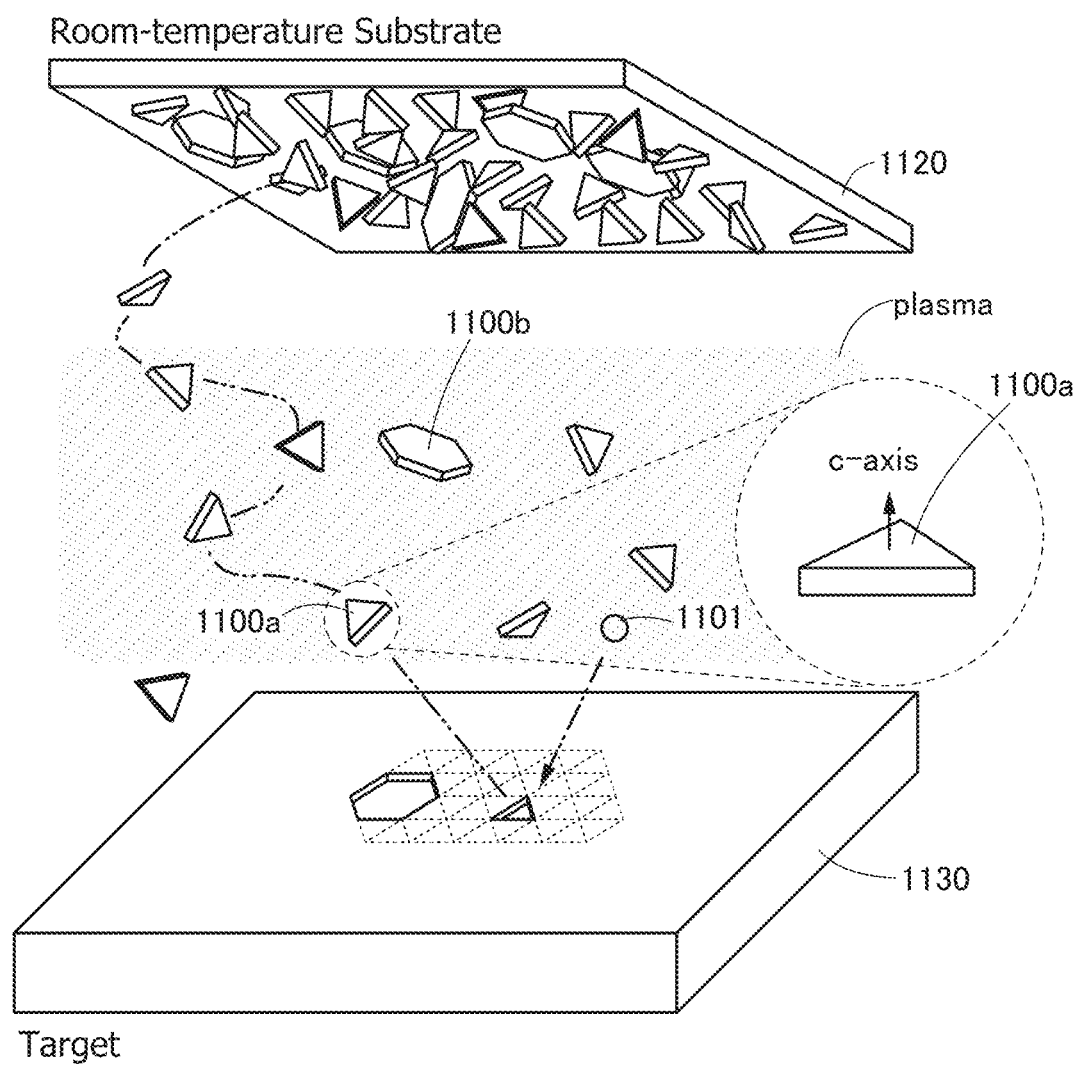
FIG. 16 illustrates a deposition model of an nc-OS schematically and a pellet.

An nc-OS can be understood with a deposition model illustrated in FIG. 16. Note that a difference between FIG. 16 and FIG. 15A lies only in the fact that whether the substrate 1120 is heated or not.

Thus, the substrate 1120 is not heated, and a resistance such as friction between the pellet 1100 and the substrate 1120 is high. As a result, the pellets 1100 cannot glide on the surface of the substrate 1120 and are stacked randomly, thereby forming an nc-OS.

<Cleavage Plane>

A cleavage plane that has been mentioned in the deposition model of the CAAC-OS will be described below.

Figure 20A:
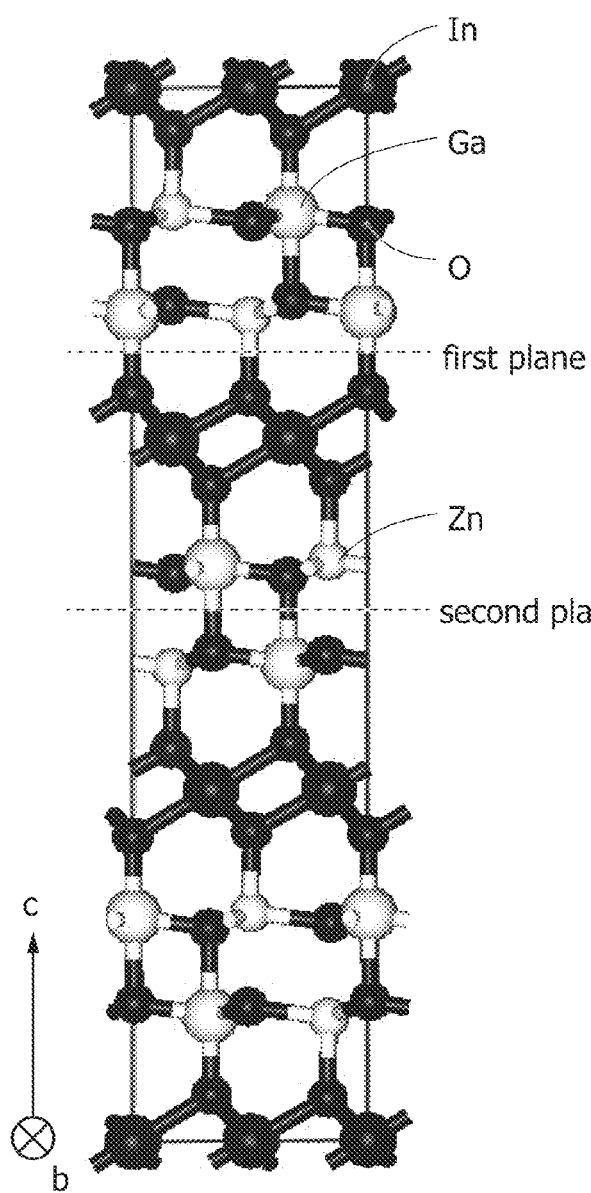
FIGS. 20A and 20B show an InGaZnO$_4$ crystal.
Figure 20B:
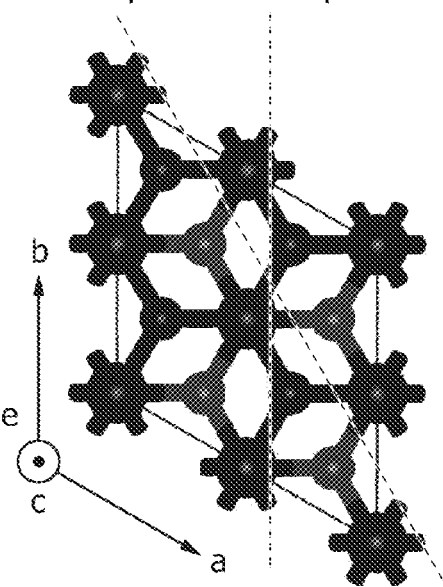

First, a cleavage plane of the target is described using FIGS. 20A and 20B. FIGS. 20A and 20B show a structure of an InGaZnO$_4$ crystal. Note that FIG. 20A shows the structure of the case where an InGaZnO$_4$ crystal is observed from a direction parallel to the b-axis when the c-axis is in an upward direction. Furthermore, FIG. 20B shows a structure of the case where the InGaZnO$_4$ crystal is observed from a direction parallel to the c-axis.

Energy needed for cleavage at each of crystal planes of the InGaZnO$_4$ crystal is calculated by the first principles calculation. Note that a "pseudopotential" and density functional theory program (CASTEP) using the plane wave basis are used for the calculation. Note that an ultrasoft type pseudopotential is used as the pseudopotential. Further, GGA/PBE is used as the functional. Cut-off energy is 400 eV.

Energy of a structure in an initial state is obtained after structural optimization including a cell size is performed. Further, energy of a structure after the cleavage at each plane is obtained after structural optimization of atomic arrangement is performed in a state where the cell size is fixed.

On the basis of the structure of the InGaZnO$_4$ crystal in FIGS. 20A and 20B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 20A). The second plane is a crystal plane between a Ga—Zn—O layer and a Ga—Zn—O layer and is parallel to the (001) plane (or the a-b plane) (see FIG. 20A). The third plane is a crystal plane parallel to the (110) plane (see FIG. 20B). The fourth plane is a crystal plane parallel to the (100) plane (or the b-c plane) (see FIG. 20B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure is calculated based on atoms and electrons included in the structure. That is, kinetic energy of the electrons and interactions between the atoms, between the atom and the electron, and between the electrons are considered in the calculation.

As calculation results, the cleavage energy of the first plane was 2.60 J/m$^2$, that of the second plane was 0.68 J/m$^2$, that of the third plane was 2.18 J/m$^2$, and that of the fourth plane was 2.12 J/m$^2$ (see Table 1).

TABLE 1

| | Cleavage energy [J/m$^2$] |
| --- | --- |
| First plane | 2.60 |
| Second plane | 0.68 |
| Third plane | 2.18 |
| Fourth plane | 2.12 |

From the calculations, in the structure of the InGaZnO$_4$ crystal in FIGS. 20A and 20B, the cleavage energy of the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between a Ga—Zn—O layer and a Ga—Zn—O layer, the InGaZnO$_4$ crystals shown in FIG. 20A can be separated at two planes equivalent to the second plane. Therefore, in the case where an ion or the like is made to collide with a target, a wafer-like unit (we call this a pellet) which is cleaved at a plane with the lowest cleavage energy is thought to be blasted off as the minimum unit. In that cases, a pellet of InGaZnO$_4$ is composed of three layers of a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and crystal plane parallel to the (001) plane (or the a-b plane)), which suggests that most of the flat planes of the pellets have triangle shapes or hexagonal shapes.

Figure 21A:
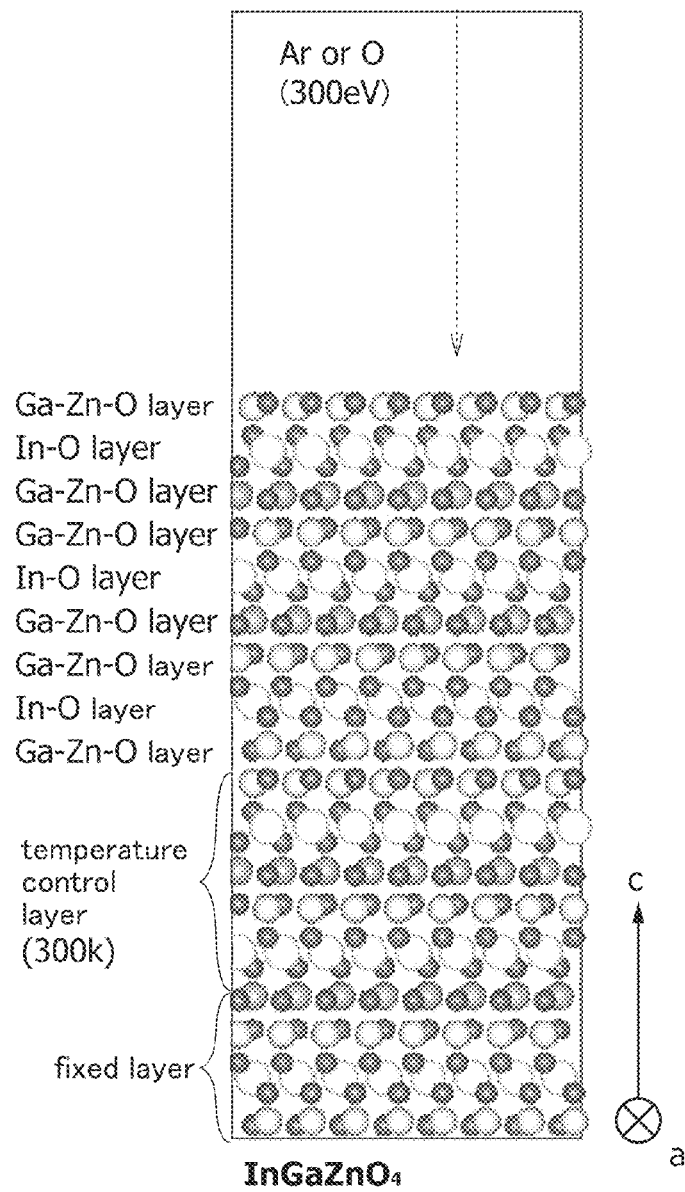
Figure 21B:
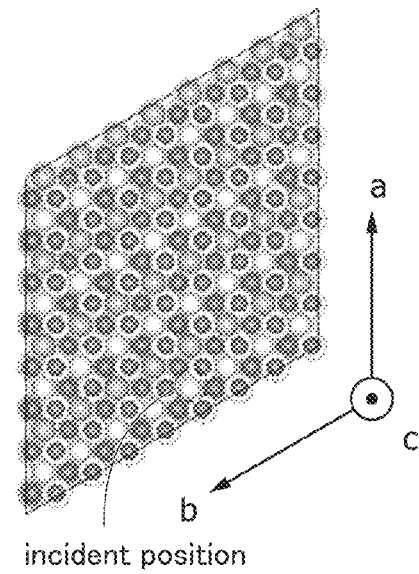

Next, through classical molecular dynamics calculation, on the assumption of an InGaZnO$_4$ crystal having a homologous structure as a target, a cleavage plane is examined in the case where the target is sputtered using argon (Ar) or oxygen (O). FIG. 21A shows a cross-sectional structure of an InGaZnO$_4$ crystal (2688 atoms) used for the calculation, and FIG. 21B shows a top structure thereof. Note that a fixed layer in FIG. 21A is a layer which prevents the positions of the atoms from moving. A temperature control layer in FIG. 21A is a layer whose temperature is constantly set to a fixed temperature (300 K).

For the classical molecular dynamics calculation, Materials Explorer 5.0 manufactured by Fujitsu Limited. is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the a-b plane of the InGaZnO$_4$ crystal under the conditions.

FIG. 22A shows an atomic arrangement when 99.9 picoseconds have passed after argon enters the cell including the InGaZnO$_4$ crystal shown in FIGS. 21A and 21B. FIG. 22B shows an atomic arrangement when 99.9 picoseconds have passed after oxygen enters the cell. Note that in FIGS. 22A and 22B, part of the fixed layer in FIG. 21A is omitted.

According to FIG. 22A, in a period from entry of argon into the cell to when 99.9 picoseconds have passed, a crack is formed from the cleavage plane corresponding to the second plane shown in FIG. 20A. Thus, in the case where argon collides with the InGaZnO$_4$ crystal and the uppermost surface is the second plane (the zero-th), a large crack is found to be formed in the second plane (the second).

On the other hand, according to FIG. 22B, in a period from entry of oxygen into the cell to when 99.9 picoseconds have passed, a crack is found to be formed from the cleavage plane corresponding to the second plane in FIG. 20A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen.

Here, difference in size of the pellet depending on atoms which are made to collide is studied.

Figure 23A:
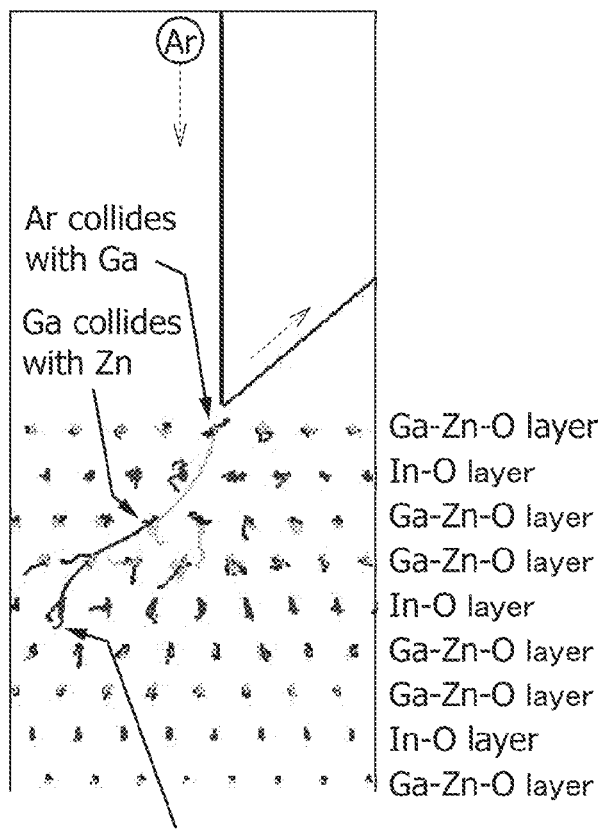
FIGS. 23A and 23B show trajectories of atoms after collision of atoms.

FIG. 23A shows trajectories of the atoms from 0 picosecond to 0.3 picoseconds after argon enters the cell including the InGaZnO$_4$ crystal shown in FIGS. 21A and 21B. Accordingly, FIG. 23A corresponds to a period from FIGS. 21A and 21B to FIG. 22A.

According to FIG. 23A, when argon collides with gallium (Ga) of the first layer (Ga—Zn—O layer), the gallium collides with zinc (Zn) of the third layer (Ga—Zn—O layer) and then, the zinc reaches the vicinity of the sixth layer (Ga—Zn—O layer). Note that the argon which collides with the gallium is sputtered to the outside. Accordingly, in the case where argon collides with the target including the InGaZnO$_4$ crystal, a crack is thought to be formed in the second plane (the second) in FIG. 21A.

Figure 23B:
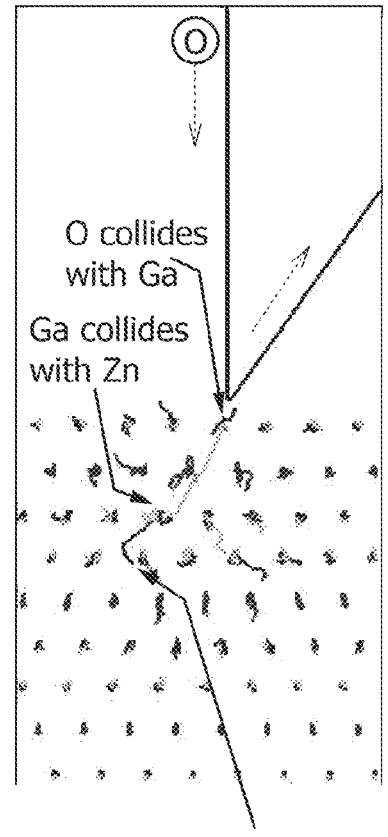

FIG. 23B shows trajectories of the atoms from 0 picosecond to 0.3 picoseconds after oxygen enters the cell including the InGaZnO$_4$ crystal shown in FIGS. 21A and 21B. Accordingly, FIG. 23B corresponds to a period from FIGS. 21A and 21B to FIG. 22A.

On the other hand, according to FIG. 23B, when oxygen collides with gallium (Ga) of the first layer (Ga—Zn—O layer), the gallium collides with zinc (Zn) of the third layer (Ga—Zn—O layer) and then, the zinc does not reach the fifth layer (In—O layer). Note that the oxygen which collides with the gallium is sputtered to the outside. Accordingly, in the case where oxygen collides with the target including the InGaZnO$_4$ crystal, a crack is thought to be formed in the second plane (the first) in FIG. 21A.

This calculation also shows that the InGaZnO$_4$ crystal with which an atom (ion) collides is separated from the cleavage plane.

In addition, a difference in depth of a crack is examined in view of conservation laws. The energy conservation law and the law of conservation of momentum can be represented by the following formula (1) and the following formula (2). Here, E represents energy of argon or oxygen before collision (300 eV), $m_A$ represents mass of argon or oxygen, $v_A$ represents the speed of argon or oxygen before collision, $v'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

[Formula 1]

$$E = \frac{1}{2}m_A v_A^2 + \frac{1}{2}m_{Ga} v_{Ga}^2 \quad (1)$$

[Formula 2]

$$m_A v_A + m_{Ga} v_{Ga} = m_A v'_A + m_{Ga} v'_{Ga} \quad (2)$$

On the assumption that collision of argon or oxygen is elastic collision, the relationship among $v_A$, $v'_A$, $v_{Ga}$, and $v'_{Ga}$ can be represented by the following formula (3).

[Formula 3]

$$v'_A - v'_{Ga} = -(v_A - v_{Ga}) \quad (3)$$

From the formulae (1), (2), and (3), on the assumption that $v_{Ga}$ is 0, the speed of gallium $v'_{Ga}$ after collision of argon or oxygen can be represented by the following formula (4).

[Formula 4]

$$v'_{Ga} = \frac{\sqrt{m_A}}{m_A + m_{Ga}} \cdot 2\sqrt{2E} \quad (4)$$

In the formula (4), mass of argon or oxygen is substituted into $m_A$, whereby the speeds of gallium after collision of the atoms are compared. In the case where the argon and the oxygen have the same energy before collision, the speed of gallium in the case where argon collides with the gallium was found to be 1.24 times as high as that in the case where oxygen collides with the gallium. Thus, the energy of the gallium in the case where argon collides with the gallium is higher than that in the case where oxygen collides with the gallium by the square of the speed.

The speed (energy) of gallium after collision in the case where argon collides with the gallium is found to be higher than that in the case where oxygen collides with the gallium. Accordingly, it is considered that a crack is formed at a deeper position in the case where argon collides with the gallium than in the case where oxygen collides with the gallium.

The above calculation shows that when sputtering is performed using a target including the InGaZnO$_4$ crystal having a homologous structure, separation occurs from the cleavage plane to form a pellet. On the other hand, even when sputtering is performed on a region having another structure of a target without the cleavage plane, a pellet is not formed, and a sputtered particle with an atomic-level size which is minuter than a pellet is formed. Because the sputtered particle is smaller than the pellet, the sputtered particle is thought to be removed through a vacuum pump connected to a sputtering apparatus. Therefore, a model in which particles with a variety of sizes and shapes fly to a substrate and are deposited hardly applies to the case where sputtering is performed using a target including the InGaZnO$_4$ crystal having a homologous structure. The model illustrated in FIG. 15A where sputtered pellets are deposited to form a CAAC-OS is a reasonable model.

The CAAC-OS deposited in such a manner has a density substantially equal to that of a single crystal OS. For example, the density of the single crystal OS film having a homologous structure of InGaZnO$_4$ is 6.36 g/cm$^3$, and the density of the CAAC-OS film having substantially the same atomic ratio is approximately 6.3 g/cm$^3$.

Figure 24A:
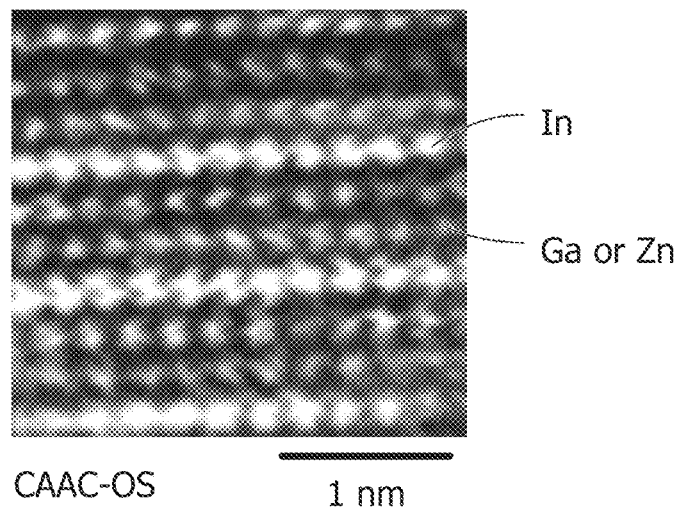
FIGS. 24A and 24B are cross-sectional HAADF-STEM images of a CAAC-OS film and a target.
Figure 24B:
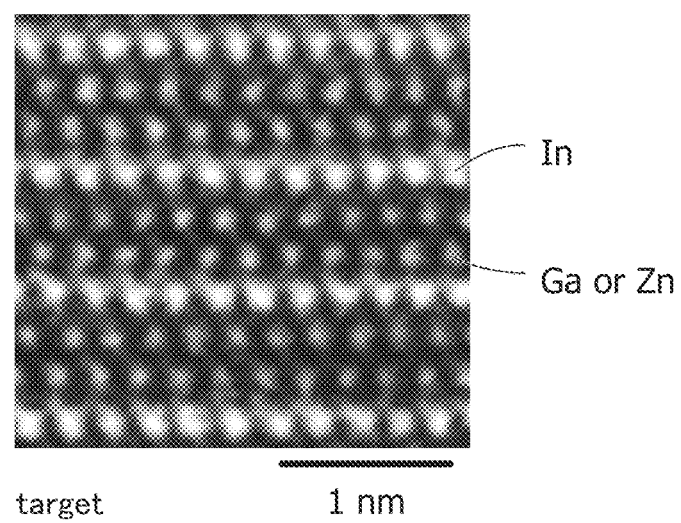

FIGS. 24A and 24B show atomic arrangements of cross sections of an In—Ga—Zn oxide (see FIG. 24A) that is a CAAC-OS deposited by a sputtering method and a target thereof (see FIG. 24B). For observation of atomic arrangement, a high-angle annular dark field scanning transmission electron microscopy (HAADF-STEM) is used. In the case of observation by HAADF-STEM, the intensity of an image of each atom is proportional to the square of its atomic number. Therefore, Zn (atomic number: 30) and Ga (atomic number: 31), whose atomic numbers are close to each other, are hardly distinguished from each other. A Hitachi scanning transmission electron microscope HD-2700 is used for the HAADF-STEM.

When FIG. 24A and FIG. 24B are compared, it is found that the CAAC-OS and the target each have a homologous structure and arrangements of atoms in the CAAC-OS correspond to those in the target. Thus, as illustrated in the deposition model in FIG. 15A, the crystal structure of the target is transferred, whereby a CAAC-OS is formed.

The structure and method described in this embodiment can be implemented by being combined as appropriate with any of the other structures and methods described in the other embodiments.

Embodiment 3

In this embodiment, an oxygen vacancy of an oxide semiconductor film is described in detail below.
<(1) Ease of Formation and Stability of V$_o$H>
In the case where an oxide semiconductor film (hereinafter referred to as IGZO) is a complete crystal, H preferentially diffuses along the a-b plane at a room temperature. In heat treatment at 450° C., H diffuses along the a-b plane and in the c-axis direction. Here, description is made on whether H easily enters an oxygen vacancy V$_o$ if the oxygen vacancy V$_o$ exists in IGZO. A state in which H is in an oxygen vacancy V$_o$ is referred to as V$_o$H.

Figure 26:
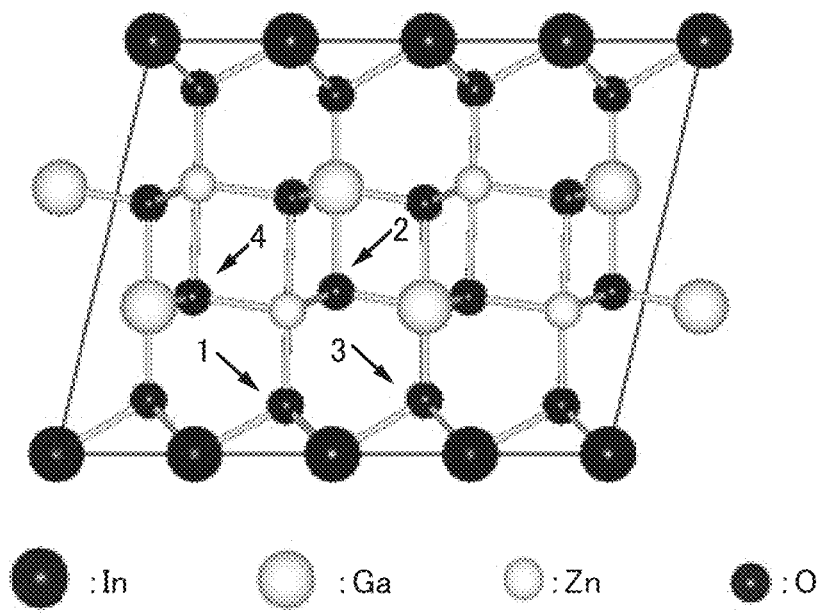
FIG. 26 shows a calculation model.

An InGaZnO$_4$ crystal model shown in FIG. 26 was used for calculation. The activation barrier (E$_a$) along the reaction path where H in V$_o$H is released from V$_o$ and bonded to oxygen was calculated by a nudged elastic band (NEB) method. The calculation conditions are shown in Table 2.

TABLE 2

| Software | VASP |
| Calculation method | NEB method |
| Functional | GGA-PBE |
| Pseudopotential | PAW |
| Cut-off energy | 500 eV |
| K points | 2 × 2 × 3 |

In the InGaZnO$_4$ crystal model, there are oxygen sites 1 to 4 as shown in FIG. 26 which differ from each other in metal elements bonded to oxygen and the number of bonded metal elements. Here, calculation was made on the oxygen sites 1 and 2 in which an oxygen vacancy V$_o$ is easily formed.

First, calculation was made on the oxygen site in which an oxygen vacancy V$_o$ is easily formed: an oxygen site 1 that was bonded to three In atoms and one Zn atom.

Figure 27A:
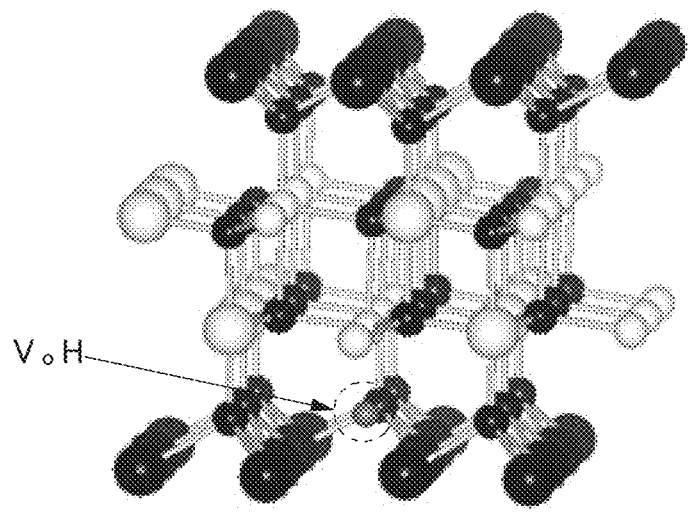
FIGS. 27A and 27B show an initial state and a final state, respectively.
Figure 27B:
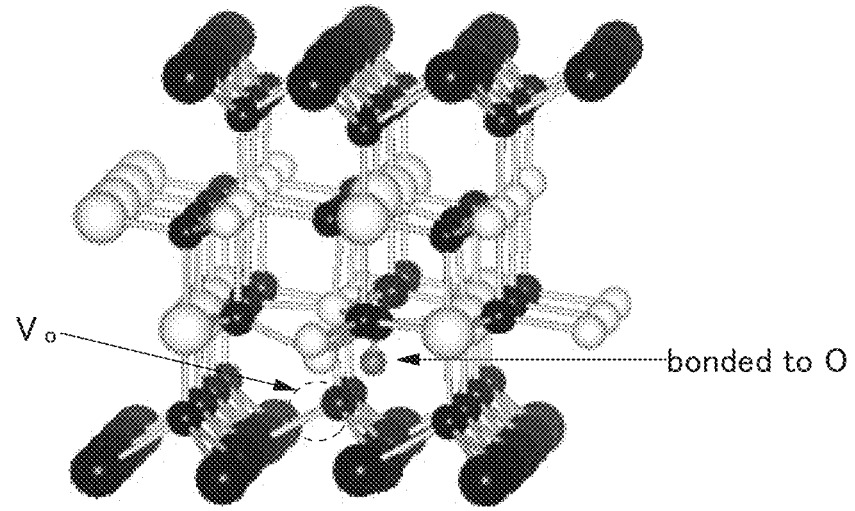
Figure 28:
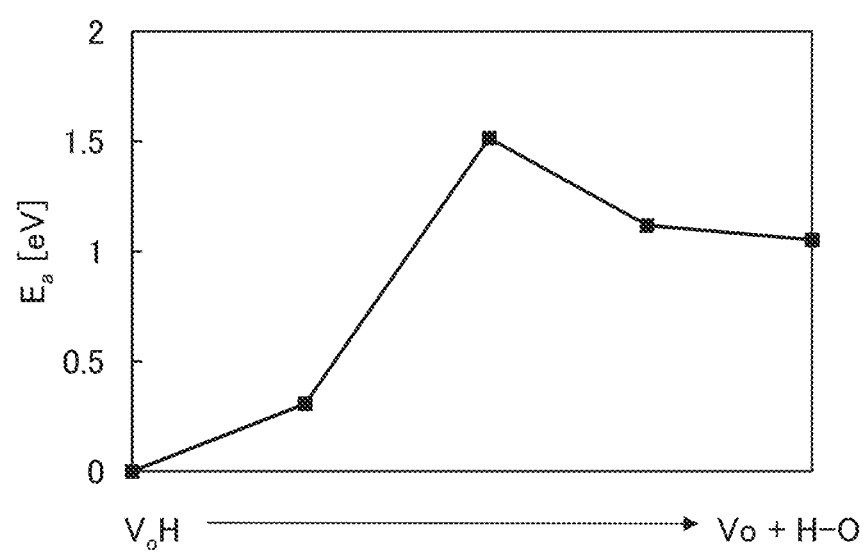
FIG. 28 shows an activation barrier.

FIG. 27A shows a model in the initial state and FIG. 27B shows a model in the final state. FIG. 28 shows the calculated activation barrier (E$_a$) in the initial state and the final state. Note that here, the initial state refers to a state in which H exists in an oxygen vacancy V$_o$ (V$_o$H), and the final state refers to a structure including an oxygen vacancy V$_o$ and a state in which H is bonded to oxygen bonded to one Ga atom and two Zn atoms (H—O).

From the calculation results, bonding of H in an oxygen vacancy V$_o$ to another oxygen atom needs an energy of approximately 1.52 eV, while entry of H bonded to O into an oxygen vacancy V$_o$ needs an energy of approximately 0.46 eV.

Reaction frequency (F) was calculated with use of the activation barriers (E$_a$) obtained by the calculation and the following Formula 5. In Formula 5, k$_B$ represents the Boltzmann constant; T, the absolute temperature; and v, the frequency factor.

[Formula 5]

$$\Gamma = v\exp\left(-\frac{E_a}{k_B T}\right)$$

The reaction frequency at 350° C. was calculated on the assumption that the frequency factor v=10$^{13}$ [1/sec]. The frequency of H transfer from the model shown in FIG. 27A to the model shown in FIG. 27B was 5.52×10$^0$ [1/sec], whereas the frequency of H transfer from the model shown in FIG. 27B to the model shown in FIG. 27A was 1.82×10$^9$ [1/sec]. This suggests that H diffusing in IGZO is likely to form V$_o$H if an oxygen vacancy V$_o$ exists in the neighborhood, and H is unlikely to be released from the oxygen vacancy V$_o$ once V$_o$H is formed.

Next, calculation was made on the oxygen site in which an oxygen vacancy V$_o$ is easily formed: an oxygen site 2 that was bonded to one Ga atom and two Zn atoms.

Figure 30:
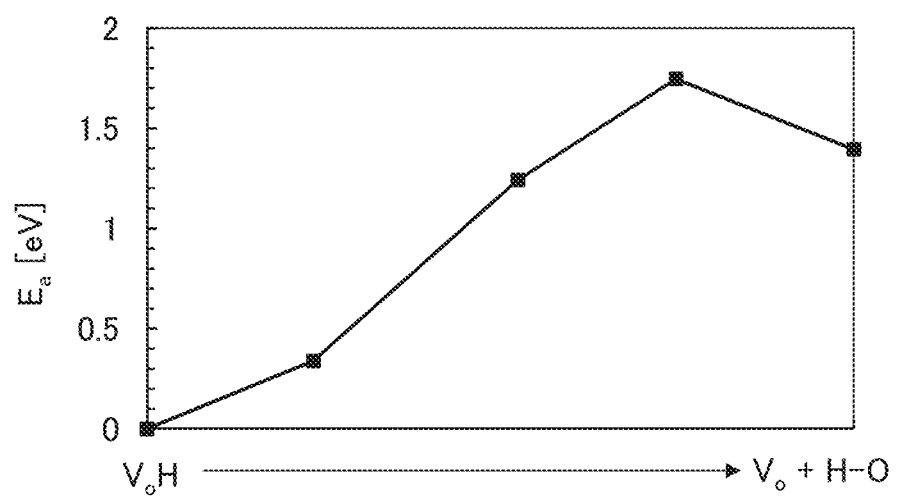
FIG. 30 shows an activation barrier.

FIG. 29A shows a model in the initial state and FIG. 29B shows a model in the final state. FIG. 30 shows the calculated activation barrier ($E_a$) in the initial state and the final state. Note that here, the initial state refers to a state in which H exists in an oxygen vacancy $V_o$ ($V_o$H), and the final state refers to a structure including an oxygen vacancy $V_o$ and a state in which H is bonded to oxygen bonded to one Ga atom and two Zn atoms (H—O).

From the calculation results, bonding of H in an oxygen vacancy $V_o$ to another oxygen atom needs an energy of approximately 1.75 eV, while entry of H bonded to O in an oxygen vacancy $V_o$ needs an energy of approximately 0.35 eV.

Reaction frequency (Γ) was calculated with use of the activation barriers ($E_a$) obtained by the calculation and Formula 5.

The reaction frequency at 350° C. was calculated on the assumption that the frequency factor $v=10^{13}$ [1/sec]. The frequency of H transfer from the model shown in FIG. 29A to the model shown in FIG. 29B was $7.53 \times 10^{-2}$ [1/sec], whereas the frequency of H transfer from the model shown in FIG. 29B to the model shown in FIG. 29A was $1.44 \times 10^{10}$ [1/sec]. This suggests that H is unlikely to be released from the oxygen vacancy $V_o$ once $V_o$H is formed.

From the above results, it was found that H in IGZO easily diffused in annealing and if an oxygen vacancy $V_o$ existed, H was likely to enter the oxygen vacancy $V_o$ to be $V_o$H.

<(2) Transition Level of $V_o$H>

The calculation by the NEB method, which was described in <(1) Ease of formation and stability of $V_o$H>, indicates that in the case where an oxygen vacancy $V_o$ and H exist in IGZO, the oxygen vacancy $V_o$ and H easily form $V_o$H and $V_o$H is stable. To determine whether $V_o$H is related to a carrier trap, the transition level of $V_o$H was calculated.

The model used for calculation is the InGaZnO$_4$ crystal model (112 atoms). $V_o$H models of the oxygen sites 1 and 2 shown in FIG. 26 were made to calculate the transition levels. The calculation conditions are shown in Table 3.

TABLE 3

| Software | VASP |
|---|---|
| Model | InGaZnO$_4$ crystal model (112 atoms) |
| Functional | HSE06 |
| Mixture ratio of exchange terms | 0.25 |
| Pseudopotential | GGA-PBE |
| Cut-off energy | 800 eV |
| K points | 1 × 1 × 1 |

The fraction of the exact exchange was adjusted to have a band gap close to the experimental value. As a result, the band gap of the InGaZnO$_4$ crystal model without defects was 3.08 eV that is close to the experimental value, 3.15 eV.

The transition level ($\epsilon(q/q')$) of a model having defect D can be calculated by the following Formula 6. Note that $\Delta E(D^q)$ represents the formation energy of defect D at charge q, which is calculated by Formula 7.

[Formula 6]

$$\varepsilon(q/q') = \frac{\Delta E(D^q) - \Delta E(D^{q'})}{q' - q}$$

[Formula 7]

$$\Delta E(D^q) = E_{tot}(D^q) - E_{tot}(\text{bulk}) + \sum_i \Delta n_i \mu_i + q(\varepsilon_{VBM} + \Delta V_q + E_F)$$

In Formulae 6 and 7, $E_{tot}(D^q)$ represents the total energy of the model having defect D at the charge q, $E_{tot}$(bulk) represents the total energy in a model without defects (complete crystal), $\Delta n_i$ represents a change in the number of atoms i contributing to defects, $\mu_i$ represents the chemical potential of atom i, $\epsilon_{VBM}$ represents the energy of the valence band maximum in the model without defects, $\Delta V_q$ represents the correction term relating to the electrostatic potential, and $E_F$ represents the Fermi energy.

Figure 31:
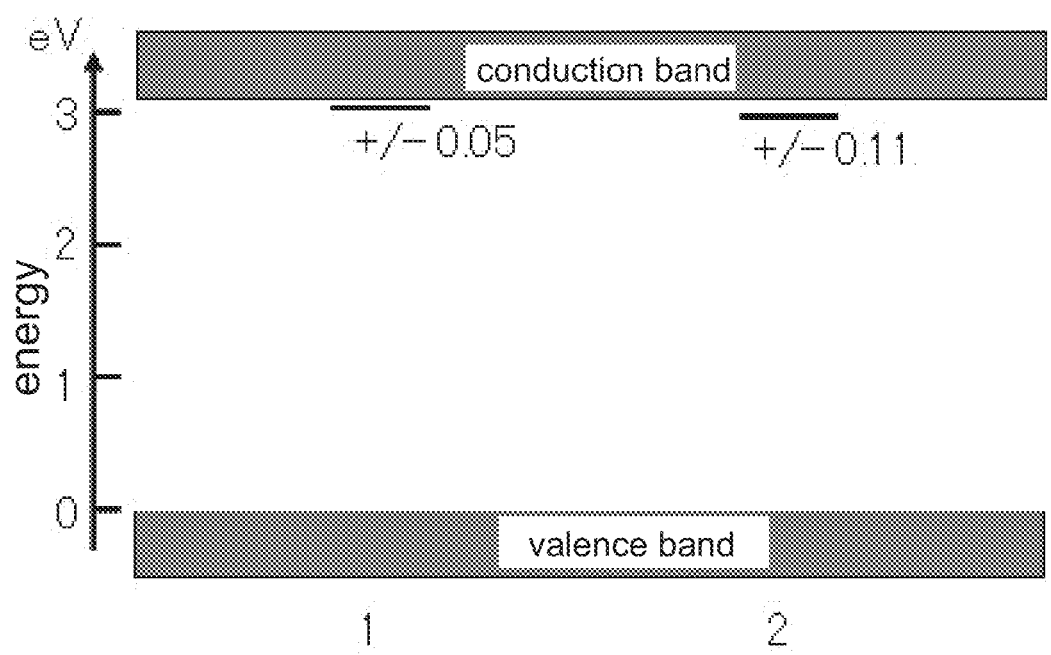
FIG. 31 shows the transition levels of V$_o$H.

FIG. 31 shows the transition levels of $V_o$H obtained from the above formulae. The numbers in FIG. 31 represent the depth from the conduction band minimum. In FIG. 31, the transition level of $V_o$H in the oxygen site 1 is at 0.05 eV from the conduction band minimum, and the transition level of $V_o$H in the oxygen site 2 is at 0.11 eV from the conduction band minimum. Therefore, these $V_o$H would be related to electron traps, that is, $V_o$H was found to behave as a donor. It was also found that IGZO including $V_o$H had conductivity.

The structure described in this embodiment can be used in appropriate combination with the structure described in any of the other embodiments.

Embodiment 4

In this embodiment, an example of a display device that includes any of the transistors described in the above embodiments is described below with reference to FIG. 32, FIG. 33, and FIG. 34.

Figure 32:
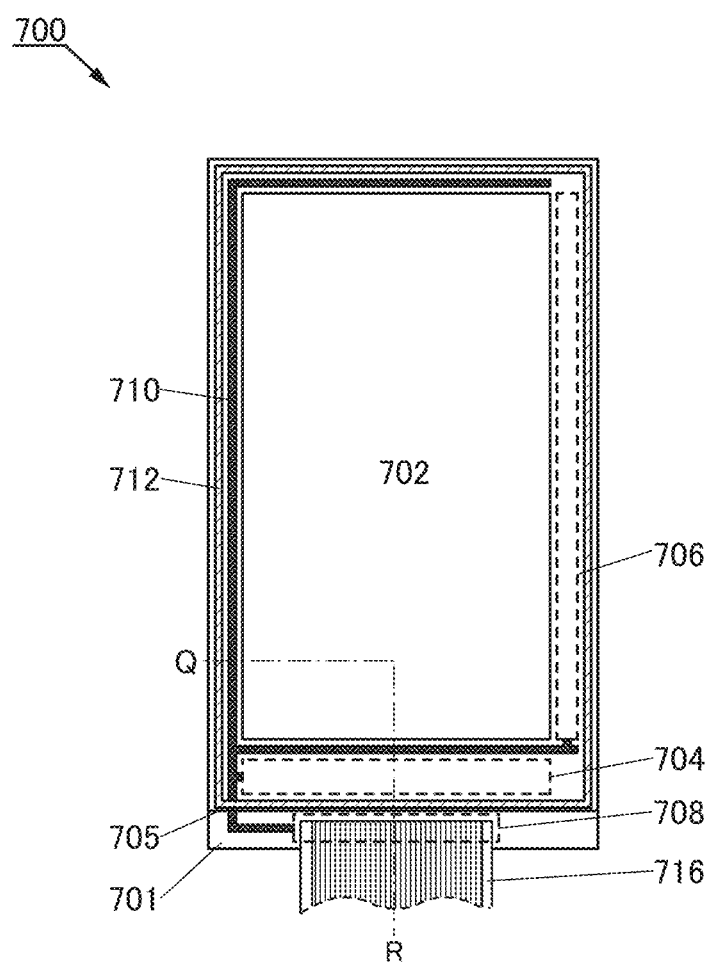
FIG. 32 is a top view illustrating one embodiment of a display device.

FIG. 32 is a top view of an example of a display device. A display device 700 illustrated in FIG. 32 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 32, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. Various signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used. In the pixel portion 702, any of the transistors and capacitors that are the semiconductor devices of embodiments of the present invention can be used.

The display device 700 can include any of a variety of elements. Examples of the element include a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included. Note that examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Further, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

As a coloring method, any of the following methods may be used: the above-described color filter method in which part of white light emission is converted into red light, green light, and blue light through a color filter; a three-color method in which light emission of red, green, and blue is used; and a color conversion method or a quantum dot method in which part of blue emission is converted into red light or green light.

In this embodiment, a structure including a liquid crystal element and an EL element as display elements is described with reference to FIG. 33 and FIG. 34. Note that FIG. 33 is a cross-sectional view along the dashed-dotted line Q-R shown in FIG. 32 and shows a structure including a liquid crystal element as a display element, whereas FIG. 34 is a cross-sectional view along the dashed-dotted line Q-R shown in FIG. 32 and shows a structure including an EL element as a display element.

Figure 33:
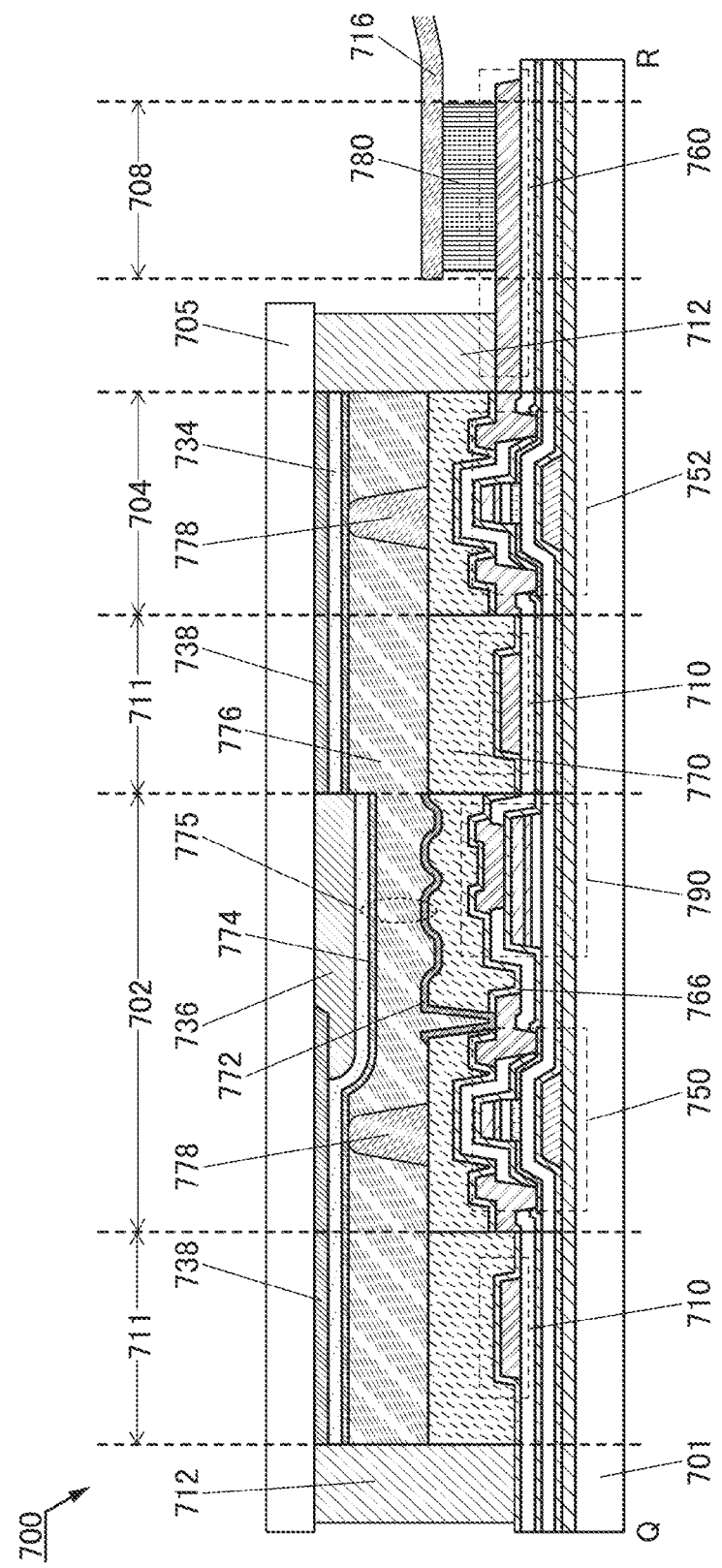
FIG. 33 is a cross-sectional view illustrating one embodiment of a display device.
Figure 34:
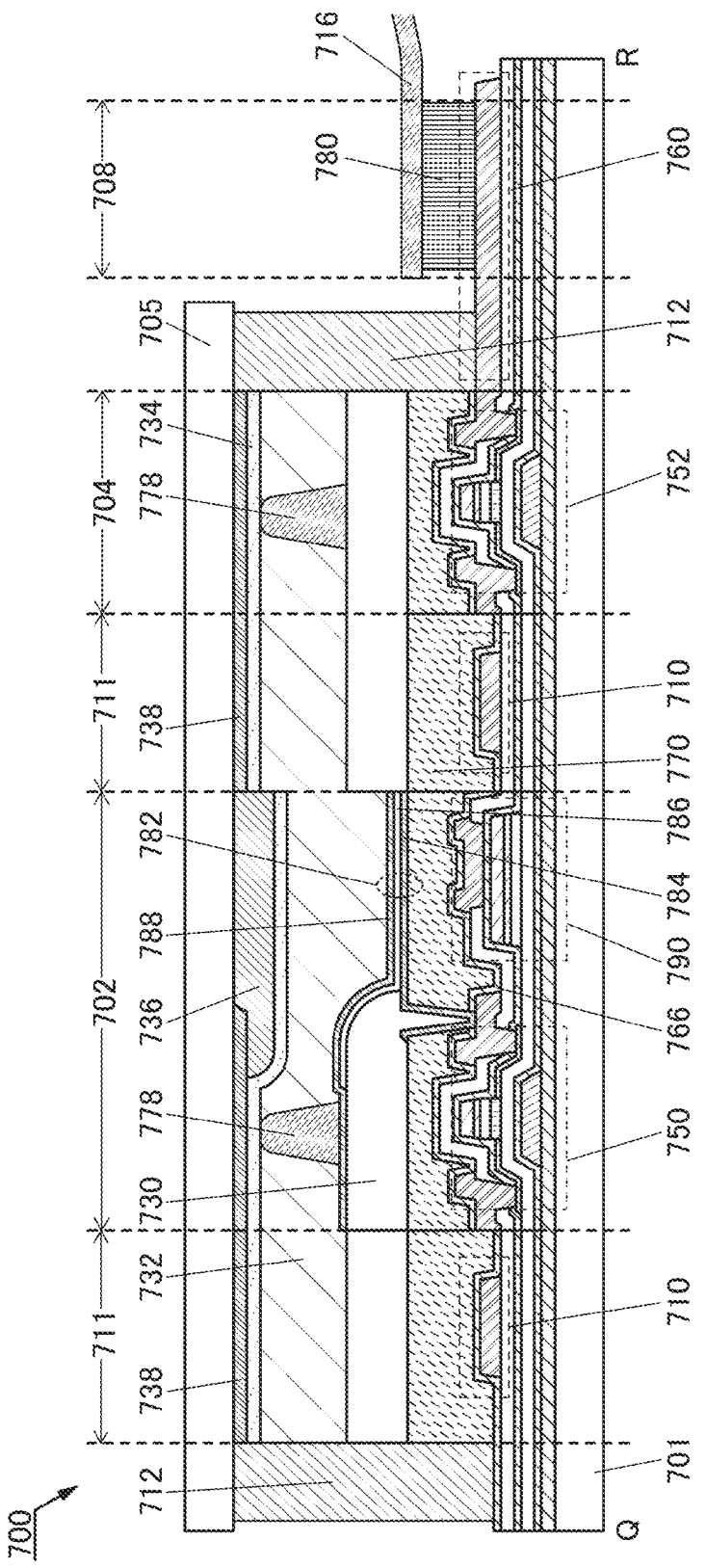
FIG. 34 is a cross-sectional view illustrating one embodiment of a display device.

Common portions between FIG. 33 and FIG. 34 are described first, and then different portions are described.
<Common Portions in Display Devices>

The display device 700 illustrated in FIG. 33 and FIG. 34 includes a lead wiring portion 711, the pixel portion 702, the source driver circuit portion 704, and the FPC terminal portion 708. Note that the lead wiring portion 711 includes a signal line 710. The pixel portion 702 includes a transistor 750 and a capacitor 790. The source driver circuit portion 704 includes a transistor 752.

The transistor 750 and the transistor 752 each have a structure similar to that of the transistor 100A described above. Note that the transistor 750 and the transistor 752 may each have a structure of the other transistors described in any of the above embodiments.

The transistors used in this embodiment each include an oxide semiconductor film which is highly purified and in which formation of oxygen vacancies is suppressed. In the transistor, the current in an off state (off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

The capacitor 790 includes a lower electrode and an upper electrode. The lower electrode is formed through a step of processing the same conductive film as the second gate electrode included in the transistor 750. The upper electrode is formed through a step of processing the same conductive film as the source electrode and the drain electrode included in the transistor 750. Furthermore, an insulating film is provided between the lower electrode and the upper electrode. The insulating film is formed through a step of forming the same insulating film as the second insulating film included in the transistor 750. That is, the capacitor 790 has a structure in which an insulating film is provided between a pair of electrodes.

In FIG. 33 and FIG. 34, an insulating film 766 and a planarization insulating film 770 are provided over the transistor 750, the transistor 752, and the capacitor 790.

The insulating film 766 can be formed using materials and methods similar to that of the insulating film 128 described in the above embodiment. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

The signal line 710 is formed through the same process as conductive films functioning as a source electrode and a drain electrode of the transistor 750 or 752. Note that the signal line 710 may be formed using a conductive film which is formed through a different process from as a source electrode and a drain electrode of the transistor 750 or 752, e.g., a conductive film formed through the same process as a conductive film functioning as a first gate electrode or a conductive film functioning as a second gate electrode. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as conductive films functioning as a source electrode and a drain electrode of the transistor 750 or 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure 778 is provided between the first substrate 701 and the second substrate 705. The structure 778 is a columnar spacer obtained by selective etching of an insulating film and is provided to control the thickness (cell gap) between the first substrate 701 and the second substrate 705. Alternatively, a spherical spacer may be used as the structure 778.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

<Structure Example of Display Device Using Liquid Crystal Element as Display Element>

The display device 700 illustrated in FIG. 33 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 33 is capable of displaying an image in such a manner that transmission or non-transmission is controlled by change in the alignment state of the liquid crystal layer 776 depending on a voltage applied to the conductive film 772 and the conductive film 774.

The conductive film 772 is connected to the conductive films functioning as a source electrode and a drain electrode included in the transistor 750. The conductive film 772 is formed over the planarization insulating film 770 to function as a pixel electrode, i.e., one electrode of the display element. The conductive film 772 has a function of a reflective electrode. The display device 700 in FIG. 33 is what is called a reflective color liquid crystal display device in which external light is reflected by the conductive film 772 to display an image through the coloring film 736.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver may be used for the conductive film that reflects visible light. In this embodiment, the conductive film that reflects visible light is used for the conductive film 772.

Note that projections and depressions are provided in part of the planarization insulating film 770 of the pixel portion 702 in the display device 700 in FIG. 33. The projections and depressions can be formed in such a manner that the planarization insulating film 770 is formed using an organic resin film or the like, and projections and depressions are formed on the surface of the organic resin film. The conductive film 772 functioning as a reflective electrode is formed along the projections and depressions. Therefore, when external light is incident on the conductive film 772, the light is reflected diffusely at the surface of the conductive film 772, whereby visibility can be improved.

Note that the display device 700 illustrated in FIG. 33 is a reflective color liquid crystal display device given as an example, but a display type is not limited thereto. For example, a transmissive color liquid crystal display device in which the conductive film 772 is a conductive film that transmits visible light may be used. In the case of a transmissive color liquid crystal display device, projections and depressions are not necessarily provided on the planarization insulating film 770.

Although not illustrated in FIG. 33, an alignment film may be provided on a side of the conductive film 772 in contact with the liquid crystal layer 776 and on a side of the conductive film 774 in contact with the liquid crystal layer 776. Although not illustrated in FIG. 33, an optical member (an optical substrate) and the like such as a polarizing member, a retardation member, or an anti-reflection member may be provided as appropriate. For example, circular polarization may be employed by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal showing a blue phase and a chiral material has a short response time and optical isotropy, which eliminates the need for an alignment process. Moreover, the liquid crystal composition which includes liquid crystal exhibiting a blue phase has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Further, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

<Display Device Using Light-Emitting Element as Display Element>

The display device 700 illustrated in FIG. 34 includes a light-emitting element 782. The light-emitting element 782 includes a conductive film 784, an EL layer 786, and a conductive film 788. The display device 700 shown in FIG. 34 is capable of displaying an image by light emission from the EL layer 786 included in the light-emitting element 782.

The conductive film 784 is connected to the conductive films functioning as a source electrode and a drain electrode included in the transistor 750. The conductive film 784 is formed over the planarization insulating film 770 to function as a pixel electrode, i.e., one electrode of the display element. A conductive film which transmits visible light or a conductive film which reflects visible light can be used for the conductive film 784. The conductive film which transmits visible light can be formed using a material including one kind selected from indium (In), zinc (Zn), and tin (Sn), for example. The conductive film which reflects visible light can be formed using a material including aluminum or silver, for example.

In the display device 700 shown in FIG. 34, an insulating film 730 is provided over the planarization insulating film 770 and the conductive film 784. The insulating film 730 covers part of the conductive film 784. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 784 side, or a dual-emission structure in which light is emitted to both the conductive film 784 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although a structure with the coloring film 736 is described as the display device 700 shown in FIG. 34, the structure is not limited thereto. In the case where the EL layer 786 is formed by a separate coloring method, the coloring film 736 is not necessarily provided.

The structure described in this embodiment can be used in appropriate combination with the structure described in any of the other embodiments.

Embodiment 5

In this embodiment, a display device that includes a semiconductor device of one embodiment of the present invention is described with reference to FIGS. 35A to 35C.

The display device illustrated in FIG. 35A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

A part or the whole of the driver circuit portion 504 is preferably formed over a substrate over which the pixel portion 502 is formed, in which case the number of components and the number of terminals can be reduced. When a part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (video signal) from which a data signal is derived, as well as a signal for driving the shift register, through the terminal portion 507. The source driver 504b has a function of generating a data signal to be written to the pixel circuit 501 which is based on the video signal. In addition, the source driver 504b has a function of controlling output of a data signal in response to a pulse signal produced by input of a start pulse signal, a clock signal, or the like. Further, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches or the like, for example. The source driver 504b can output, as the data signals, signals obtained by time-dividing the video signal by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to Y), a pulse signal is input from the gate driver 504a through the scan line GL_m, and a data signal is input from the source driver 504b through the data line DL_n in accordance with the potential of the scan line GL_m.

Figure 35A:
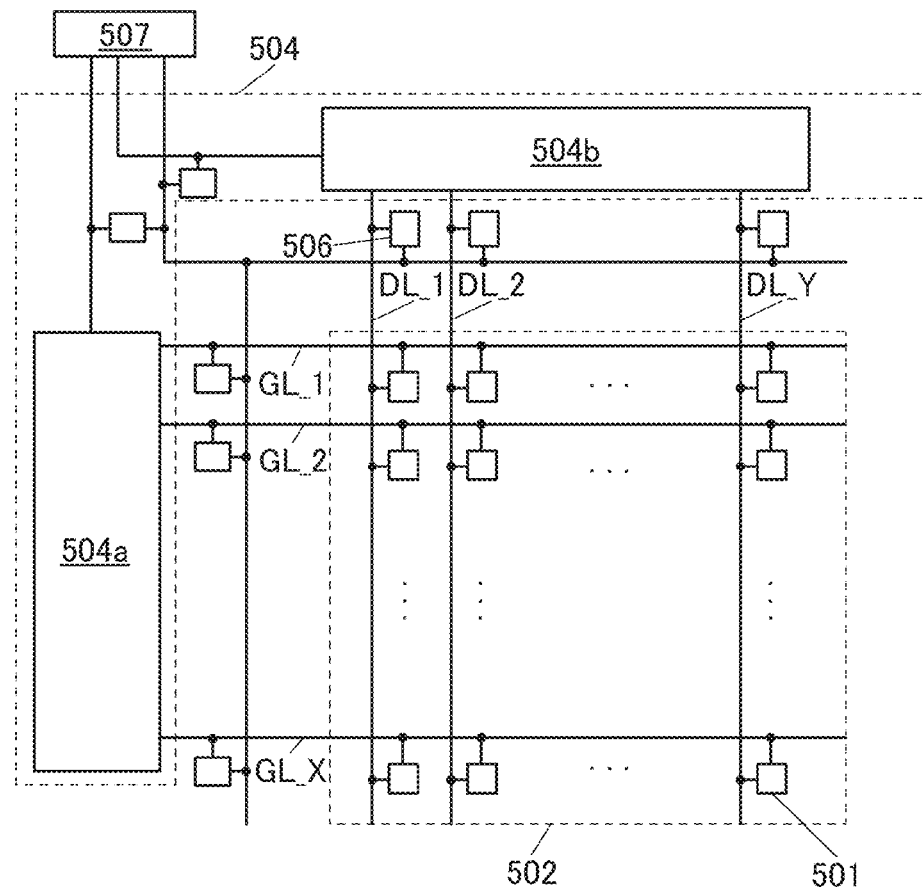
FIGS. 35A to 35C are a block diagram and circuit diagrams illustrating a display device.

The protection circuit 506 shown in FIG. 35A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and video signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 35A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 35A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 35B:
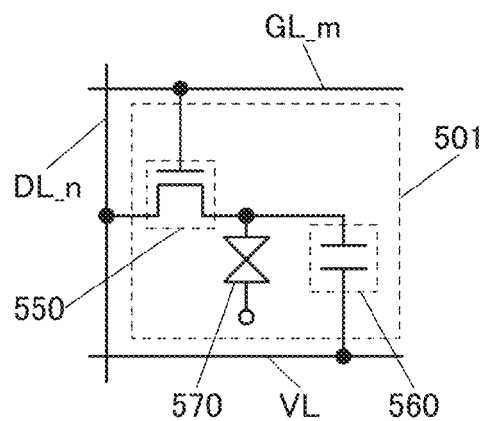

Each of the plurality of pixel circuits 501 in FIG. 35A can have the structure illustrated in FIG. 35B, for example.

The pixel circuit 501 illustrated in FIG. 35B includes a liquid crystal element 570, a transistor 550, and a capacitor 560. As the transistor 550, any of the transistors described in the above embodiment, for example, can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Further, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 35B, the pixel circuits 501 are sequentially selected row by row by the gate driver 504a illustrated in FIG. 35A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 35C:
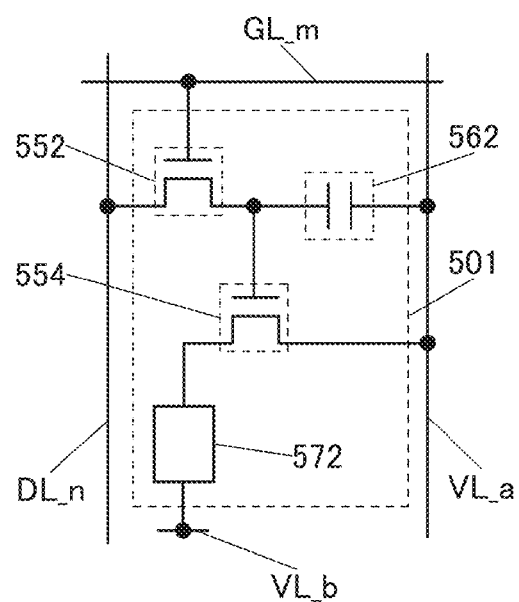

Alternatively, each of the plurality of pixel circuits 501 in FIG. 35A can have the structure illustrated in FIG. 35C, for example.

The pixel circuit 501 illustrated in FIG. 35C includes transistors 552 and 554, a capacitor 562, and a light-emitting element 572. Any of the transistors described in the above embodiment, for example, can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Further, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 35C, the pixel circuits 501 are sequentially selected row by row by the gate driver 504a illustrated in FIG. 35A, whereby the transistors 552 are turned on and a data signal is written.

When the transistors 552 are turned off, the pixel circuits 501 in which the data has been written are brought into a holding state. Further, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

The structure described in this embodiment can be used in appropriate combination with the structure described in any of the other embodiments.

Embodiment 6

In this embodiment, a display module and electronic appliances that include a semiconductor device of one embodiment of the present invention are described with reference to FIG. 36 and FIGS. 37A to 37H.

Figure 36:
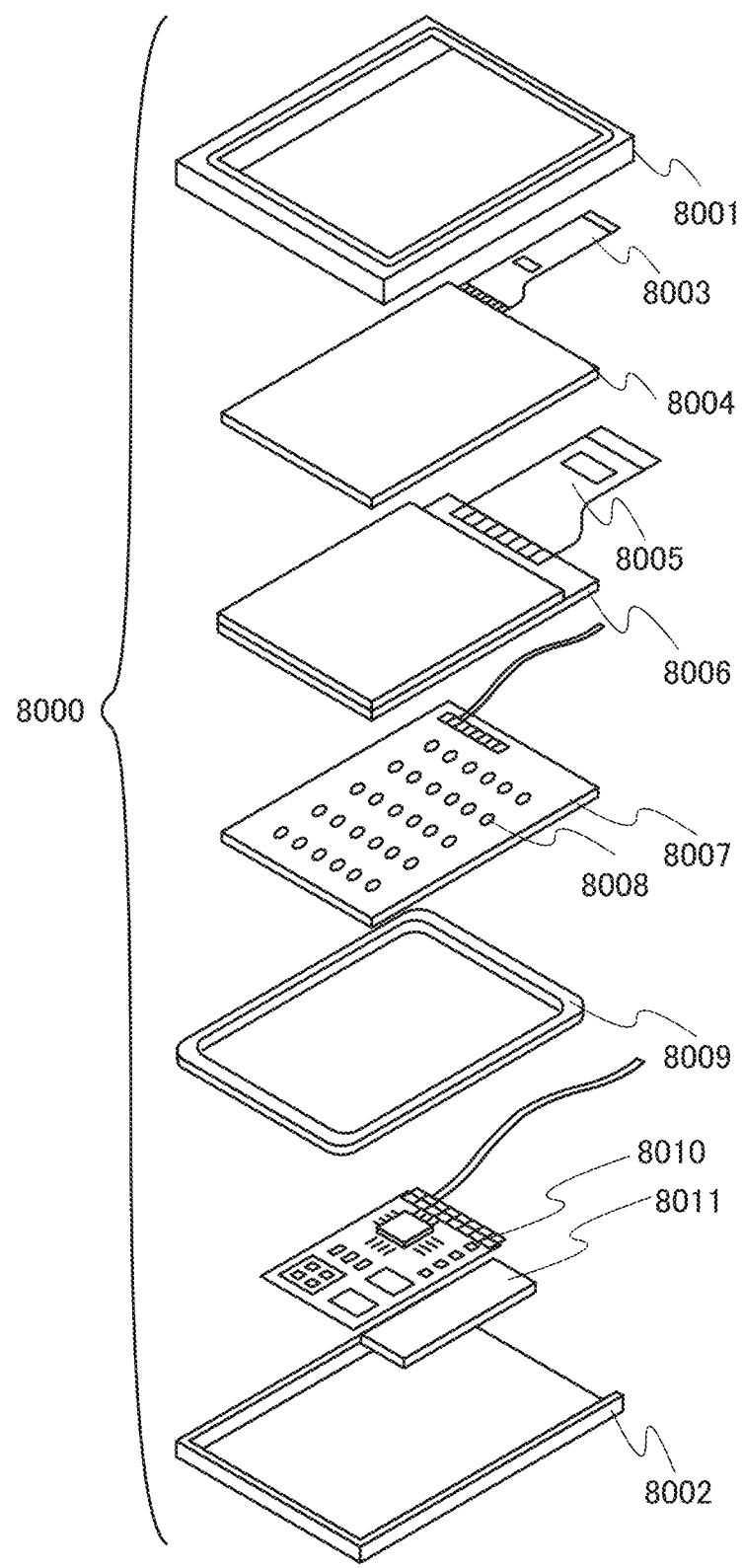
FIG. 36 illustrates a display module.

In a display module 8000 illustrated in FIG. 36, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap the display panel 8006. A counter substrate (sealing substrate) of the display panel 8006 can have a touch panel function. A photosensor may be provided in each pixel of the display panel 8006 to form an optical touch panel.

The backlight 8007 includes a light source 8008. Note that although a structure in which the light sources 8008 are provided over the backlight 8007 is illustrated in FIG. 36, one embodiment of the present invention is not limited to this structure. For example, a structure in which the light source 8008 is provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 37A to 37H illustrate electronic appliances. These electronic appliances can include a housing 9000, a display portion 9001, a speaker 9003, an LED lamp 9004, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

Figure 37A:
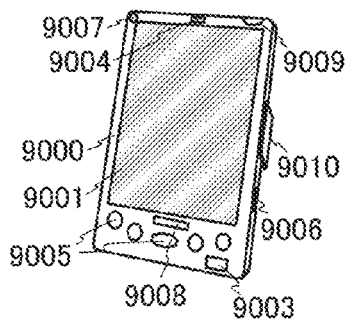
FIGS. 37A to 37H illustrate electronic appliances.
Figure 37B:
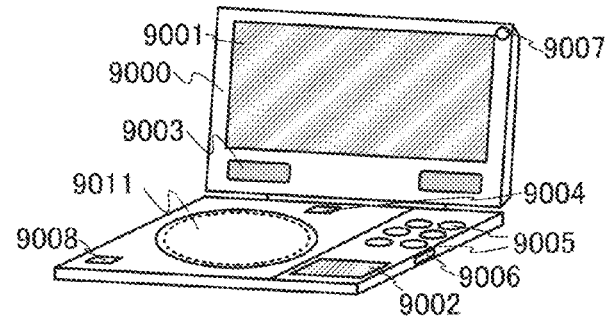
Figure 37C:
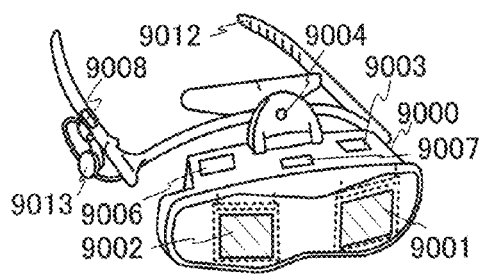
Figure 37D:
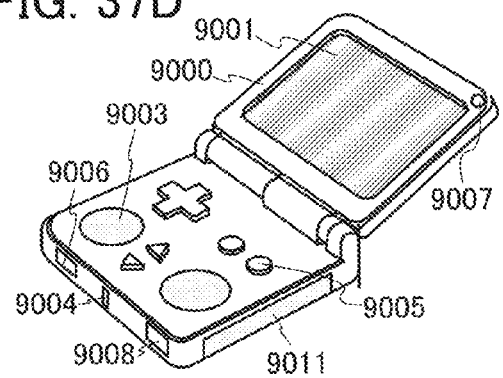
Figure 37E:
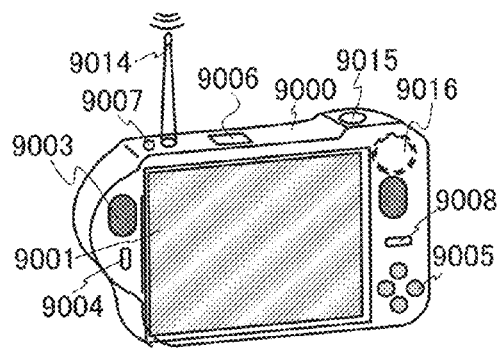
Figure 37F:
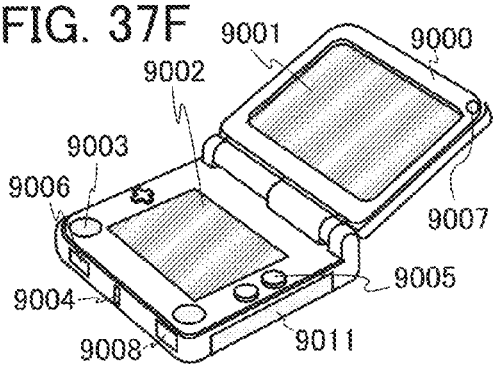
Figure 37G:
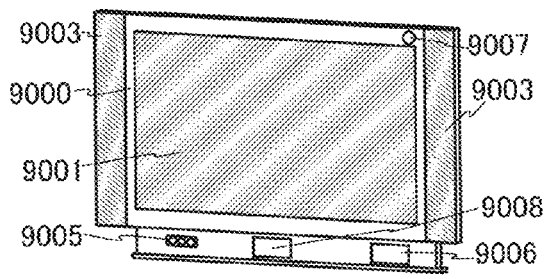
Figure 37H:
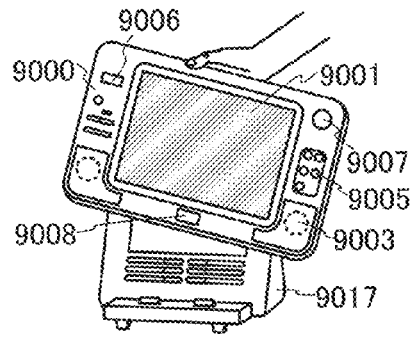

FIG. 37A illustrates a mobile computer that can include a switch 9009, an infrared port 9010, and the like in addition to the above components. FIG. 37B illustrates a portable image reproducing device (e.g., a DVD player) that is provided with a memory medium and can include a second display portion 9002, a memory medium reading portion 9011, and the like in addition to the above components. FIG. 37C illustrates a goggle-type display that can include the second display portion 9002, a support 9012, an earphone 9013, and the like in addition to the above components. FIG. 37D illustrates a portable game machine that can include the memory medium reading portion 9011 and the like in addition to the above components. FIG. 37E illustrates a digital camera that has a television reception function and can include an antenna 9014, a shutter button 9015, an image receiving portion 9016, and the like in addition to the above components. FIG. 37F illustrates a portable game machine that can include the second display portion 9002, the memory medium reading portion 9011, and the like in addition to the above components. FIG. 37G illustrates a television receiver that can include a tuner, an image processing portion, and the like in addition to the above components. FIG. 37H illustrates a portable television receiver that can include a charger 9017 capable of transmitting and receiving signals, and the like in addition to the above components.

The electronic appliances illustrated in FIGS. 37A to 37H can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Furthermore, the electronic appliance including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic appliance including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic appliances illustrated in FIGS. 37A to 37H are not limited to those described above, and the electronic appliances can have a variety of functions.

The electronic appliances described in this embodiment each include the display portion for displaying some sort of data. Note that the semiconductor device of one embodiment of the present invention can also be used for an electronic appliance that does not have a display portion.

The structure described in this embodiment can be used in appropriate combination with the structure described in any of the other embodiments.

This application is based on Japanese Patent Application serial no. 2014-049676 filed with Japan Patent Office on Mar. 13, 2014, the entire contents of which are hereby incorporated by reference.

What is claimed is:

1. A semiconductor device comprising:
an oxide semiconductor film over a first insulating film;
a gate insulating film over the oxide semiconductor film;
a gate electrode over the gate insulating film;
a second insulating film over the oxide semiconductor film and the gate electrode;
a third insulating film over the second insulating film;
a first opening in the second insulating film and the third insulating film;
a second opening in the second insulating film and the third insulating film;
a source electrode electrically connected to the oxide semiconductor film through the first opening; and
a drain electrode electrically connected to the oxide semiconductor film through the second opening;
wherein the first insulating film includes oxygen,
wherein the second insulating film includes hydrogen,
wherein the oxide semiconductor film comprises a first region and a second region,
wherein the first region is in contact with the gate insulating film,
wherein the second region is in contact with the second insulating film,
wherein the first insulating film comprises a third region and a fourth region,
wherein the third region overlaps with the first region,
wherein the fourth region overlaps with the second region,
wherein a concentration of an impurity element in the fourth region is higher than a concentration of the impurity element in the third region,
wherein an amount of oxygen supplied from the fourth region to the oxide semiconductor film is lower than an amount of oxygen supplied from the third region to the oxide semiconductor film, and
wherein an amount of the impurity element supplied from the fourth region to the oxide semiconductor film is higher than an amount of the impurity element supplied from the third region to the oxide semiconductor film.

2. The semiconductor device according to claim 1, wherein the impurity element includes one or more of hydrogen, boron, carbon, nitrogen, fluorine, phosphorus, sulfur, and a rare gas.

3. The semiconductor device according to claim 1, wherein the impurity element is argon.

4. The semiconductor device according to claim 1, wherein the first region includes a portion with a lower hydrogen concentration than the second region.

5. The semiconductor device according to claim 1, wherein the first region includes a region with higher crystallinity than the second region.

6. The semiconductor device according to claim 1,
wherein the oxide semiconductor film includes oxygen, In, Zn, and M (M is Ti, Ga, Y, Zr, La, Ce, Nd, or Hf).

7. The semiconductor device according to claim 1,
wherein the oxide semiconductor film includes a crystal part, and
wherein c-axis of the crystal part is aligned in a direction parallel to a normal vector of a surface where the oxide semiconductor film is formed.

8. A display device comprising:
the semiconductor device according to claim 1; and
a display element.

9. A display module comprising:
the display device according to claim 8; and
a touch sensor.

10. An electronic appliance comprising the semiconductor device according to claim 1,
wherein the electronic appliance comprises an operation key or a battery.

11. An electronic appliance comprising the semiconductor device according to claim 1,
wherein the electronic appliance comprises an operation key or a battery.

12. An electronic appliance comprising the semiconductor device according to claim 1,
wherein the electronic appliance comprises an operation key or a battery.

13. A semiconductor device comprising:
a first gate electrode;
a first insulating film over the first gate electrode;
an oxide semiconductor film over the first insulating film;
a gate insulating film over the oxide semiconductor film;
a second gate electrode over the gate insulating film;
a second insulating film over the oxide semiconductor film and the second gate electrode;
a third insulating film over the second insulating film;
a first opening in the second insulating film and the third insulating film;
a second opening in the second insulating film and the third insulating film;
a source electrode electrically connected to the oxide semiconductor film through the first opening; and
a drain electrode electrically connected to the oxide semiconductor film through the second opening;
wherein the first insulating film includes oxygen,
wherein the second insulating film includes hydrogen,
wherein the oxide semiconductor film comprises a first region and a second region,
wherein the first region is in contact with the gate insulating film,
wherein the second region is in contact with the second insulating film,
wherein the first insulating film comprises a third region and a fourth region,
wherein the third region overlaps with the first region,
wherein the fourth region overlaps with the second region,
wherein a concentration of an impurity element in the fourth region is higher than a concentration of the impurity element in the third region,
wherein an amount of oxygen supplied from the fourth region to the oxide semiconductor film is lower than an amount of oxygen supplied from the third region to the oxide semiconductor film, and
wherein an amount of the impurity element supplied from the fourth region to the oxide semiconductor film is higher than an amount of the impurity element supplied from the third region to the oxide semiconductor film.

14. The semiconductor device according to claim 13,
wherein the impurity element includes one or more of hydrogen, boron, carbon, nitrogen, fluorine, phosphorus, sulfur, and a rare gas.

15. The semiconductor device according to claim 13,
wherein the impurity element is argon.

16. The semiconductor device according to claim 13,
wherein the first region includes a portion with a lower hydrogen concentration than the second region.

17. The semiconductor device according to claim 13,
wherein the first region includes a region with higher crystallinity than the second region.

18. The semiconductor device according to claim 13,
wherein the oxide semiconductor film includes oxygen, In, Zn, and M (M is Ti, Ga, Y, Zr, La, Ce, Nd, or Hf).

19. The semiconductor device according to claim 13,
wherein the oxide semiconductor film includes a crystal part, and
wherein c-axis of the crystal part is aligned in a direction parallel to a normal vector of a surface where the oxide semiconductor film is formed.

20. A display device comprising:
the semiconductor device according to claim 13; and
a display element.

21. A display module comprising:
the display device according to claim 20; and
a touch sensor.

22. A semiconductor device comprising:
a first gate electrode;
a first insulating film over the first gate electrode;
an oxide semiconductor film over the first insulating film;
a gate insulating film over the oxide semiconductor film;
a second gate electrode over the gate insulating film;
a second insulating film over the oxide semiconductor film and the second gate electrode;
a third insulating film over the second insulating film;
a first opening in the second insulating film and the third insulating film;
a second opening in the second insulating film and the third insulating film;
a third opening in the first insulating film and the gate insulating film;
a source electrode electrically connected to the oxide semiconductor film through the first opening; and
a drain electrode electrically connected to the oxide semiconductor film through the second opening;
wherein the first gate electrode and the second gate electrode are electrically connected to each other through the third opening,
wherein the first insulating film includes oxygen,
wherein the second insulating film includes hydrogen,
wherein the oxide semiconductor film comprises a first region and a second region,
wherein the first region is in contact with the gate insulating film,
wherein the second region is in contact with the second insulating film,
wherein the first insulating film comprises a third region and a fourth region,
wherein the third region overlaps with the first region,
wherein the fourth region overlaps with the second region, wherein a concentration of an impurity element in the fourth region is higher than a concentration of the impurity element in the third region, wherein an amount of oxygen supplied from the fourth region to the oxide semiconductor film is lower than an amount of oxygen supplied from the third region to the oxide semiconductor film, and wherein an amount of the impurity element supplied from the fourth region to the oxide semiconductor film is higher than an amount of the impurity element supplied from the third region to the oxide semiconductor film.

23. The semiconductor device according to claim 22,
wherein the impurity element includes one or more of hydrogen, boron, carbon, nitrogen, fluorine, phosphorus, sulfur, and a rare gas.

24. The semiconductor device according to claim 22,
wherein the impurity element is argon.

25. The semiconductor device according to claim 22,
wherein the first region includes a portion with a lower hydrogen concentration than the second region.

26. The semiconductor device according to claim 22,
wherein the first region includes a region with higher crystallinity than the second region.

27. The semiconductor device according to claim 22,
wherein the oxide semiconductor film includes oxygen, In, Zn, and M (M is Ti, Ga, Y, Zr, La, Ce, Nd, or Hf).

28. The semiconductor device according to claim 22,
wherein the oxide semiconductor film includes a crystal part, and wherein c-axis of the crystal part is aligned in a direction parallel to a normal vector of a surface where the oxide semiconductor film is formed.

29. A display device comprising:
the semiconductor device according to claim 22; and
a display element.

30. A display module comprising:
the display device according to claim 29; and
a touch sensor.

* * * * *